US012736868B2

(12) United States Patent
Song et al.

(10) Patent No.: US 12,736,868 B2
(45) Date of Patent: Sep. 15, 2026

(54) METHOD OF MANUFACTURING EXTREME ULTRAVIOLET (EUV) MASK FOR FORMING SEMICONDUCTOR MEMORY DEVICE

(71) Applicant: SAMSUNG ELECTRONICS CO., LTD., Suwon-si (KR)

(72) Inventors: Minseung Song, Suwon-si (KR); Janghoon Kim, Suwon-si (KR); Sangho Yun, Suwon-si (KR); Chan Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 470 days.

(21) Appl. No.: 18/381,731

(22) Filed: Oct. 19, 2023

(65) Prior Publication Data

US 2024/0152043 A1 May 9, 2024

(30) Foreign Application Priority Data

Nov. 4, 2022 (KR) ........................ 10-2022-0146390

(51) Int. Cl.
*G03F 1/22* (2012.01)
*G03F 1/70* (2012.01)
(Continued)

(52) U.S. Cl.
CPC .................. *G03F 1/22* (2013.01); *G03F 1/70* (2013.01); *G03F 1/80* (2013.01); *G03F 7/70616* (2013.01)

(58) Field of Classification Search
CPC ..... G03F 1/22; G03F 1/70; G03F 1/80; G03F 7/70616; G03F 7/705
See application file for complete search history.

(56) References Cited

U.S. PATENT DOCUMENTS 7,541,290 B2 6/2009 Chang et al.
8,877,650 B2 11/2014 Park et al.
(Continued)

FOREIGN PATENT DOCUMENTS

CN 114153125 A 3/2022
KR 10-1154004 B1 6/2012
(Continued)

OTHER PUBLICATIONS

Office Action in Korean Appln. No. 10-2022-0146390, mailed on Apr. 15, 2026, 14 pages (with English translation).

*Primary Examiner* — Stewart A Fraser
(74) *Attorney, Agent, or Firm* — Fish & Richardson P.C.

(57) ABSTRACT

A method of manufacturing an extreme ultraviolet mask including preparing a preliminary layout, forming a plurality of preliminary target patterns by using a plurality of preliminary spacer patterns formed by using the preliminary layout, evaluating presence or absence of an abnormal target pattern among the plurality of preliminary target patterns, preparing a layout configured to form a plurality of spacer patterns by modifying the preliminary layout when the plurality of preliminary target patterns include the abnormal target pattern, and manufacturing an extreme ultraviolet mask with the layout to form a plurality of target patterns by using the plurality of spacer patterns, wherein, the plurality of preliminary spacer patterns extend in one direction.

20 Claims, 73 Drawing Sheets

(51) Int. Cl.

| | |
|---|---|
| ***G03F 1/80*** | (2012.01) |
| ***G03F 7/00*** | (2006.01) |

(56) References Cited

U.S. PATENT DOCUMENTS

| | | | | |
|---|---|---|---|---|
| 10,036,961 | B2 | 7/2018 | Jang et al. | |
| 10,838,296 | B2 * | 11/2020 | Beylkin | G03F 1/70 |
| 10,908,498 | B2 | 2/2021 | Kim et al. | |
| 11,360,383 | B2 * | 6/2022 | Beylkin | G03F 1/70 |
| 11,714,349 | B2 * | 8/2023 | Beylkin | G03F 1/70 430/5 |
| 2015/0243515 | A1 * | 8/2015 | Yuan | H10P 50/696 438/666 |
| 2022/0043359 | A1 | 2/2022 | Ahn et al. | |
| 2022/0207699 | A1 | 6/2022 | Kang et al. | |

FOREIGN PATENT DOCUMENTS

| | | | |
|---|---|---|---|
| KR | 10-1185993 | B1 | 9/2012 |
| KR | 10-2017-0051005 | A | 5/2017 |
| KR | 10-2017-0103147 | A | 9/2017 |

* cited by examiner

METHOD OF MANUFACTURING EXTREME ULTRAVIOLET (EUV) MASK FOR FORMING SEMICONDUCTOR MEMORY DEVICE

CROSS-REFERENCE TO RELATED APPLICATION

Korean Patent Application No. 10-2022-0146390, filed on Nov. 4, 2022, in the Korean Intellectual Property Office, is incorporated by reference herein in its entirety.

BACKGROUND

1. Field

A method of manufacturing an extreme ultraviolet (EUV) mask for forming a semiconductor memory device.

2. Description of the Related Art

Electronic devices are becoming more miniaturized and lightweight according to the rapid development in the electronics industry and a user's requirement thereof.

SUMMARY

Embodiments are directed to a method of manufacturing an extreme ultraviolet mask including preparing a preliminary layout, forming a plurality of preliminary target patterns by using a plurality of preliminary spacer patterns formed by using the preliminary layout, evaluating presence or absence of an abnormal target pattern among the plurality of preliminary target patterns, preparing a layout configured to form a plurality of spacer patterns by modifying the preliminary layout when the plurality of preliminary target patterns include the abnormal target pattern, and manufacturing an extreme ultraviolet mask with the layout to form a plurality of target patterns by using the plurality of spacer patterns, wherein, the plurality of preliminary spacer patterns extend in one direction, and the preliminary layout is modified as the layout where each of the plurality of spacer patterns extend in the one direction and a portion and another portion of each of the plurality of spacer patterns have different horizontal widths, or a portion of each of the plurality of spacer patterns, which extend in the one direction, and another portion of each of the plurality of spacer patterns extend with a mutual inclination.

Embodiments are directed to a method of manufacturing an extreme ultraviolet mask including preparing a pair of preliminary layouts including a first preliminary layout and a second preliminary layout, forming a plurality of preliminary target patterns by using a plurality of first preliminary spacer patterns formed by using the first preliminary layout and a plurality of second preliminary spacer patterns formed by using the second preliminary layout, evaluating presence or absence of an abnormal target pattern among the plurality of preliminary target patterns, preparing a pair of layouts including a first layout configured to form a plurality of first spacer patterns and a second layout configured to form a plurality of second spacer patterns by modifying the pair of preliminary layouts when the plurality of preliminary target patterns include the abnormal target pattern, and manufacturing a pair of extreme ultraviolet masks including a first extreme ultraviolet mask and a second extreme ultraviolet mask with the pair of layouts to form a plurality of target patterns by using the plurality of first spacer patterns and the plurality of second spacer patterns, wherein the plurality of first preliminary spacer patterns extend in a first direction, the plurality of second preliminary spacer patterns extend in a second direction different from the first direction in which the plurality of first preliminary spacer patterns extend while crossing the plurality of first preliminary spacer patterns, and wherein the first preliminary layout is modified as the first layout where each of the plurality of first spacer patterns extend in the first direction and a portion and another portion of each of the plurality of first spacer patterns have different horizontal widths, or a portion of each of the plurality of first spacer patterns, which extend in the first direction, and another portion of each of the plurality of first spacer patterns extend with a mutual inclination.

Embodiments are directed to a method of manufacturing an extreme ultraviolet mask configured to form a semiconductor memory device including a substrate having a memory cell region, a dummy region surrounding the memory cell region, and a plurality of active regions in the memory cell region, a plurality of word lines in the substrate, a plurality of bit lines on the substrate and respectively connected to the plurality of active regions through a plurality of direct contacts, and a plurality of capacitor structures including a plurality of lower electrodes respectively and electrically connected to the plurality of active regions through a plurality of contact plugs, a capacitor dielectric layer, and an upper electrode including preparing a pair of preliminary layouts including a first preliminary layout and a second preliminary layout, forming, on the substrate, a plurality of preliminary target patterns by using a plurality of first preliminary spacer patterns formed by using the first preliminary layout and a plurality of second preliminary spacer patterns formed by using the second preliminary layout, evaluating presence or absence of an abnormal target pattern among the plurality of preliminary target patterns, preparing a pair of layouts including a first layout configured to form a plurality of first spacer patterns and a second layout configured to form a plurality of second spacer patterns by modifying the pair of preliminary layouts when the plurality of preliminary target patterns include the abnormal target pattern, and forming a pair of extreme ultraviolet masks including a first extreme ultraviolet mask and a second extreme ultraviolet mask with the pair of layouts to form a plurality of lower electrodes by using the plurality of first spacer patterns and the plurality of second spacer patterns, wherein the plurality of first preliminary spacer patterns extend in a first direction, the plurality of second preliminary spacer patterns extend in a second direction different from the first direction in which the plurality of first preliminary spacer patterns extend while crossing the plurality of first preliminary spacer patterns, and wherein the first preliminary layout is modified as the first layout where each of the plurality of first spacer patterns extend in the first direction and a portion and another portion of each of the plurality of first spacer patterns have different horizontal widths, or a portion of each of the plurality of first spacer patterns, which extend in the first direction, and another portion of each of the plurality of first spacer patterns extend with a mutual inclination.

BRIEF DESCRIPTION OF THE DRAWINGS

Features will become apparent to those of skill in the art by describing in detail exemplary embodiments with reference to the attached drawings in which.

DETAILED DESCRIPTION

FIGS. 1A to 8B are plan views and cross-sectional views of a method of forming and evaluating a pattern by using a preliminary layout for manufacturing an extreme ultraviolet (EUV) mask, according to example embodiments. In particular, FIGS. 1B, 2B, 3B, 4B, 5B, 6B, 7B, and 8B are cross-sectional views respectively taken along lines IB-IB' of FIG. 1A, IIB-IIB' of FIG. 2A, IIIB-IIIB' of FIG. 3A, IVB-IVB' of FIG. 4A, VB-VB' of FIG. 5A, VIB-VIB' of FIG. 6A, VIIB-VIIB' of FIG. 7A, and VIIB-VIIIB' of FIG. 8A.

Figure 1A:
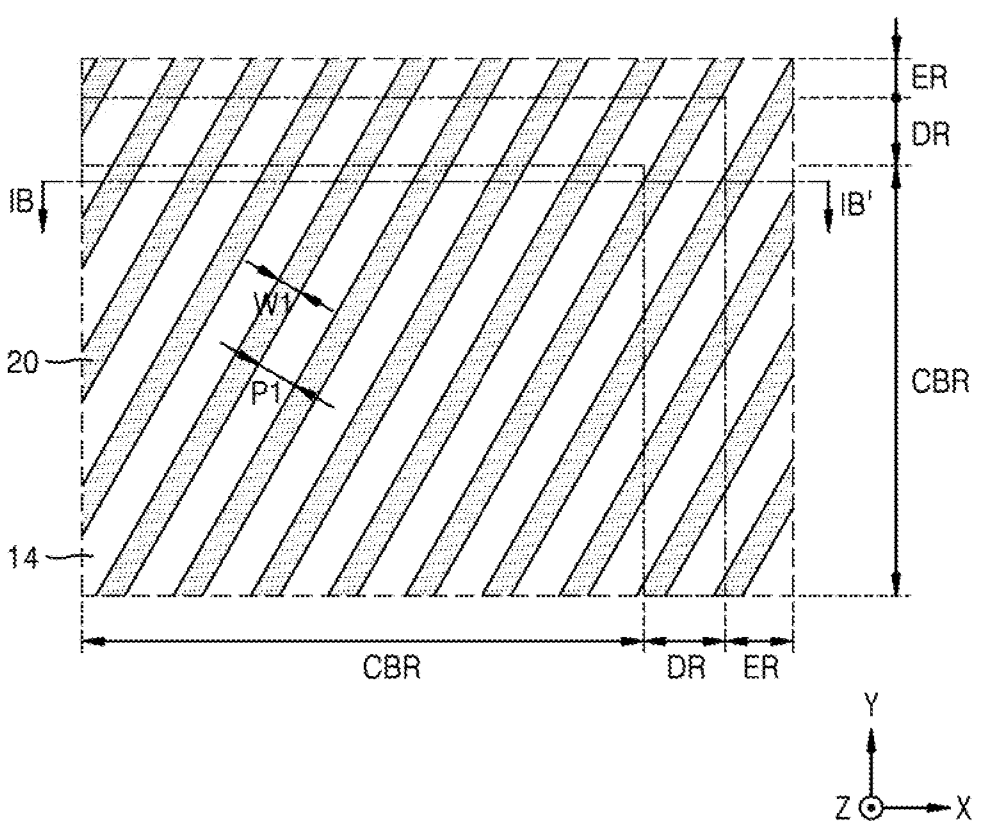
FIGS. 1A to 8B are plan views and cross-sectional views of a method of forming and evaluating a pattern by using a preliminary layout for manufacturing an extreme ultraviolet (EUV) mask, according to example embodiments.
Figure 1B:
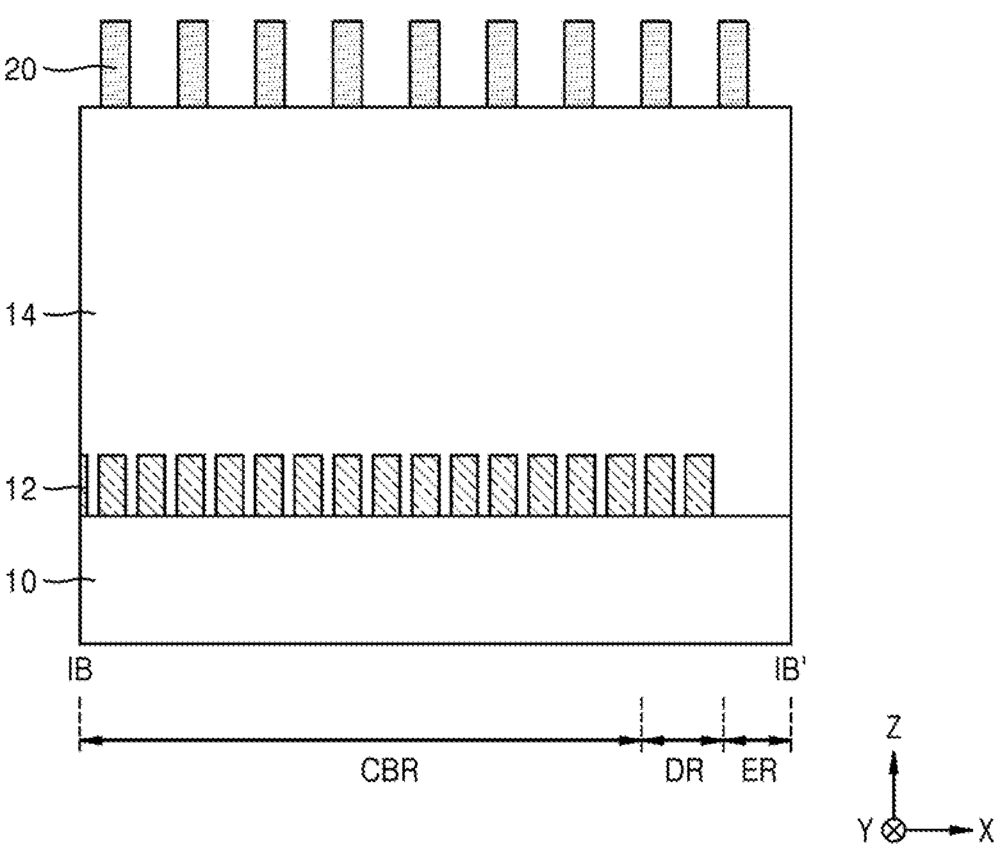

Referring to FIGS. 1A to 1B together, a plurality of connection targets 12 and a molding layer 14 covering the plurality of connection targets 12 may be on a substrate 10.

The substrate 10 may include a cell block region CBR, a dummy region DR, and an edge region ER. The edge region ER may surround the cell block region CBR. The dummy region DR may be between the cell block region CBR and the edge region ER. The edge region ER may be spaced apart from the cell block region CBR with the dummy region DR therebetween. A pattern may be in the cell block region CBR. A pattern may not be in the edge region ER. In a process of forming a pattern, a dummy pattern may be in the dummy region DR. Herein, a pattern formed by using an EUV mask may be referred to as a target pattern.

In some embodiments, the substrate 10 may include, e.g., silicon (Si), crystalline Si, polycrystalline Si, or amorphous Si. In some other embodiments, the substrate 10 may include a semiconductor element, such as germanium (Ge), or at least one compound semiconductor including silicon germanium (SiGe), silicon carbide (SiC), gallium arsenide (GaAs), indium arsenide (InAs), or indium phosphide (InP). In some embodiments, the substrate 10 may have a silicon on insulator (SOI) structure. In an implementation, the substrate 10 may include a buried oxide (BOX) layer. The substrate 10 may include a conductive region, e.g., a well doped with impurities, or a structure doped with impurities. As used herein, the term “or” is not an exclusive term, e.g., “A or B” would include A, B, or A and B.

The plurality of connection targets 12 may each include a conductive material. In an implementation, the plurality of connection targets 12 may each include doped polysilicon, conductive metal nitride, or metal. In some embodiments, the plurality of connection targets 12 may each include doped polysilicon, titanium nitride (TiN), tantalum nitride (TaN), titanium (Ti), tantalum (Ta), or tungsten (W). In some embodiments, the plurality of connection targets 12 may each include a metal silicide layer. The metal silicide layer may be between doped polysilicon and a metal, or between doped polysilicon and a conductive metal nitride. The metal silicide layer may include cobalt silicide ($CoSi_x$), nickel silicide ($NiSi_x$), or manganese silicide ($MnSi_x$).

The molding layer 14 may fill spaces between the plurality of connection targets 12 and cover upper surfaces of the plurality of connection targets 12. In some embodiments, the molding layer 14 may include a carbon-based material. In an implementation, the carbon-based material may include an amorphous carbon layer (ACL) or carbon-based spin-on hardmask (C—SOH) material. In some embodiments, the C—SOH material may include a hydrocarbon compound or a derivative thereof having a relatively high carbon content of about 85% to about 99% by weight based on the total weight of the C—SOH material. In some embodiments, the molding layer 14 may be formed by stacking a plurality of layers, and at least one of the plurality of layers may further include any one material including silicon nitride (SiN), silicon carbonitride (SiCN), an N-rich SiN, or a Si-rich SiN.

A plurality of first base patterns 20 may be on the molding layer 14. The plurality of first base patterns 20 may be formed by using a first preliminary layout. The first preliminary layout may be formed in, e.g., a graphic database II (GDSII) stream format (hereinafter, referred to as GDSII). The first preliminary layout may be, e.g., a mask layout for forming a first test EUV mask. The first preliminary layout may include a plurality of layout patterns respectively corresponding to the plurality of first base patterns 20. In an implementation, the plurality of first base patterns 20 may be formed by using the first test EUV mask formed by using the first preliminary layout, or may be formed by performing simulation with the first preliminary layout.

Each of the plurality of first base patterns 20 may include a material having etch selectivity with respect to each of the plurality of connection targets 12, the molding layer 14, and a first spacer pattern 22 formed as described with reference to FIGS. 2A to 3B in a subsequent process. In some embodiments, the first base pattern 20 may include silicon nitride, silicon oxide, or polysilicon, and may be selected by considering the etch selectivity with respect to each of the plurality of connection targets 12, the molding layer 14, and the first spacer pattern 22.

The plurality of first base patterns 20 may each have a first horizontal width W1, and may extend parallel to each other with a first pitch P1. The plurality of first base patterns 20 may be arranged at equal intervals from each other. The plurality of first base patterns 20 may extend in a diagonal direction with respect to a first horizontal direction (X direction) and a second horizontal direction (Y direction). In some embodiments, the first pitch P1 may have a value greater than twice the first horizontal width W1.

Figure 2A:
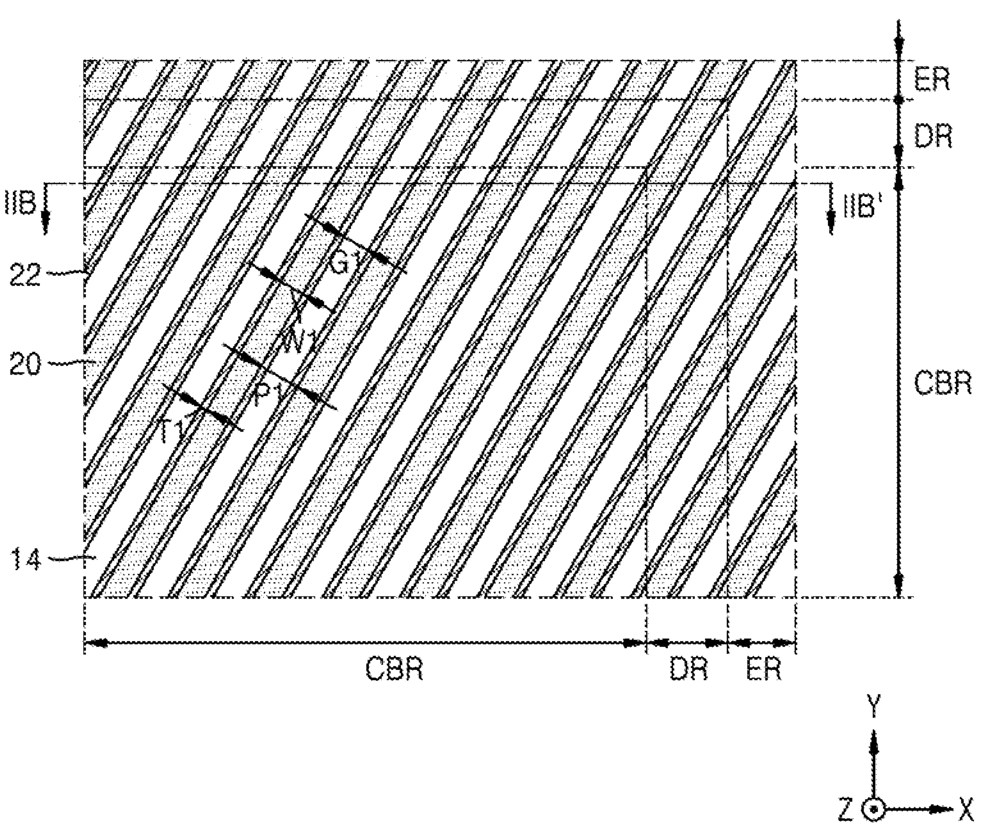
Figure 2B:
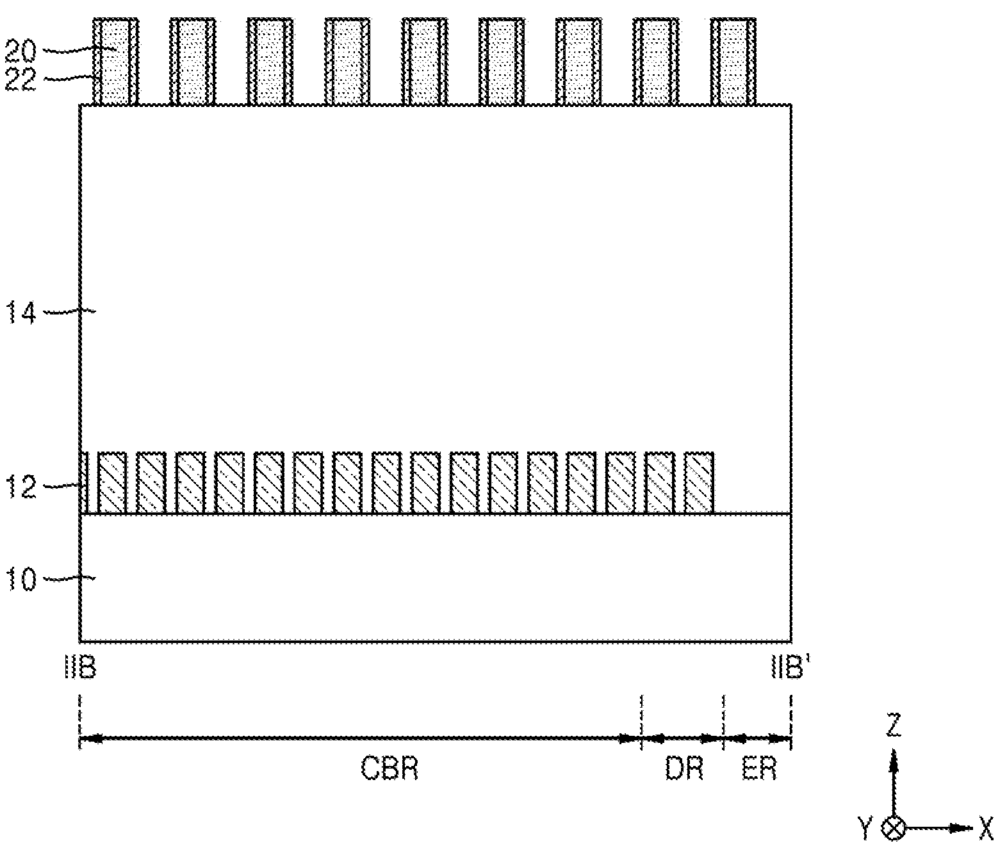
Figure 3A:
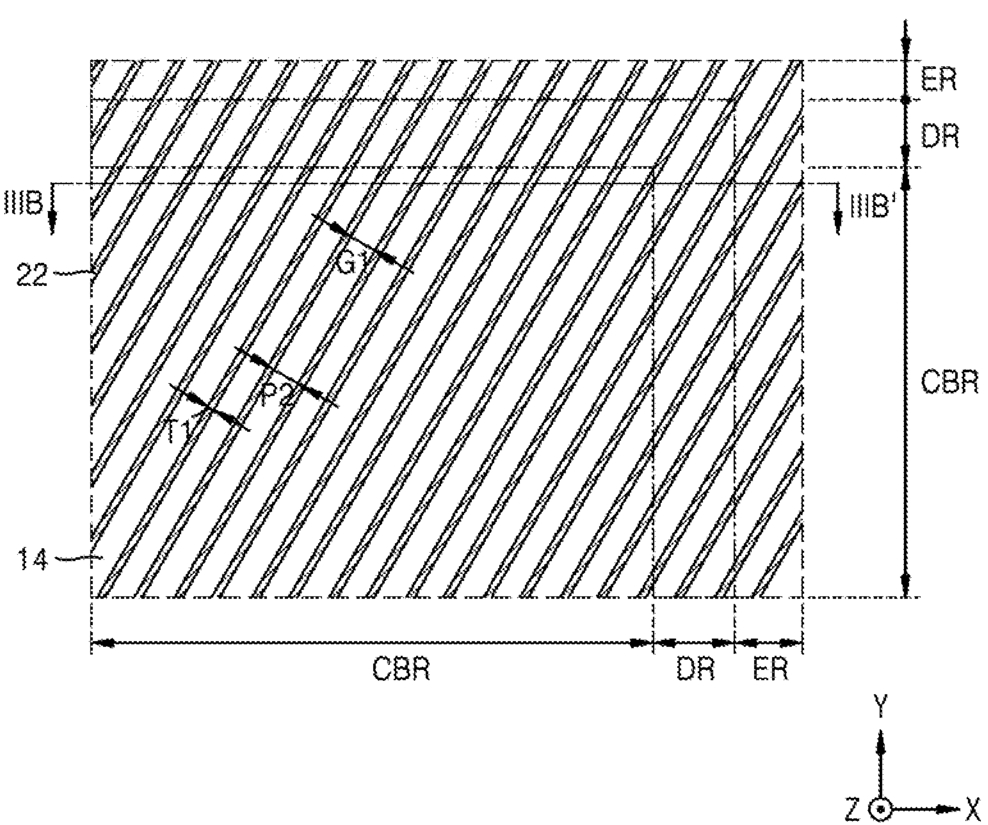
Figure 3B:
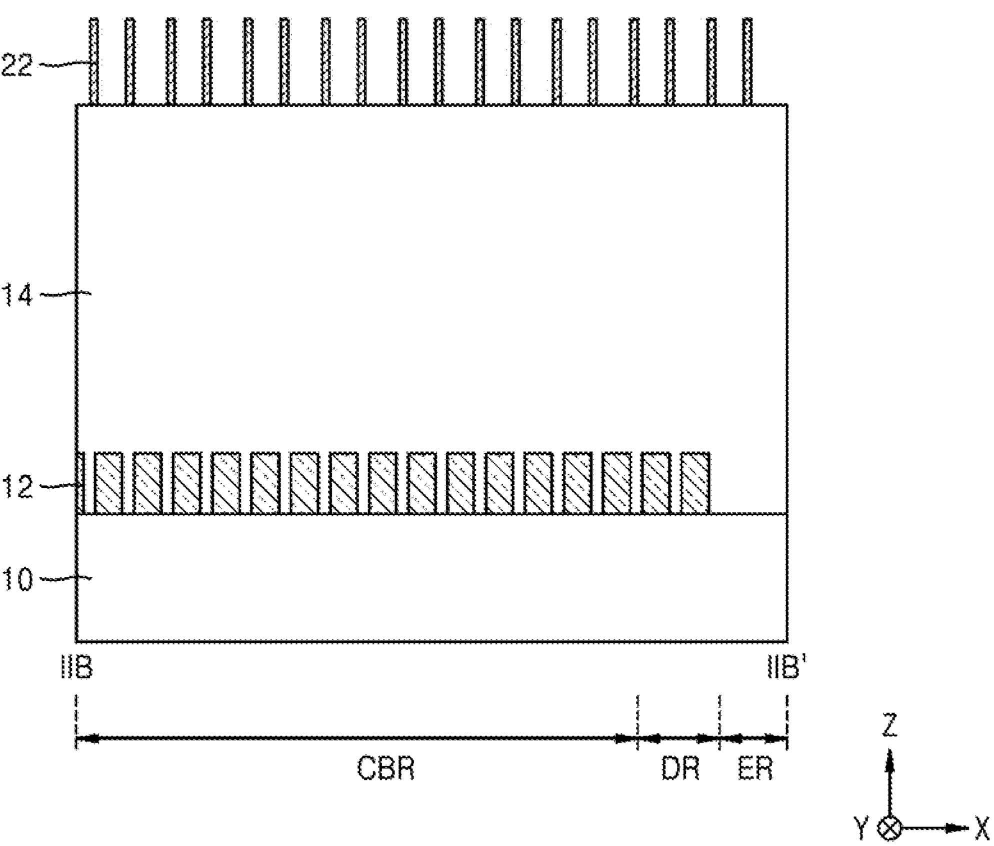

Referring to FIGS. 2A and 2B together, a plurality of first spacer patterns 22 respectively covering sidewalls of the plurality of first base patterns 20 may be formed. The plurality of first spacer patterns 22 may be formed by forming a first preliminary spacer layer conformally covering the upper surfaces and sidewalls of the plurality of first base patterns 20 and an upper surface of the molding layer 14 and having a first thickness T1 and then removing a portion of the first preliminary spacer layer, the portion covering the upper surfaces of the plurality of first base patterns 20 and the upper surface of the molding layer 14. In an implementation, the plurality of first spacer patterns 22 may be formed by etching back the first preliminary spacer layer. In some embodiments, the first preliminary spacer layer may include a silicon oxide layer formed by an atomic layer deposition (ALD) process.

Each of the plurality of first spacer patterns 22 may have the first thickness T1 on each of both sidewalls of the first base pattern 20. The first thickness T1 may have a value less than the first width W1. Two first spacer patterns 22 covering opposite sidewalls of each of two first base patterns 20, which may be adjacent to each other, may be spaced apart from each other with a first gap G1. In an implementation, the two first spacer patterns 22 arranged in space between two first base patterns 20, which may be adjacent to each other, may have the first gap G1. In some embodiments, the first gap G1 may have substantially the same value as the first width W1.

Referring to FIGS. 2A to 3B, portions of the upper surface of the molding layer 14, the portions being covered with the plurality of first base patterns 20, may be exposed by removing the plurality of first base patterns 20. The plurality of first spacer patterns 22 may remain on the molding layer 14. The plurality of first spacer patterns 22 may each have a horizontal width of the first thickness T1, and may extend parallel to each other with a second pitch P2. The first thickness T1 may be a horizontal width of each of the plurality of first spacer patterns 22. The plurality of first spacer patterns 22 may be at equal intervals from each other. In an implementation, the plurality of first spacer patterns 22 may be arranged with the first gap G1 from each other. The plurality of first spacer patterns 22 may extend in a diagonal direction with respect to the first horizontal direction (X direction) and the second horizontal direction (Y direction). In some embodiments, the second pitch P2 may have a value less than the first pitch P1, and may have a value greater than the first thickness T1.

Figure 4A:
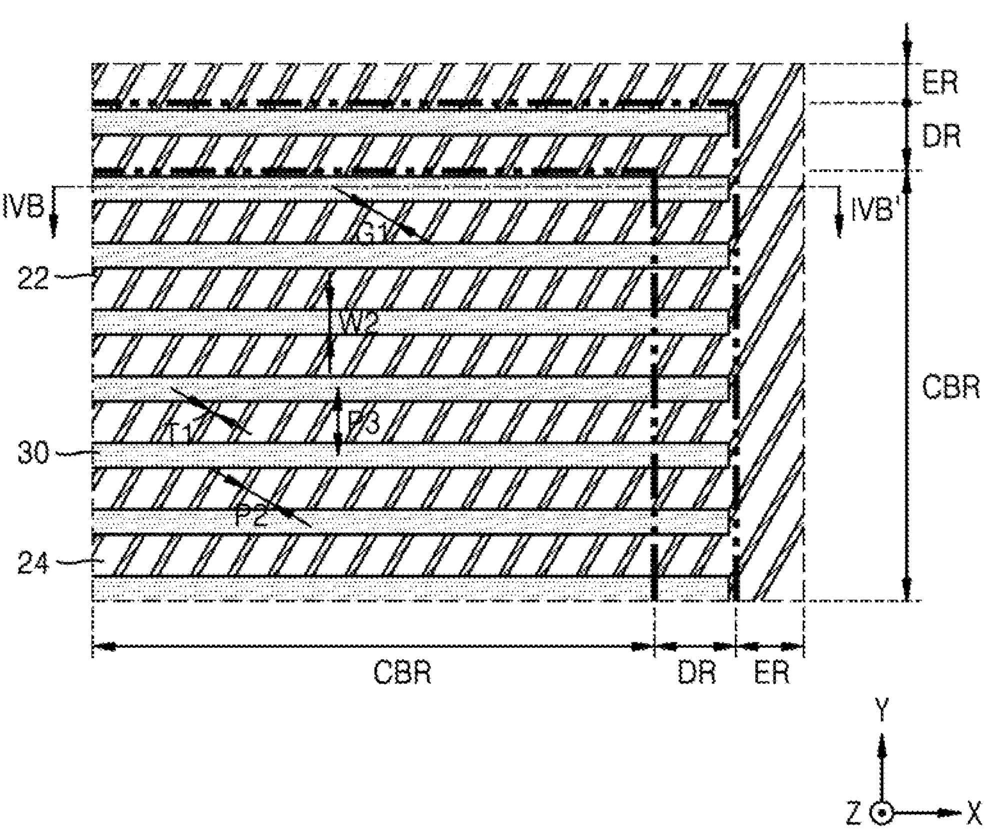
Figure 4B:
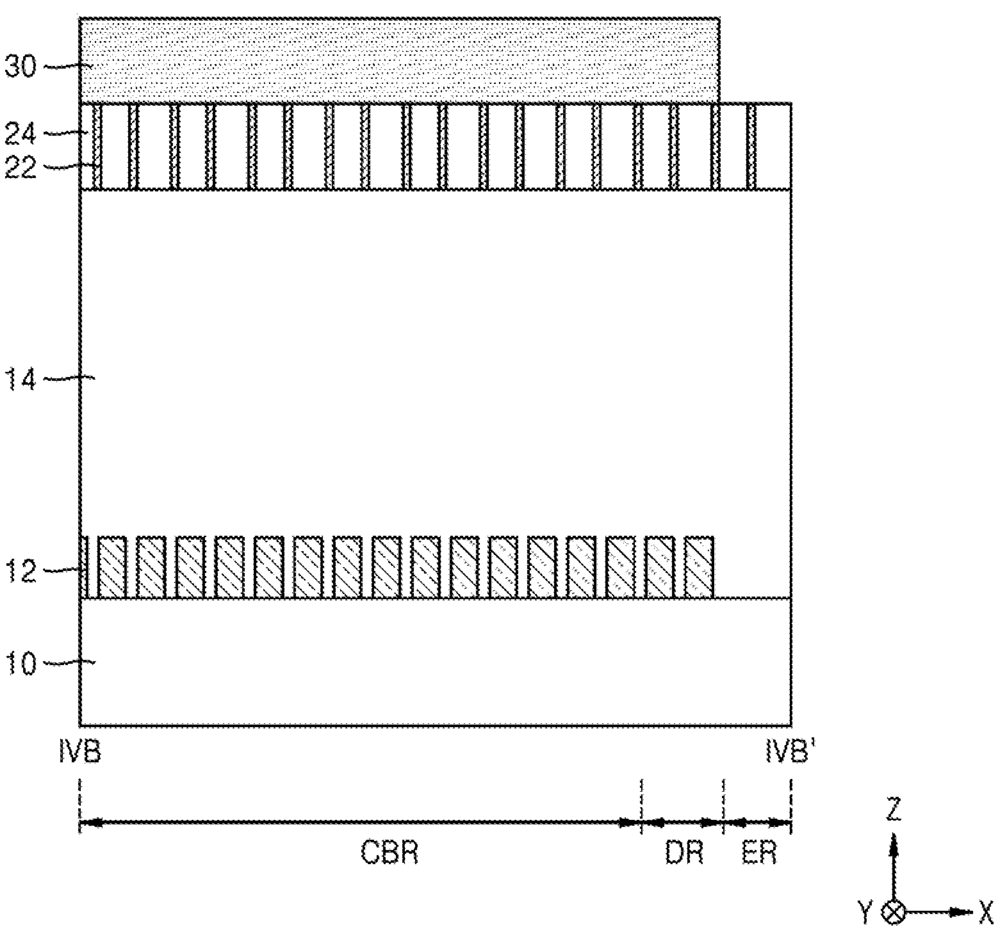

Referring to FIGS. 4A and 4B, after a first filling insulating layer 24 filling spaces between the plurality of first spacer patterns 22 is formed, a plurality of second base patterns 30 may be on the plurality of first spacer patterns 22 and the first filling insulating layer 24. The plurality of second base patterns 30 may be formed by using a second preliminary layout. The second preliminary layout may be in, e.g., GDSII. The second preliminary layout may be, e.g., a mask layout for forming a second test EUV mask. The second preliminary layout may include a plurality of layout patterns respectively corresponding to the plurality of second base patterns 30. In an implementation, the plurality of second base patterns 30 may be formed by using the second test EUV mask formed by using the second preliminary layout, or may be formed by performing simulation with the second preliminary layout.

Each of the plurality of second base patterns 30 may include a material having etch selectivity with respect to each of the plurality of first spacer patterns 22, the first filling insulating layer 24, and a second spacer pattern 32 formed as described with reference to FIGS. SA to 6B in a subsequent process. In some embodiments, the second base pattern 30 may include silicon nitride, silicon oxide, or polysilicon, and may be selected by considering the etch selectivity with respect to each of the plurality of first spacer patterns 22, the first filling insulating layer 24, and the second spacer pattern 32.

The plurality of second base patterns 30 may each have a second horizontal width W2, and may extend parallel to each other with a third pitch P3. The plurality of second base patterns 30 may be at equal intervals from each other. The plurality of second base patterns 30 may extend in the first horizontal direction (X direction). In some embodiments, the plurality of second base patterns 30 may extend in a diagonal direction with respect to the first horizontal direction (X direction) and the second horizontal direction (Y direction), the diagonal direction being different from an extension direction of the plurality of first spacer patterns 22, to cross the plurality of first spacer patterns 22. In some embodiments, the third pitch P3 may have a value greater than twice the second horizontal width W2.

In some embodiments, the plurality of second base patterns 30 may be in the cell block region CBR and the dummy region DR, and may not be in the edge region ER. In an implementation, the plurality of second base patterns 30 may be in each of the cell block region CBR, the dummy region DR, and the edge region ER. Alternatively, the plurality of second base patterns 30 may be in each of the cell block region CBR, the dummy region DR, and the edge region ER, and then portions of the plurality of second base patterns 30, which may be in the edge region ER, may be removed.

Figure 5A:
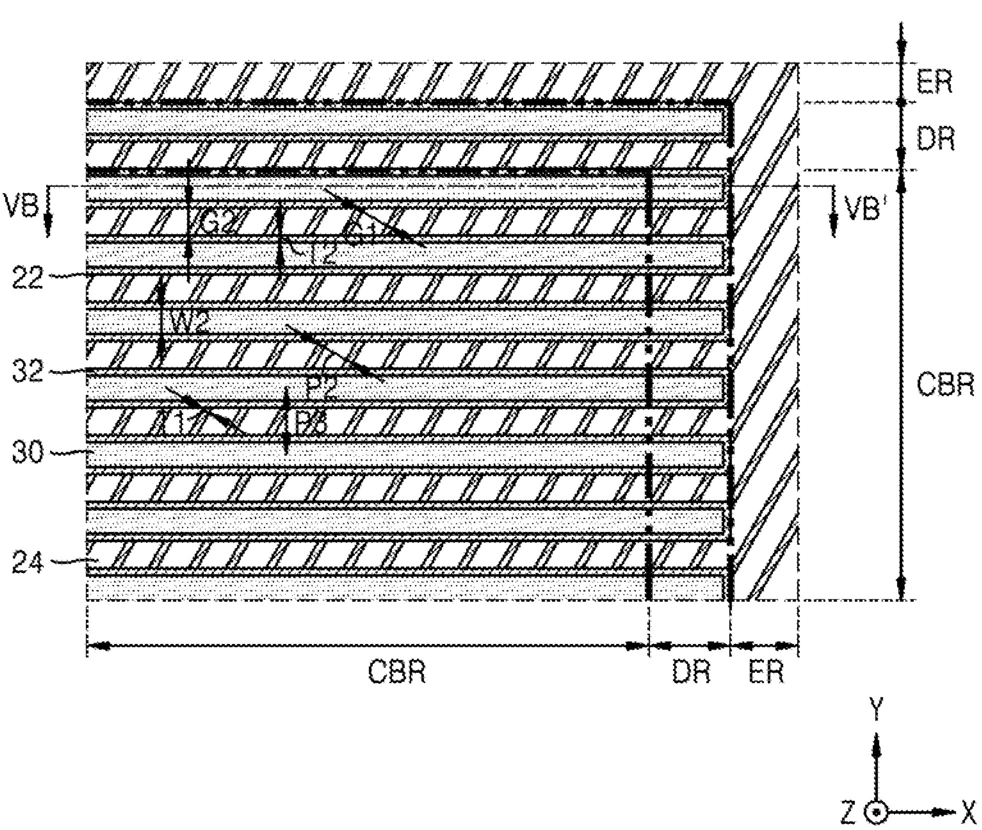
Figure 5B:
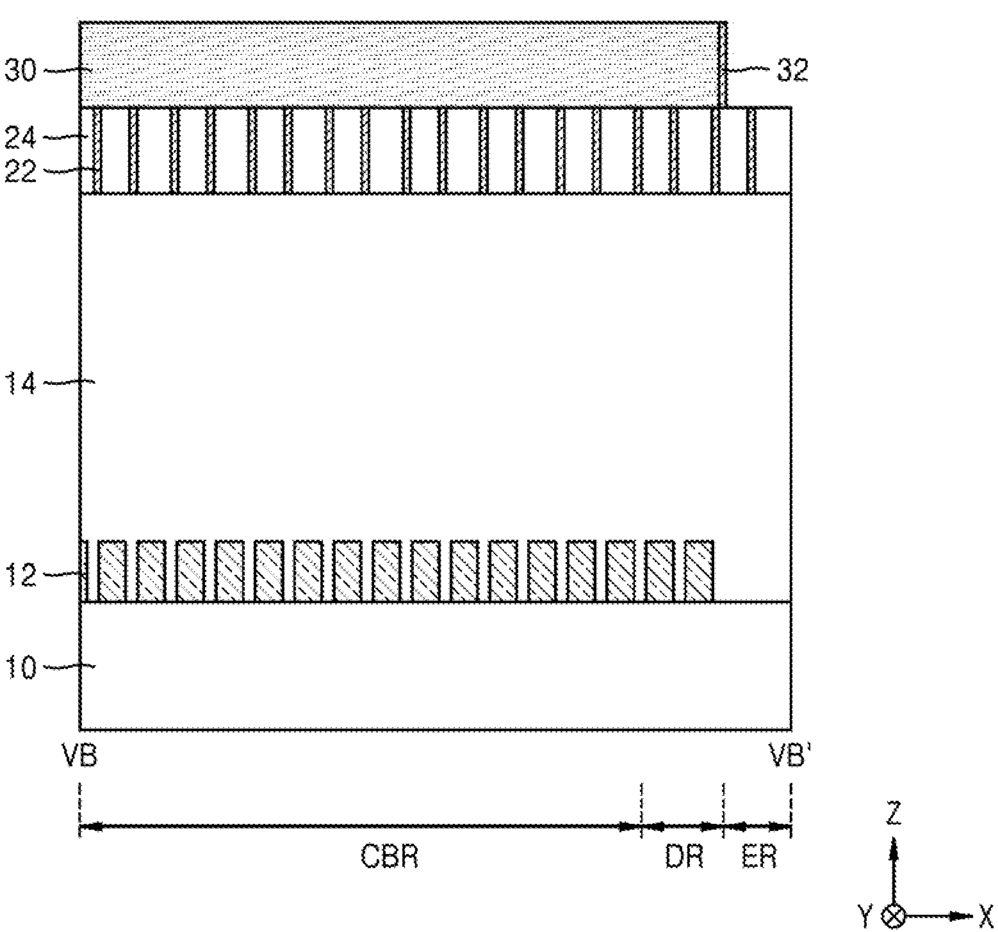
Figure 6A:
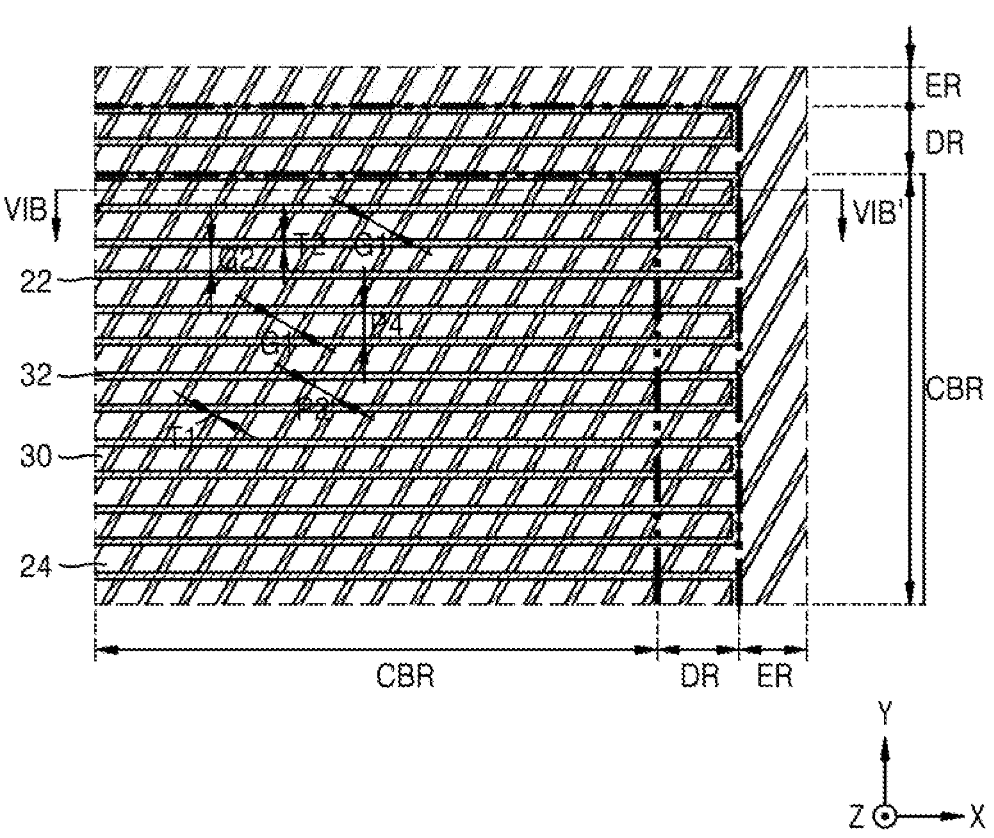
Figure 6B:
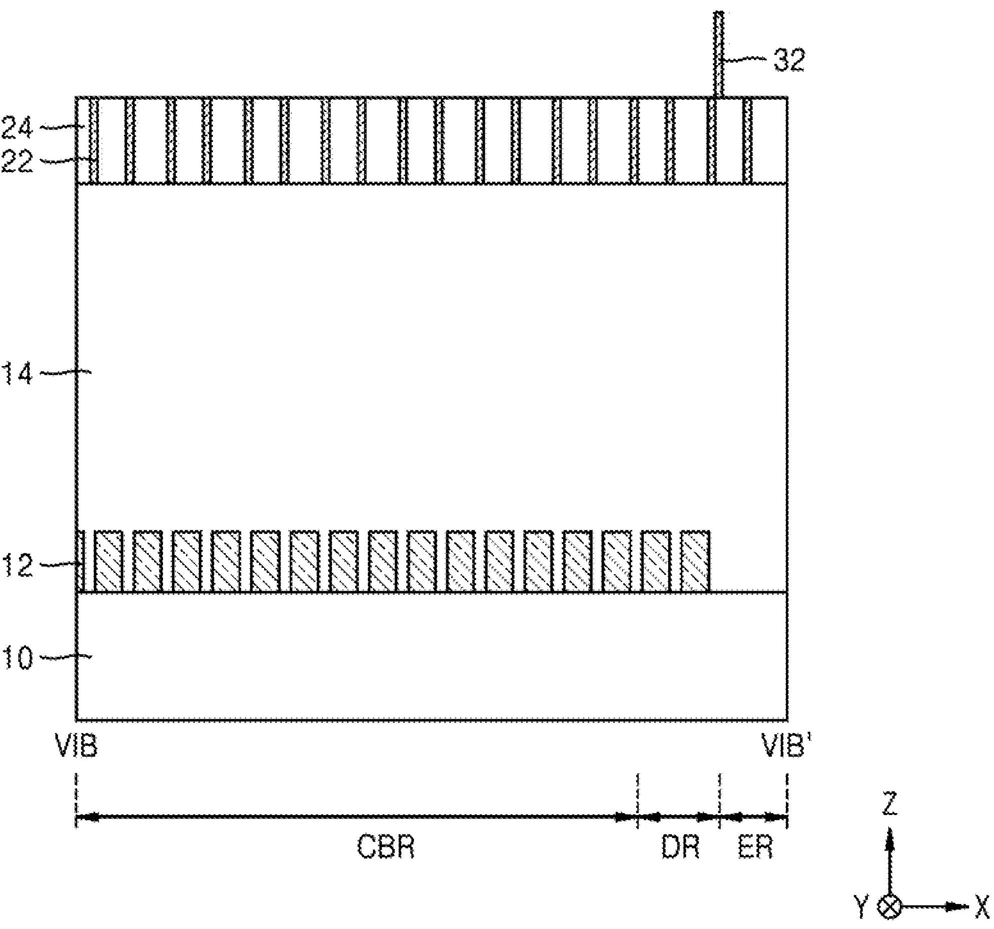

Referring to FIGS. 5A and 5B, a plurality of second spacer patterns 32 respectively covering sidewalls of the plurality of second base patterns 30 may be formed. The plurality of second spacer patterns 32 may be formed by forming a second preliminary spacer layer conformally covering upper surfaces and sidewalls of the plurality of second base patterns 30 and an upper surface of the first filling insulating layer 24 and having a second thickness T2 and then removing a portion of the second preliminary spacer layer, the portion covering the upper surfaces of the plurality of second base patterns 30 and the upper surface of the first filling insulating layer 24. In an implementation, the plurality of second spacer patterns 32 may be formed by etching back the second preliminary spacer layer. In some embodiments, the second preliminary spacer layer may include a silicon nitride layer formed by an ALD process.

Each of the plurality of second spacer patterns 32 may have the second thickness T2 on each of both sidewalls of the second base pattern 30. The second thickness T2 may have a value less than the second horizontal width W2. Two second spacer patterns 32 covering opposite sidewalls of each of two second base patterns 30, which may be adjacent to each other, may be spaced apart from each other by a second gap G2. In an implementation, the two second spacer patterns 32 in a space between two second base patterns 30, which may be adjacent to each other, may have the second gap G2. In some embodiments, the second gap G2 may have substantially the same value of the second horizontal width W2.

Referring to FIGS. 5A to 6B, portions of the plurality of first spacer patterns 22 and the upper surface of the first filling insulating layer 24, the portions being covered with the plurality of second base patterns 30, may be exposed by removing the plurality of second base patterns 30. The plurality of second spacer patterns 32 may remain on the plurality of first spacer patterns 22 and the first filling insulating layer 24. The plurality of second spacer patterns 32 may each have a horizontal width of the second thickness T2, and may extend parallel to each other with a fourth pitch P4. The second thickness T2 may be a horizontal width of each of the plurality of second spacer patterns 32. The plurality of second base patterns 30 may be at equal intervals from each other. In an implementation, the plurality of second base patterns 30 may be arranged with the second gap G2 from each other. The plurality of second spacer patterns 32 may extend in the first horizontal direction (X direction). In some embodiments, the fourth pitch P4 may have a value less than the third pitch P3, and may have a value greater than the second thickness T2.

In some embodiments, a portion of the plurality of first spacer patterns 22, e.g., a portion thereof in the edge region ER, may be removed by a trimming process.

Referring to FIGS. 6A to 7B, a plurality of holes 14H may be formed by etching the molding layer 14 by using the plurality of first spacer patterns 22 and the plurality of second spacer patterns 32 as an etching mask. In some embodiments, the plurality of holes 14H may be in a honeycomb shape in a zigzag pattern with respect to at least one of the first horizontal direction (X direction) and the second horizontal direction (Y direction). In an implementation, the plurality of holes 14H may be in a row in the first horizontal direction (X direction), and may be in a honeycomb shape in a zigzag pattern with respect to the second horizontal direction (Y direction). The plurality of holes 14H may be in rows with a fifth pitch P5 in a diagonal direction with respect to the first horizontal direction (X direction) and the second horizontal direction (Y direction), and may be in rows with a sixth pitch P6 in the first horizontal direction (X direction). In some embodiments, the fifth pitch P5 may have substantially the same value as the second pitch P2, and the sixth pitch P6 may have substantially the same value as the fourth pitch P4.

Figure 7A:
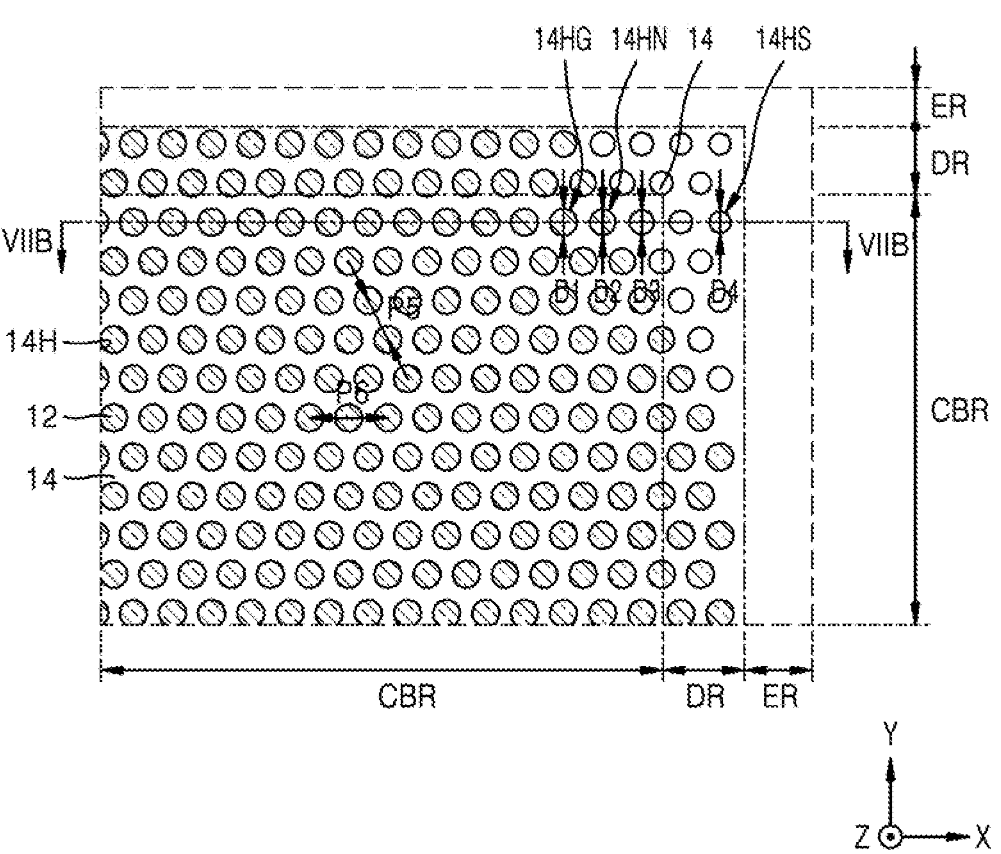
Figure 7B:
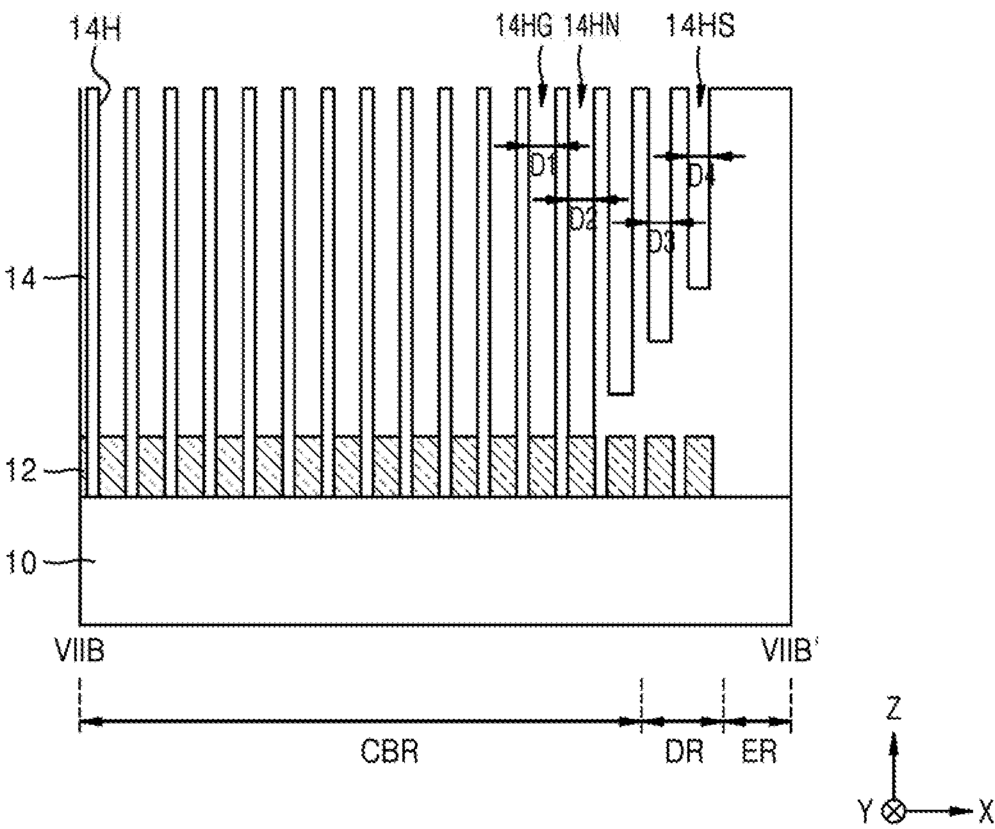
Figure 8A:
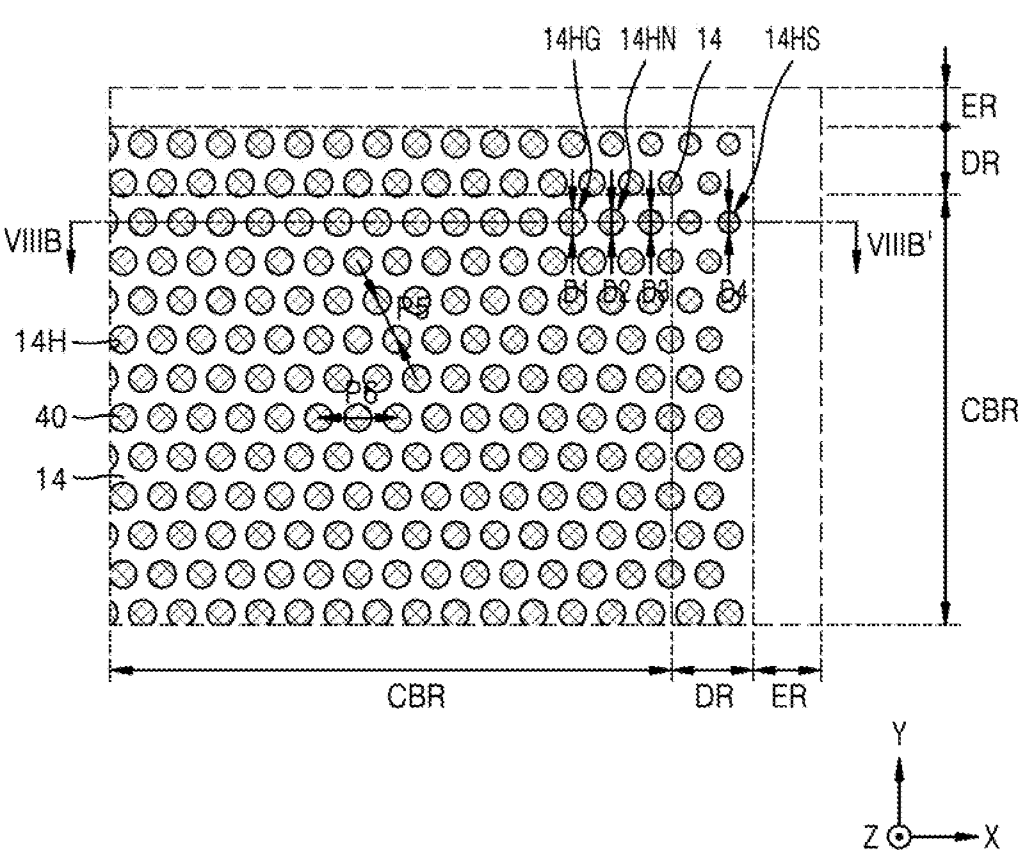
Figure 8B:
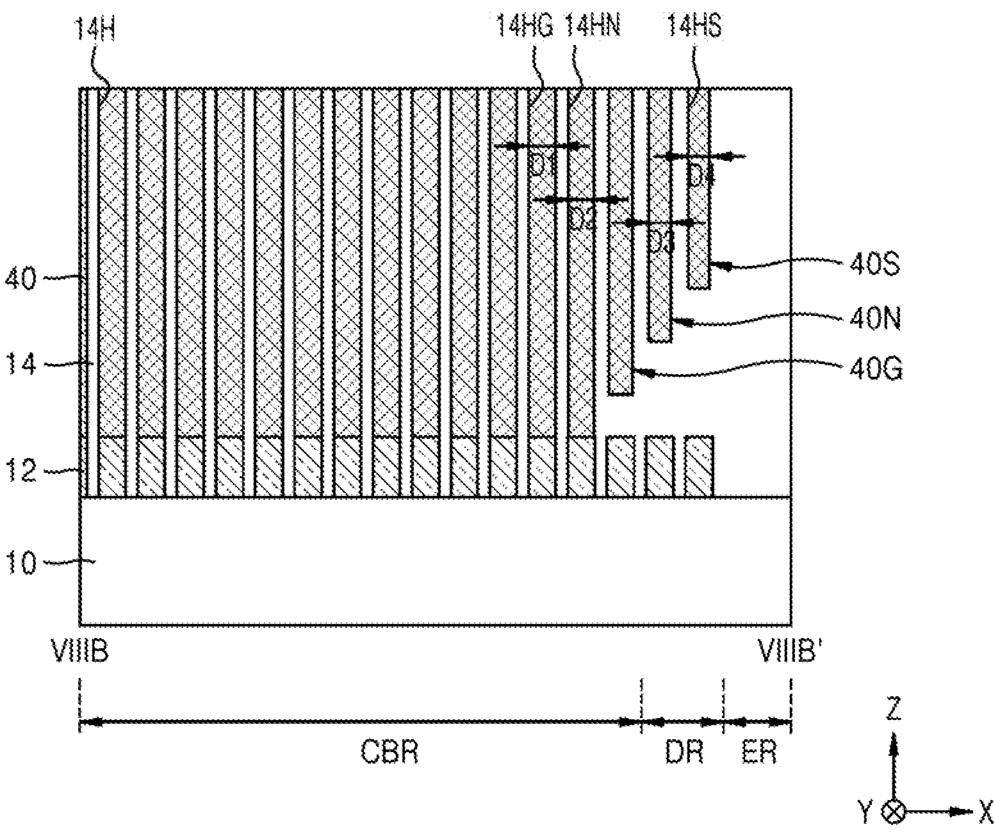

In some embodiments, after the first filling insulating layer 24 is removed, the molding layer 14 may be etched by using the plurality of first spacer patterns 22 and the plurality of second spacer patterns 32 as an etching mask, or the first filling insulating layer 24 and the molding layer 14 may be etched by using the plurality of first spacer patterns 22 and the plurality of second spacer patterns 32 as an etching mask. FIGS. 7A and 7B illustrate that the first filling insulating layer 24, the plurality of first spacer patterns 22, and the plurality of second spacer patterns 32 may be removed. In an implementation, at least a portion of each of the first filling insulating layer 24, the plurality of first spacer patterns 22, and the plurality of second spacer patterns 32 remains without being removed to limit the plurality of holes 14H together with a portion of the molding layer 14.

The plurality of holes 14H may include a plurality of normal holes 14HG. In some embodiments, the plurality of holes 14H may further include a plurality of narrow holes 14HN and/or a plurality of low holes 14HS. In an implementation, the plurality of holes 14H may include the plurality of normal holes 14HG and the plurality of narrow holes 14HN. Alternatively, e.g., the plurality of holes 14H may include the plurality of normal holes 14HG and the plurality of low holes 14HS.

The plurality of normal holes 14HG may each have a first diameter D1, and a connection target 12 may be exposed on a bottom surface of each of the plurality of normal holes 14HG. The connection target 12 may be exposed on a bottom surface of each of the plurality of narrow holes 14HN, and the connection target 12 may not be exposed on a bottom surface of each of the plurality of low holes 14HS and a portion of the molding layer 14 may be exposed. A depth of each of the plurality of narrow holes 14HN and the plurality of low holes 14HS may be less than a depth of each of the plurality of normal holes 14HG.

Each of the plurality of narrow holes 14HN and the plurality of low holes 14HS may have a diameter less than the first diameter D1. The diameters of the plurality of narrow holes 14HN and the plurality of low holes 14HS may decrease in a direction away from the plurality of normal holes 14HG. The plurality of narrow holes 14HN may be closer to the plurality of normal holes 14HG than the plurality of low holes 14HS. In an implementation, the plurality of narrow holes 14HN may each have a second diameter D2 that is less than the first diameter D1. In an implementation, some of the low holes 14HS, which may be close to the plurality of normal holes 14HG, may each have a third diameter D3 that is less the second diameter D2, and some other low holes 14HS, which may be far from the plurality of normal holes 14HG, may each have a fourth diameter D4 that is less than the third diameter D3. FIGS. 7A and 7B illustrate that each of plurality of narrow holes 14HN may have the second diameter D2. In some embodiments, some and some other narrow holes 14HN may have different diameters, similar to the plurality of low holes 14HS. In an implementation, some narrow holes 14HN, which may be close to the plurality of normal holes 14HG, may each have a relatively large diameter, and some other narrow holes 14HN, which may be far from the plurality of normal holes 14HG, may each have a small diameter.

In some embodiments, the plurality of holes 14H may be in the cell block region CBR and the dummy region DR, and may not be in the edge region ER. The plurality of narrow holes 14HN and the plurality of low holes 14HS may be in the cell block region CBR and/or the dummy region DR around the corner of the cell block region CBR, or may be in the cell block region CBR and/or the dummy region DR around the corner and edge of the cell block region CBR. In an implementation, the plurality of narrow holes 14HN and the plurality of low holes 14HS may be in the cell block region CBR and/or the dummy region DR around the corner of the cell block region CBR in a relatively great amount, and may be in the cell block region CBR and/or the dummy region DR around the edge of the cell block region CBR away from the corner of the cell block region CBR in a relatively small amount. The plurality of narrow holes 14HN and the plurality of low holes 14HS may together be referred to as a plurality of abnormal holes. Among the plurality of abnormal holes, each of some of the abnormal holes, which has a relatively large diameter and exposes the connection target 12 on a bottom surface thereof, may be a narrow hole 14HN, and each of some other abnormal holes, which has a relatively small diameter and exposes a portion of the molding layer 14 without exposing the connection target 12 on the bottom surface thereof, may be a low hole 14HS. The plurality of abnormal holes may be in the cell block region CBR and/or the dummy region DR around the corner of the cell block region CBR, or may be in the cell block region CBR and/or the dummy region DR around the corner and edge of the cell block region CBR. The plurality of abnormal holes may be in the cell block region CBR and/or the dummy region DR around the corner of the cell block region CBR in a relatively great amount, and may be in the cell block region CBR and/or the dummy region DR around the edge of the cell block region CBR away from the corner of the cell block region CBR in a relatively small amount. The diameters of the plurality of abnormal holes may decrease in a direction away from the plurality of normal holes 14HG.

Referring to FIGS. 7A to 8B, a plurality of target patterns 40 respectively filling the plurality of holes 14H may be formed. The plurality of target patterns 40 may be formed by forming a target material layer filling the plurality of holes 14H and covering the molding layer 14 and then removing a portion of the target material layer, the portion covering the upper surface of the molding layer 14. The diameters of the plurality of target patterns 40 may be substantially the same as the diameters of plurality of holes 14H corresponding to the plurality of target patterns 40, the plurality of target patterns 40 and the plurality of holes 14H, which correspond to each other, may be substantially identically arranged, and the height of the plurality of target patterns 40 may be substantially the same as the depth of the plurality of holes 14H corresponding to the plurality of target patterns 40 or has a substantially constant small value, and thus detailed descriptions thereof are omitted. The plurality of target patterns 40 may each include a conductive metal nitride, or a metal. In some embodiments, the plurality of target patterns 40 may each include doped polysilicon, titanium nitride (TiN), tantalum nitride (TaN), titanium (Ti), tantalum (Ta), or tungsten (W).

The plurality of target patterns 40 may include a plurality of normal target patterns 40G. In some embodiments, the plurality of target patterns 40 may further include a plurality of narrow target patterns 40N and/or a plurality of low target patterns 40S. In an implementation, the plurality of target patterns 40 may include the plurality of normal target patterns 40G and the plurality of narrow target patterns 40N. Alternatively, e.g., the plurality of target patterns 40 may include the plurality of normal target patterns 40G and the plurality of low target patterns 40S. The plurality of normal target patterns 40G may respectively fill the plurality of normal holes 14HG, the plurality of narrow target patterns 40N may respectively fill the plurality of narrow holes 141HN, and the plurality of low target patterns 40S may respectively fill the plurality of low holes 14HS.

The plurality of narrow target patterns 40N may be relatively closer to the plurality of normal target patterns 40G than the plurality of low target patterns 40S. Some narrow holes 14HN, which may be relatively close to the plurality of normal holes 14HG, may each have a relatively large diameter, and some other narrow holes 141-IN, which may be relatively far from the plurality of normal holes 14HG, may each have a relatively small diameter. Some of the low target patterns 40S, which may be relatively close to the plurality of normal target patterns 40G, may each have a relatively large diameter, and some other low target patterns 40S, which may be relatively far from the plurality of normal target patterns 40G, may each have a relatively small diameter.

In some embodiments, the plurality of target patterns 40 may be in the cell block region CBR and the dummy region DR, and may not be in the edge region ER. The plurality of narrow target patterns 40N and the plurality of low target patterns 40S may be in the cell block region CBR and/or the dummy region DR around the corner of the cell block region CBR, or may be around the corner and edge of the cell block region CBR. In an implementation, the plurality of narrow target patterns 40N and the plurality of low target patterns 40S may be in the cell block region CBR and/or the dummy region DR around the corner of the cell block region CBR in a relatively great amount, and may be in the cell block region CBR and/or the dummy region DR around the edge of the cell block region CBR away from the corner of the cell block region CBR in a relatively small amount. The plurality of narrow target patterns 40N and the plurality of low target patterns 40S may be together referred to as a plurality of abnormal target patterns. Among the plurality of abnormal target patterns, each of some abnormal target patterns, which may have a relatively large diameter and a bottom surface in contact with the connection target 12, may be a narrow target pattern 40N, and each of some other abnormal target patterns, which may have a relatively small diameter and a bottom surface in contact with the molding layer 14, may be a low target pattern 40S. The plurality of abnormal target patterns may be in the cell block region CBR and/or the dummy region DR around the corner of the cell block region CBR, or may be in the cell block region CBR and/or the dummy region DR around the corner and edge of the cell block region CBR. The plurality of abnormal holes may be in the cell block region CBR and/or the dummy region DR around the corner of the cell block region CBR in a relatively great amount, and may be in the cell block region CBR and/or the dummy region DR around the edge of the cell block region CBR away from the corner of the cell block region CBR in a relatively small amount. The diameters of the plurality of abnormal pattern targets may decrease in a direction away from the plurality of normal target patterns 40G.

Referring to FIGS. 1A to 8B together, based on the plurality of first base patterns 20 and the plurality of second base patterns 30 formed by using a pair of test EUV masks including the first test EUV mask and the second test EUV mask by using a pair of preliminary layouts including the first preliminary layout and the second preliminary layout or formed by performing simulation with the pair of preliminary layouts, the plurality of first spacer patterns 22 and the plurality of second spacer patterns 32 may be formed, the plurality of holes 14H may be formed by using the plurality of first spacer patterns 22 and the plurality of second spacer patterns 32 as an etching mask, and then the plurality of target patterns 40 filling the plurality of holes 14H may be formed.

Some of the target patterns 40 may be formed with the plurality of normal target patterns 40G, but the remaining target patterns 40 may be formed with the abnormal target patterns, that is, the plurality of narrow target patterns 40N and/or the plurality of low target patterns 40S. When the plurality of narrow target patterns 40N and/or the plurality of low target patterns 40S may be in the cell block region CBR, electrical resistance may increase, or electrical short-circuit defects may occur. In an implementation, in the case where the abnormal target pattern is included in the plurality of target patterns 40 and the abnormal target pattern is in the cell block region CBR by evaluating the plurality of target patterns 40 formed by using the pair of preliminary layouts, it can be expected that, in a semiconductor device which may include the plurality of target patterns 40, e.g., a semiconductor memory device, electrical characteristics may be reduced, or electrical short-circuit defects may occur.

Figure 9A:
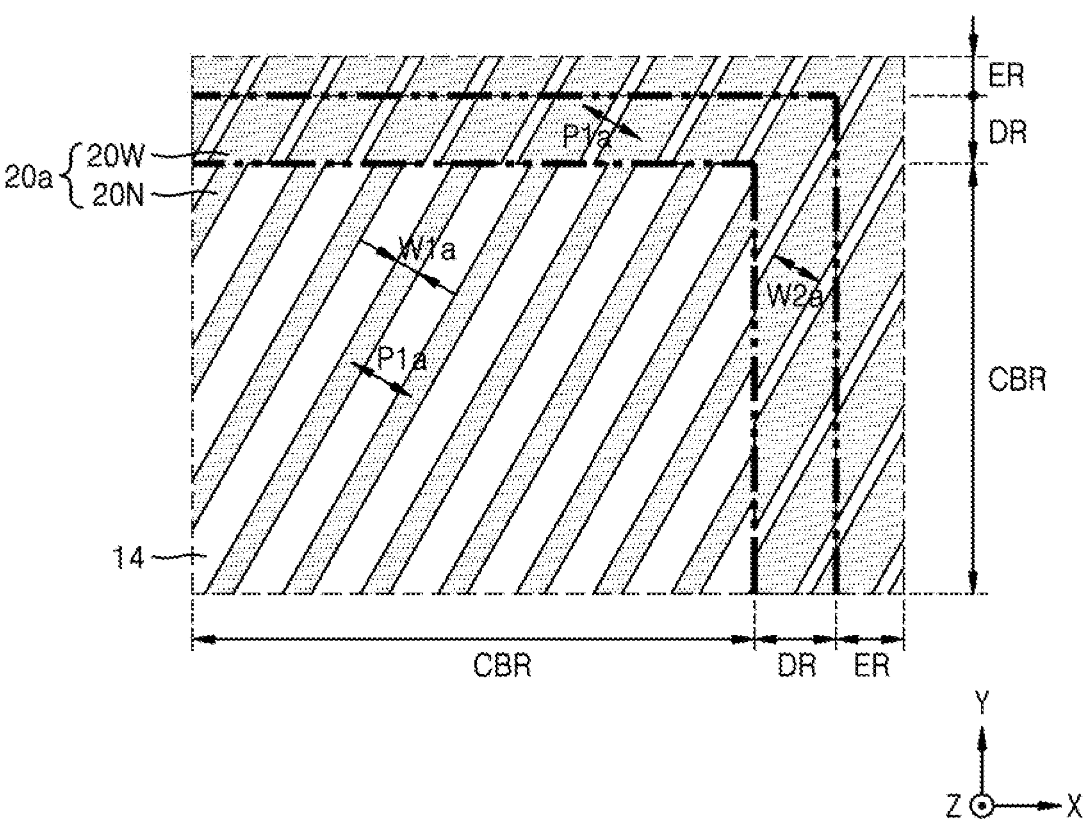
FIGS. 9A to 11B are plan views and cross-sectional views of a method of manufacturing an EUV mask and a method of forming a pattern by using the EUV mask, according to example embodiments.
Figure 9B:
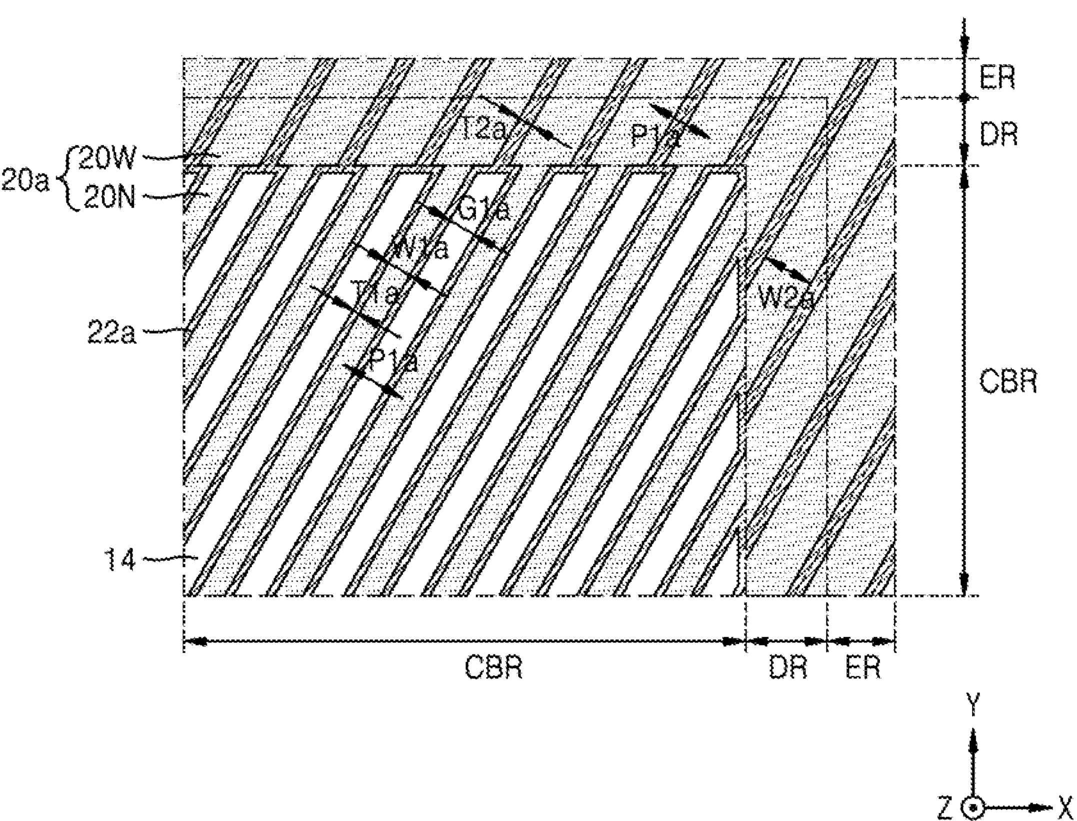
Figure 9C:
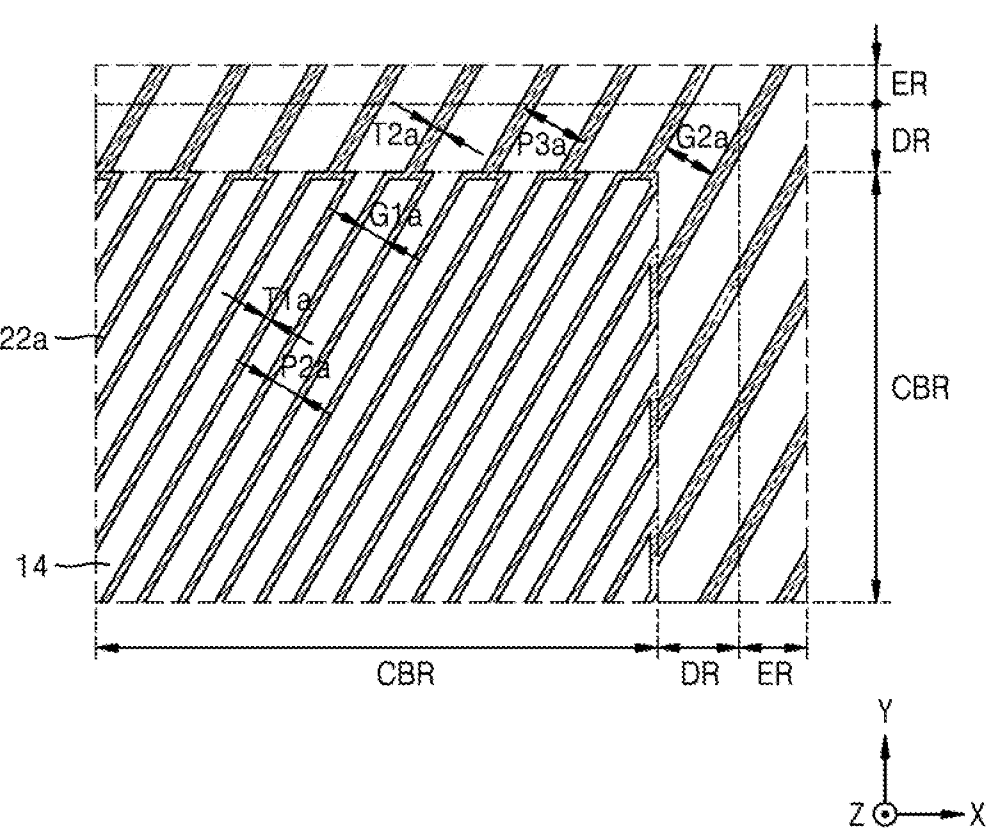
Figure 9D:
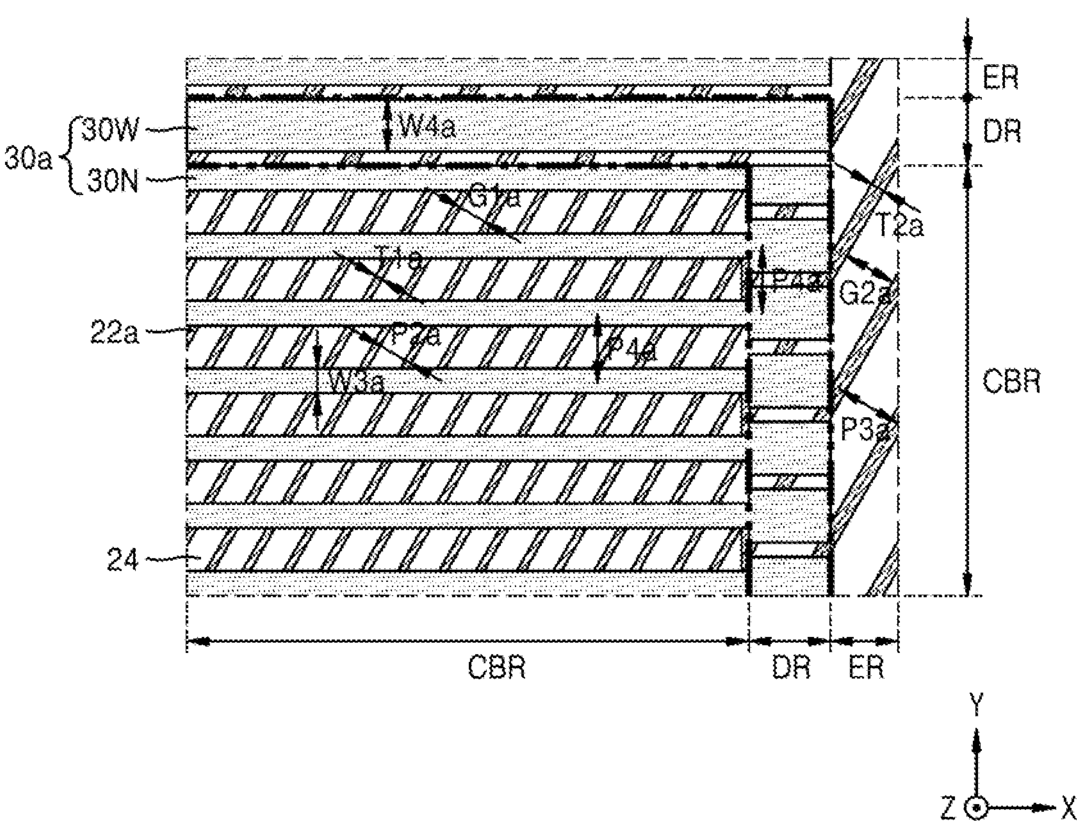
Figure 9E:
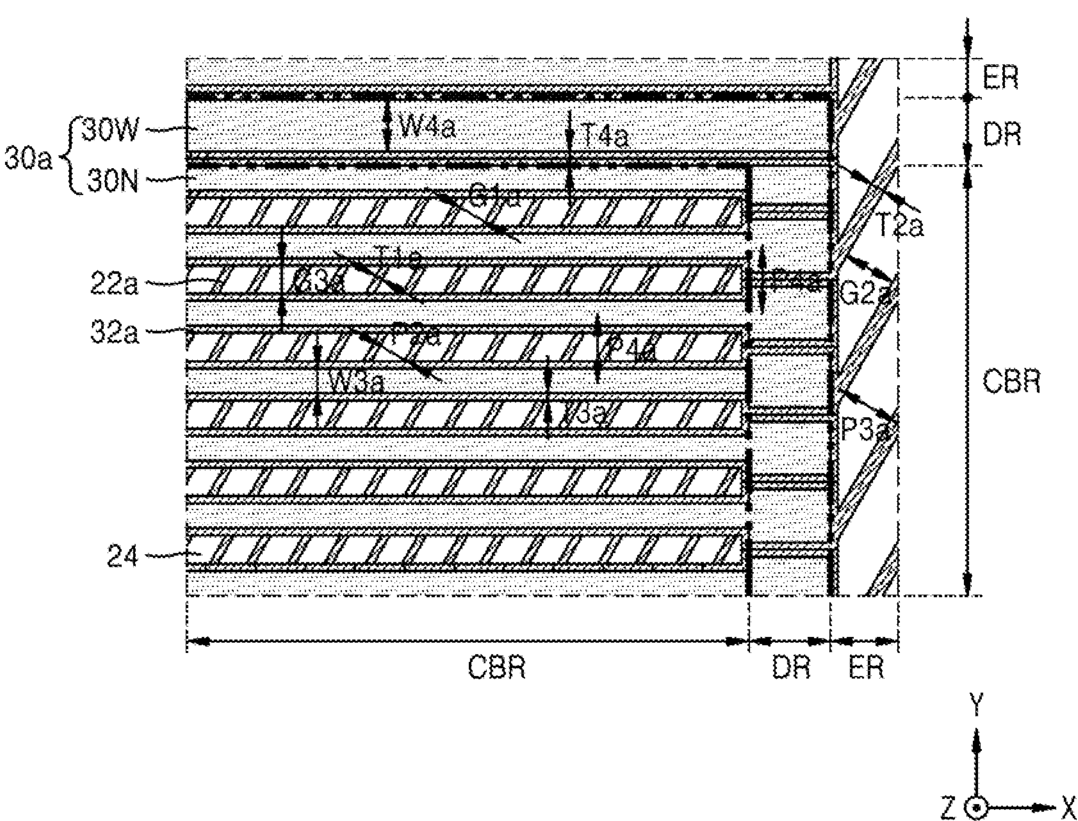
Figure 9F:
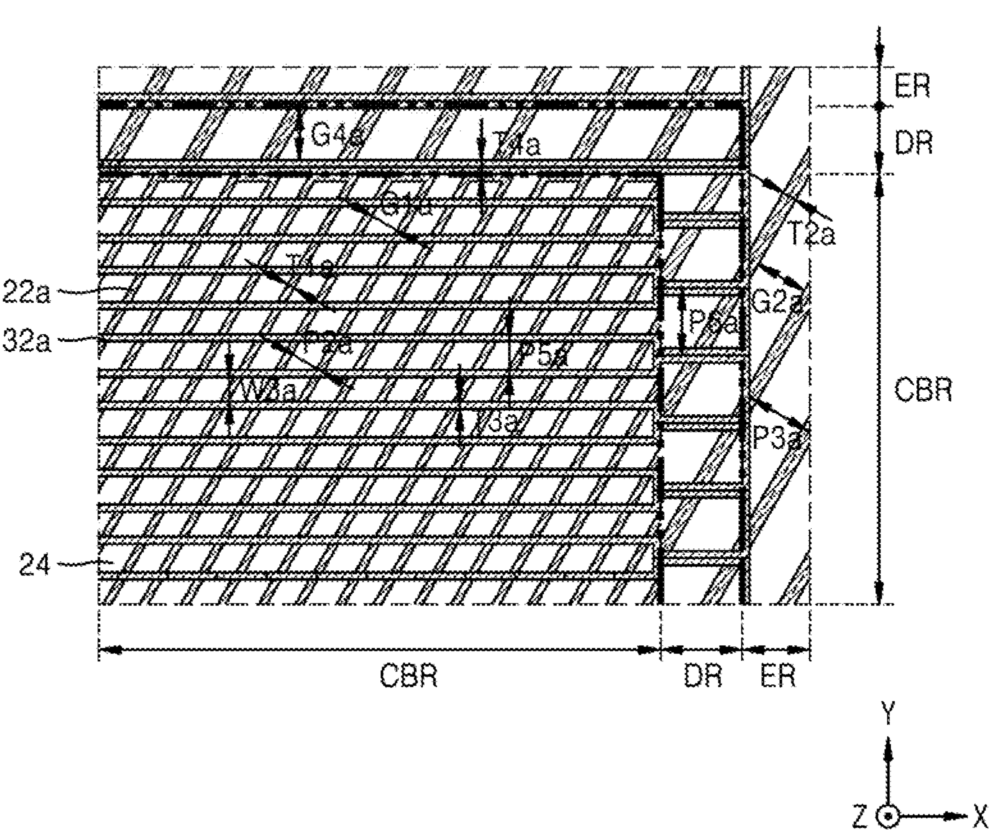
Figure 10A:
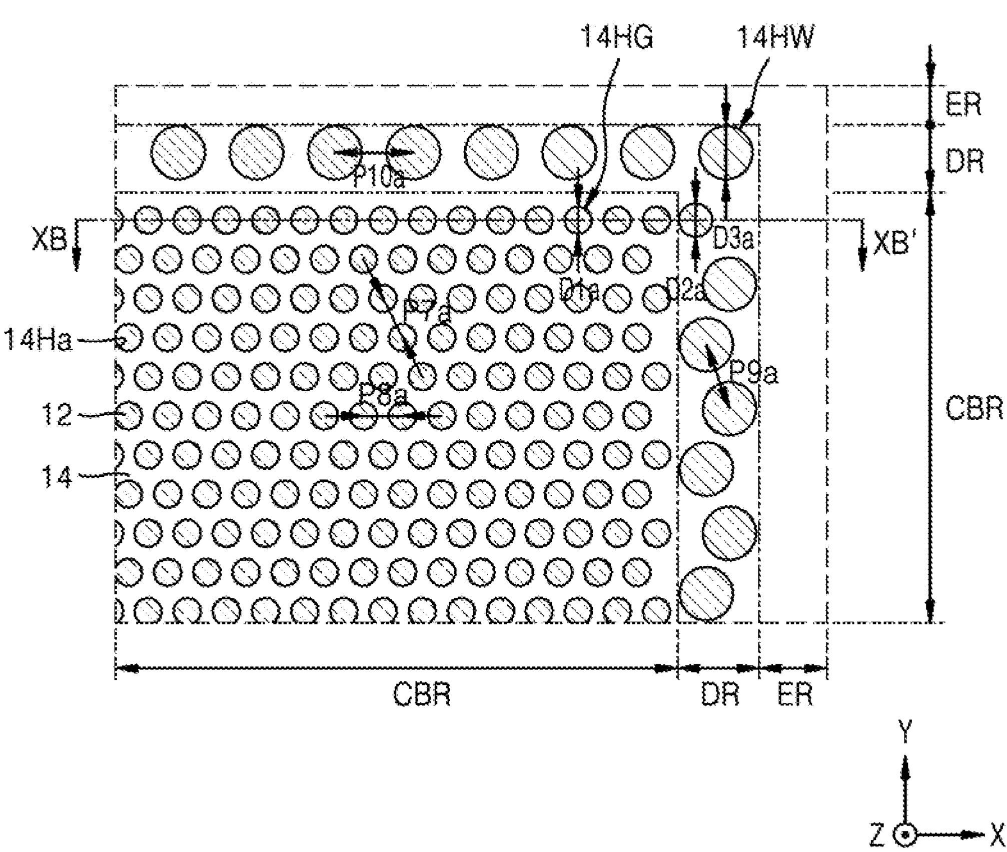
Figure 10B:
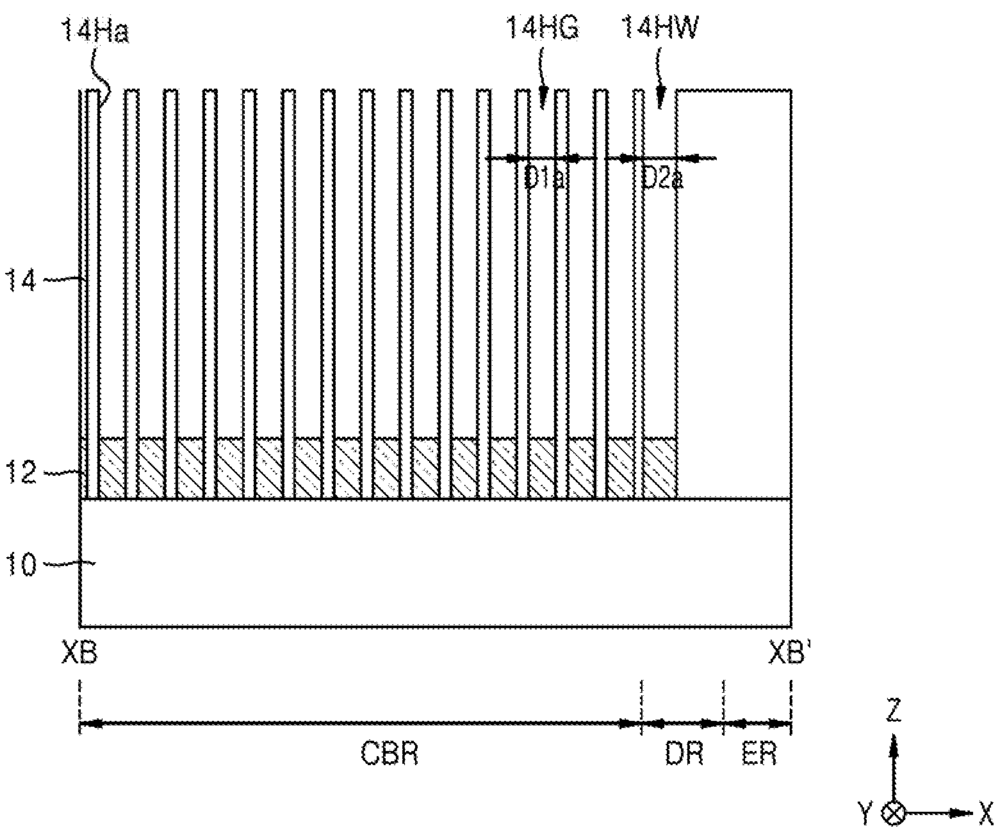
Figure 11A:
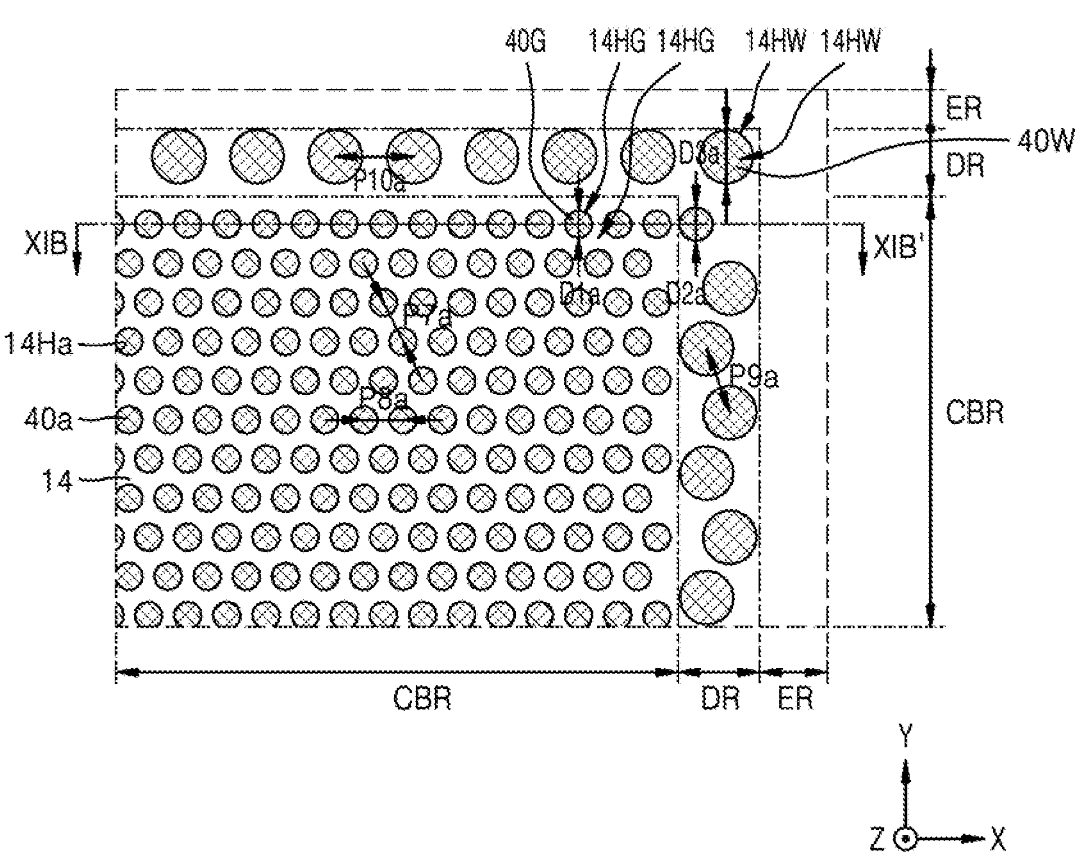
Figure 11B:
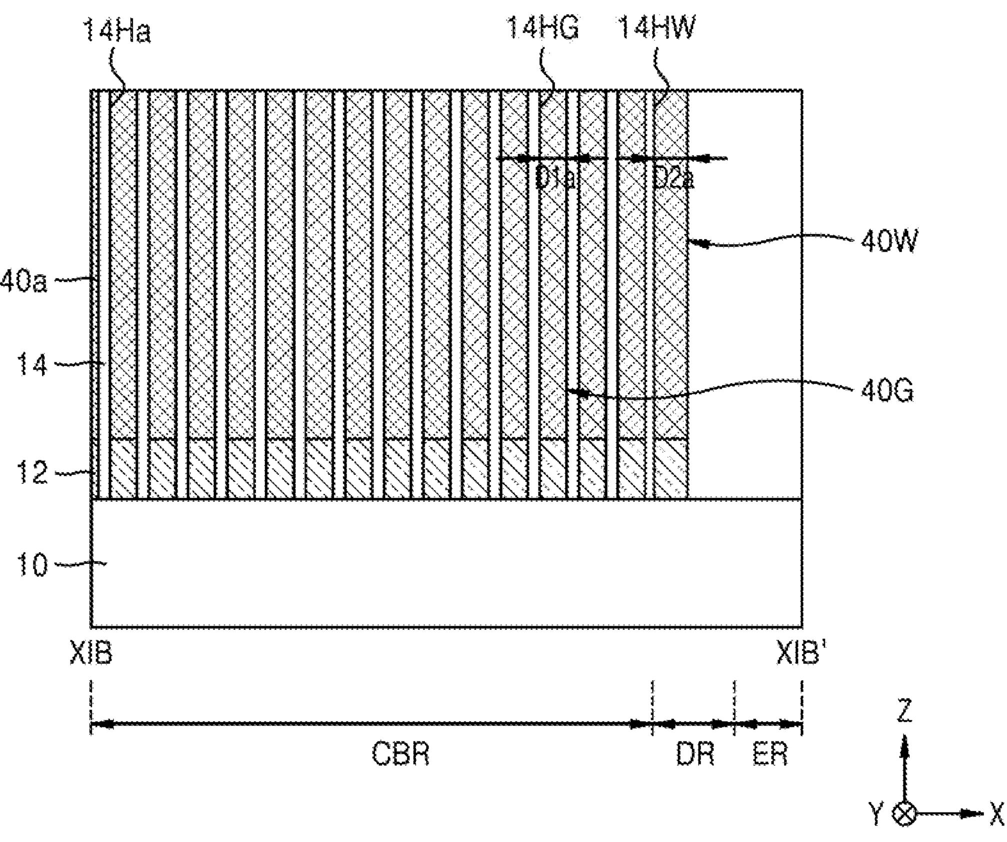

FIGS. 9A to 11B are plan views and cross-sectional views of a method of manufacturing an EUV mask and a method of forming a pattern by using the EUV mask, according to example embodiments. FIGS. 9A to 11B are plan views and cross-sectional views of a method of forming a plurality of target patterns by using a modified layout obtained by modifying the preliminary layout by reflecting the evaluation results of the plurality of target patterns 40 described through FIGS. 1A to 8B, and components having the same member names or reference numerals as those in FIGS. 1A to 8B are the same or similar elements, and thus, redundant descriptions may be omitted. In particular, FIGS. 10B and 11B are cross-sectional views respectively taken along a line XB-XB' of FIG. 10A and a line XIB-XIB' of FIG. 11A.

Referring to FIG. 9A, a plurality of first base patterns 20*a* may be on the molding layer 14. The plurality of first base patterns 20*a* may be formed by using a modified first layout. The modified first layout may be in, e.g., GDSII. The modified first layout may include a plurality of layout patterns respectively corresponding to the plurality of first base patterns 20*a*. The modified first layout may be, e.g., a mask layout for forming a first EUV mask. In an implementation, the plurality of first base patterns 20*a* may be formed by using the first EUV mask.

The plurality of first base patterns 20*a* may extend parallel to each other with a first pitch P1*a*. The plurality of first base patterns 20*a* may extend in a diagonal direction with respect to the first horizontal direction (X direction) and the second horizontal direction (Y direction). A portion of each of the plurality of first base patterns 20*a* may be a first narrow base pattern 20N having a first horizontal width W1*a*, and another portion of each of the plurality of first base patterns 20*a* may be a first wide base pattern 20W having a second horizontal width W2*a* that is greater than the first horizontal width W1*a*. In an implementation, each of at least some of the first base patterns 20*a* may extend with the first horizontal width W1*a* and then extend with the second horizontal width W2*a*. In an implementation, a portion of one first base pattern 20*a*, the portion extending with the first horizontal width W1*a*, is the first narrow base pattern 20N, and a portion of the one first base pattern 20*a*, the portion extending with the second horizontal width W2*a*, is the first wide base pattern 20W. In some embodiments, the first pitch P1*a* may have a value greater than twice the first horizontal width W1*a*. In some embodiments, the second horizontal width W2*a* may have a value greater than ½ of the first pitch P1*a*.

In some embodiments, each of portions of the plurality of first base patterns 20*a*, the portions being in the cell block region CBR, may be the first narrow base pattern 20N, and each of portions of the plurality of first base patterns 20*a*, the portions being in the dummy region DR and the edge region ER, may be the first wide base pattern 20W. In an implementation, one first base pattern 20*a* may extend with the first horizontal width W1*a* in the cell block region CBR, and may extend with the second horizontal width W2*a* in the dummy region DR and the edge region ER.

Referring to FIG. 9B, a plurality of first spacer patterns 22*a* respectively covering sidewalls of the plurality of first base patterns 20*a* may be formed. The plurality of first spacer patterns 22*a* may each have a first thickness T1*a* on each of both sidewalls of the plurality of first base patterns 20*a*. The first thickness T1*a* may have a value less than the first width W Ia. Two first spacer patterns 22*a* covering opposite sidewalls of each of two first narrow base patterns 20N, which may be adjacent to each other, may be spaced apart from each other with a first gap G1*a*. In some embodiments, the first gap G1*a* may have substantially the same value as the first width W1*a*. A pair of first spacer patterns 22*a* covering opposite sidewalls of each of two first wide base patterns 20W, which may be adjacent to each other, may be in contact with each other. In an implementation, spaces between the plurality of first wide base patterns 20W may all be filled with portions of the plurality of first spacer patterns 22*a*.

Referring to FIGS. 9B and 9C, portions of the upper surface of the molding layer 14, the portions being covered with the plurality of first base patterns 20*a*, may be exposed by removing the plurality of first base patterns 20*a*. The plurality of first spacer patterns 22*a* may remain on the molding layer 14. The plurality of first spacer patterns 22*a* may extend in a diagonal direction with respect to the first horizontal direction (X direction) and the second horizontal direction (Y direction).

In the cell block region CBR, the plurality of first spacer patterns 22*a* may each have a horizontal width of the first thickness T1*a*, and may extend parallel to each other with a second pitch P2*a*. In the cell block region CBR, the plurality of first spacer patterns 22*a* may be at equal intervals from each other. In an implementation, in the cell block region CBR, the plurality of first spacer patterns 22*a* may be spaced apart from each other with the first gap G1*a*. In an implementation, the second pitch P2*a* may have a value less than the first pitch P1*a*, and may have a value greater than the first thickness T1*a*. In some embodiments, the first gap G1*a* may have substantially the same value as the first width W1*a*.

In the dummy region DR and the edge region ER, in the plurality of first spacer patterns 22*a*, a pair of first spacer patterns 22*a*, which may be adjacent to each other, may be integrally formed by contacting each other. Accordingly, in the dummy region DR and the edge region ER, a horizontal width of the first spacer pattern 22*a*, which may be integrally formed by the pair of adjacent first spacer patterns 22*a*, may have a second thickness T2*a*. The second thickness T2*a* may have a value that is twice or slightly less than twice of the first thickness T1*a*. In the dummy region DR and the edge region ER, pairs of first spacer patterns 22*a*, which contact each other, may each have the second thickness T2*a*, and may extend parallel to each other with a third pitch P3*a*. In the dummy region DR and the edge region ER, the pair of first spacer patterns 22*a*, which contact each other, may be arranged with a second gap G2*a* that is greater than the first gap G1*a*. In an implementation, the third pitch P3*a* may have a value substantially equal to twice the second pitch P2*a*, and the second gap G2*a* may have a value substantially equal to twice the first gap G1*a*.

In an implementation, the plurality of first spacer patterns 22*a* may extend in the cell block region CBR with the horizontal width of the first thickness T1*a* and the first pitch P1*a*, and may extend in the dummy region DR and the edge region ER with a horizontal width of the second thickness T2*a* that is greater than the first thickness T1*a* and the second pitch P2*a* that is greater than the first pitch P1*a*.

Referring to FIGS. 9C and 9D, after the first filling insulating layer 24 filling spaces between the plurality of first spacer patterns 22*a* is formed, a plurality of second base patterns 30*a* may be on the plurality of first spacer patterns 22*a* and the first filling insulating layer 24. The plurality of second base patterns 30*a* may be formed by using a modified second layout. The modified second layout may be in, e.g., GDSII. The modified second layout may be, e.g., a mask layout for forming a second EUV mask. The modified second layout may include a plurality of layout patterns respectively corresponding to the plurality of second base patterns 30*a*. In an implementation, the plurality of second base patterns 30*a* may be formed by using the second EUV mask formed by using the modified second layout.

The plurality of second base patterns 30*a* may extend parallel to each other with a fourth pitch P4*a*. The plurality of second base patterns 30*a* may extend in the first horizontal direction (X direction). Some of the second base patterns 30*a* may be second narrow base patterns 30N each having a third horizontal width W3*a*, and some other second base patterns 30*a* may be second wide base patterns 30W each having a fourth horizontal width W4*a* that may be greater than the third horizontal width W3*a*. In an implementation, each of at least some of the second base patterns 30*a* may extend with the third horizontal width W3*a* and then extend with the fourth horizontal width W4*a*. In an implementation, a portion of one second base pattern 30*a*, the portion extending with the third horizontal width W3*a*, may be the second narrow pattern 30N, and a portion of the one second base pattern 30*a*, the portion extending with the fourth horizontal width W4*a*, may be the second wide base pattern 30W. In some embodiments, the third pitch P3*a* may have a value greater than twice the third horizontal width W3*a*. In some embodiments, the fourth horizontal width W4*a* may have a value greater than ½ of the third pitch P3*a*.

In some embodiments, the plurality of second base patterns 30 may extend in a diagonal direction with respect to the first horizontal direction (X direction) and the second horizontal direction (Y direction), the diagonal direction being different from an extension direction of the plurality of first spacer patterns 22, to cross the plurality of first spacer patterns 22. In some embodiments, the third pitch P3 may have a value greater than twice the second horizontal width W2*a*.

In some embodiments, each of portions of the plurality of second base patterns 30*a*, the portions being in the cell block region CBR, may be the second narrow base pattern 30N, and each of portions of the plurality of second base patterns 30*a*, the portions being in the dummy region DR, may be the second wide base pattern 30W. In an implementation, one second base pattern 30*a* may extend with the third horizontal width W3*a* in the cell block region CBR, and may extend with the fourth horizontal width W4*a* in the dummy region DR.

Referring to FIG. 9E, a plurality of second spacer patterns 32*a* respectively covering sidewalls of the plurality of second base patterns 30*a* may be formed. Each of the plurality of second spacer patterns 32*a* may have a third thickness T3*a* on each of both sidewalls of the plurality of second base patterns 30*a*. The third thickness T3*a* may have a value less than the third width W3*a*. Two second spacer patterns 32*a* covering opposite sidewalls of each of two second narrow base patterns 30N, which may be adjacent to each other, may be spaced apart with a third gap G3*a*. In some embodiments, the third gap G3*a* may have substantially the same value as the third width W3*a*. A pair of second spacer patterns 32*a* covering opposite sidewalls of each of two second wide base patterns 30W, which may be adjacent to each other, may be in contact with each other. In an implementation, spaces between the plurality of second wide base patterns 30W may all be filled with portions of the plurality of second spacer patterns 32*a*.

Referring to FIGS. 9E and 9F, portions of the plurality of first spacer patterns 22*a* and the upper surface of the first filling insulating layer 24, the portions being covered with the plurality of second base patterns 30*a*, may be exposed by removing the plurality of second base patterns 30*a*. The plurality of second spacer patterns 32*a* may remain on the plurality of first spacer patterns 22*a* and the first filling insulating layer 24.

In the cell block region CBR, the plurality of second spacer patterns 32*a* may each have the third thickness T3*a*, and may extend parallel to each other with a fifth pitch P5*a*. In the cell block region CBR, the plurality of second spacer patterns 32*a* may be at equal intervals from each other. In an implementation, in the cell block region CBR, the plurality of second spacer patterns 32*a* may be spaced apart from each other with the third gap G3*a*. In an implementation, the fifth pitch P5*a* may have a value less than the fourth pitch P4*a*, and may have a value greater than the third thickness T3*a*. In some embodiments, the third gap G3*a* may have substantially the same value as the third width W3*a*.

In the dummy region DR, in the plurality of second spacer patterns 32*a*, a pair of second spacer patterns 32*a*, which may be adjacent to each other, may contact each other, and the pair of second spacer patterns 32*a*, which contact each other, may have a fourth thickness T4*a*. The fourth thickness T4*a* may have a value that is twice or slightly less than twice of the third thickness T3*a*. In the dummy region DR, the pairs of second spacer patterns 32*a*, which contact each other, may each have the fourth thickness T4*a*, and may extend parallel to each other with a sixth pitch P6*a*. In the dummy region DR, the pairs of second spacer patterns 32*a*, which contact each other, may be arranged with a fourth gap G4*a* that is greater than the third gap G3*a*. In an implementation, the sixth pitch P6*a* may have a value substantially equal to twice the fifth pitch P5*a*, and the fourth gap G4*a* may have a value substantially equal to twice the third gap G3*a*.

Referring to FIGS. 9F, 10A, and 10B together, a plurality of holes 14Ha may be formed by etching the molding layer 14 by using the plurality of first spacer patterns 22*a* and the plurality of second spacer patterns 32*a* as an etching mask. In some embodiments, in the cell block region CBR, the plurality of holes 14Ha may be in a honeycomb shape in a zigzag pattern with respect to at least one of the first horizontal direction (X direction) and the second horizontal direction (Y direction).

The plurality of holes 14Ha may include the plurality of normal holes 14HG. In some embodiments, the plurality of holes 14Ha may include a plurality of wide holes 14HW. The plurality of normal holes 14HG may each have a first diameter D1*a*, and the connection target 12 may be exposed on a bottom surface of each of the plurality of normal holes 14HG. The connection target 12 may be exposed on a bottom surface of each of the plurality of wide holes 15HW. The plurality of normal holes 14HG and the plurality of wide holes 14HW may respectively have substantially the same depths.

In some embodiments, the plurality of holes 14Ha may be formed in the cell block region CBR and the dummy region DR, and may not be formed in the edge region ER. The plurality of normal holes 14HG may be formed in the cell block region CBR. The plurality of holes 14Ha formed in the cell block region CBR may all be the plurality of normal holes 14HG. The plurality of wide holes 14HW may not be formed in the cell block region CBR, and may be formed in the dummy region DR. In some embodiments, some of the normal holes 14HG may also be formed in the dummy region DR.

The plurality of normal holes 14HG may be in rows with a seventh pitch P7*a* in a diagonal direction with respect to the first horizontal direction (X direction) and the second horizontal direction (Y direction), and may be in rows with an eighth pitch P8*a* in the first horizontal direction (X direction). In some embodiments, the seventh pitch P7*a* may have substantially the same value as the second pitch P2*a*, and the eighth pitch P8*a* may have substantially the same value as the fifth pitch P5*a*. The plurality of wide holes 14HW may be in rows with a ninth pitch P9*a* in a diagonal direction with respect to the first horizontal direction (X direction) and the second horizontal direction (Y direction), and may be in rows with a tenth pitch P10*a* in the first horizontal direction (X direction). In some embodiments, the ninth pitch P9*a* may have substantially the same value as the third pitch P3*a*, and the tenth pitch P10*a* may have substantially the same value as the sixth pitch P6*a*.

The plurality of wide holes 14HW may each have a diameter greater than the first diameter D1*a*. The diameters of the plurality of wide holes 14HW may increase in a direction away from the plurality of normal holes 14HG. In an implementation, some of the wide holes 14HW, which may be relatively close to the plurality of normal holes 14HG, may each have a second diameter D2*a* greater than the first diameter D1*a*, and some other wide holes 14HW, which may be relatively far from the plurality of normal holes 14HG, may each have a third diameter D3*a* that is greater than the second diameter D2*a*.

Referring to FIGS. 10A to 11B, a plurality of target patterns 40*a* filling the plurality of holes 14Ha may be formed. In some embodiments, the molding layer 14 may be removed after the plurality of target patterns 40*a* may be formed.

The diameters of the plurality of target patterns 40*a* may be substantially the same as the diameters of plurality of holes 14Ha corresponding to the plurality of target patterns 40*a*, the plurality of target patterns 40*a* and the plurality of holes 14Ha, which correspond to each other, may be substantially identically arranged, and the height of the plurality of target patterns 40*a* may be substantially the same as the depth of the plurality of holes 14Ha corresponding to the plurality of target patterns 40*a* or has a substantially constant small value, and thus detailed descriptions thereof are omitted.

The plurality of target patterns 40*a* may include the plurality of normal target patterns 40G. In some embodiments, the plurality of target patterns 40*a* may further include a plurality of wide target patterns 40W. In an implementation, the plurality of target patterns 40*a* may include the plurality of normal target patterns 40G and the plurality of wide target patterns 40W. The diameter of the plurality of wide target patterns 40W may be greater than the diameter of the plurality of normal target patterns 40G. Some of the wide holes 14HW, which may be relatively close to the plurality of normal holes 14HG, may each have a relatively small diameter, and some other wide holes 14HW, which may be relatively far from the plurality of normal holes 14HG, may each have a relatively large diameter.

In some embodiments, the plurality of target patterns 40*a* may be formed in the cell block region CBR and the dummy region DR, and may not be formed in the edge region ER. The plurality of wide target patterns 40W may be in the dummy region DR around the corner of the cell block region CBR, or may be in the dummy region DR around the corner and edge of the cell block region CBR. In some embodiments, when some of the normal target patterns 40G may be formed in the dummy region DR, the normal target patterns 40G in the dummy region DR may be around the corner of the cell block region CBR or may be around the corner and edge of the cell block region CBR, and the plurality of wide target patterns 40W may be in a portion of the dummy region DR, the portion being far from the cell block region CBR based on the normal target patterns 40G in the dummy region DR.

Referring to FIGS. 9A to 11B together, based on the plurality of first base patterns 20*a* and the plurality of second base patterns 30*a* formed by using a pair of EUV masks including the first EUV mask and the second EUV mask by using a pair of layouts including the first modified layout and the second modified layout, the plurality of first spacer patterns 22*a* and the plurality of second spacer patterns 32*a* may be formed, the plurality of holes 14Ha may be formed by using the plurality of first spacer patterns 22*a* and the plurality of second spacer patterns 32*a* as an etching mask, and then the plurality of target patterns 40*a* filling the plurality of holes 14Ha may be formed. Among the plurality of target patterns 40*a*, each of the target patterns 40*a*, which may be formed in the cell block region CBR, may be formed as a normal target pattern 40G. The pair of layouts may be layouts formed by modifying the pair of preliminary layouts described with reference to FIGS. 1A to 8B, and the pair of EUV masks may be EUV masks formed by using the pair of layouts.

Referring to FIGS. 1A to 11B, according to embodiments, in a method of manufacturing an EUV mask and a method of forming a pattern of a semiconductor device or a semiconductor memory device by using the EUV mask, the target patterns 40*a* in the cell block region CBR around the corner or the corner and edge of the cell block region CBR may be formed to have the same diameter as the target patterns 40*a* inside the cell block region CBR, and thus yields of the semiconductor devices or semiconductor memory devices may be increased, and electrical reliability may be secured.

Figure 14:
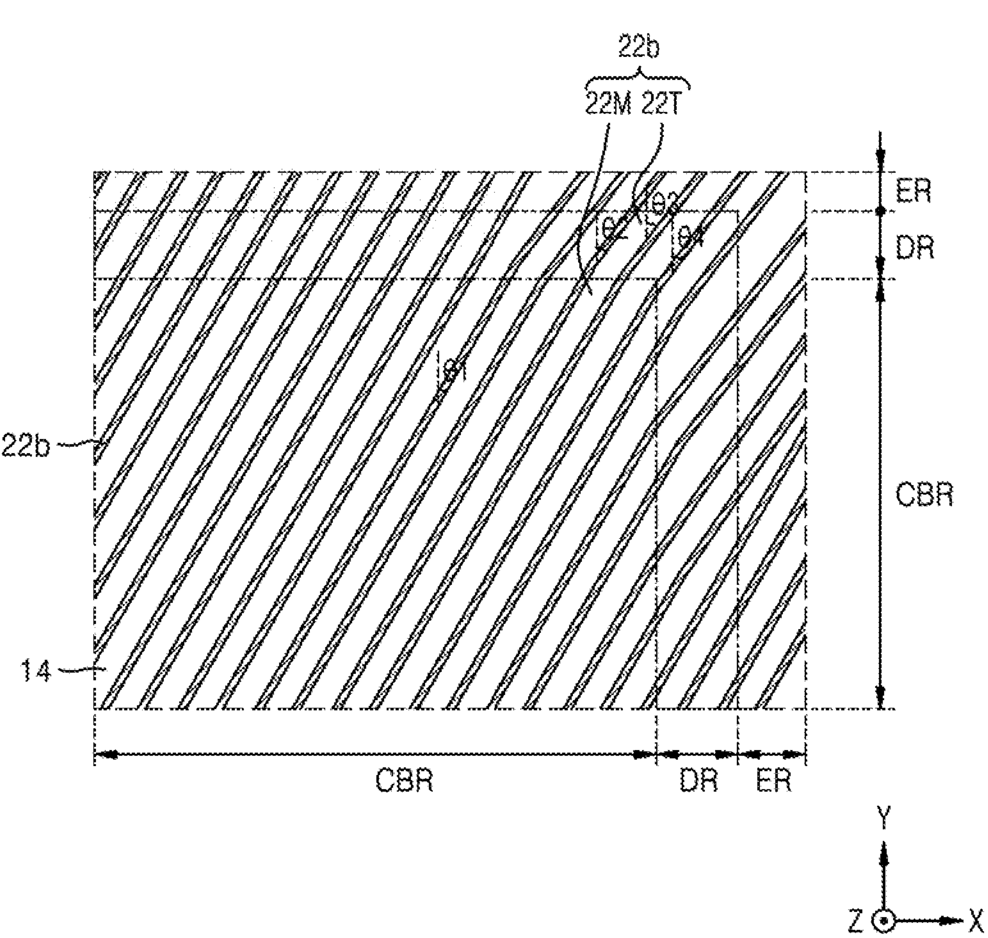
Figure 15:
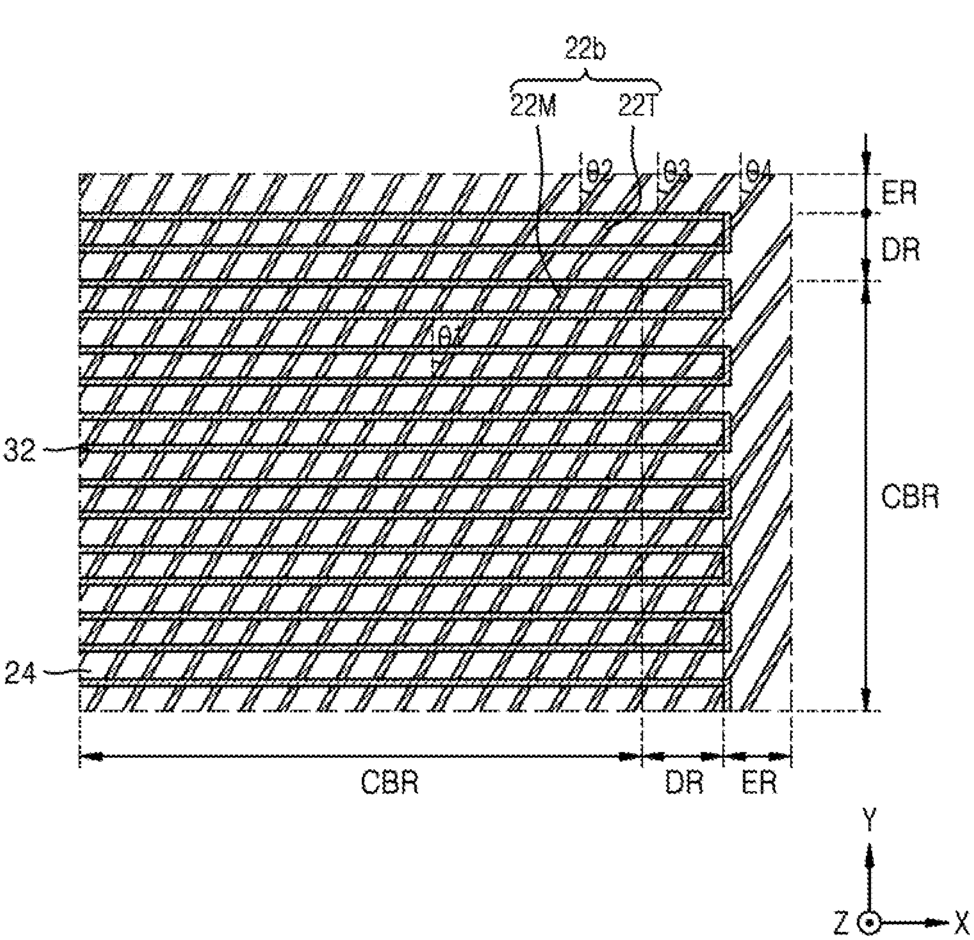
Figure 16A:
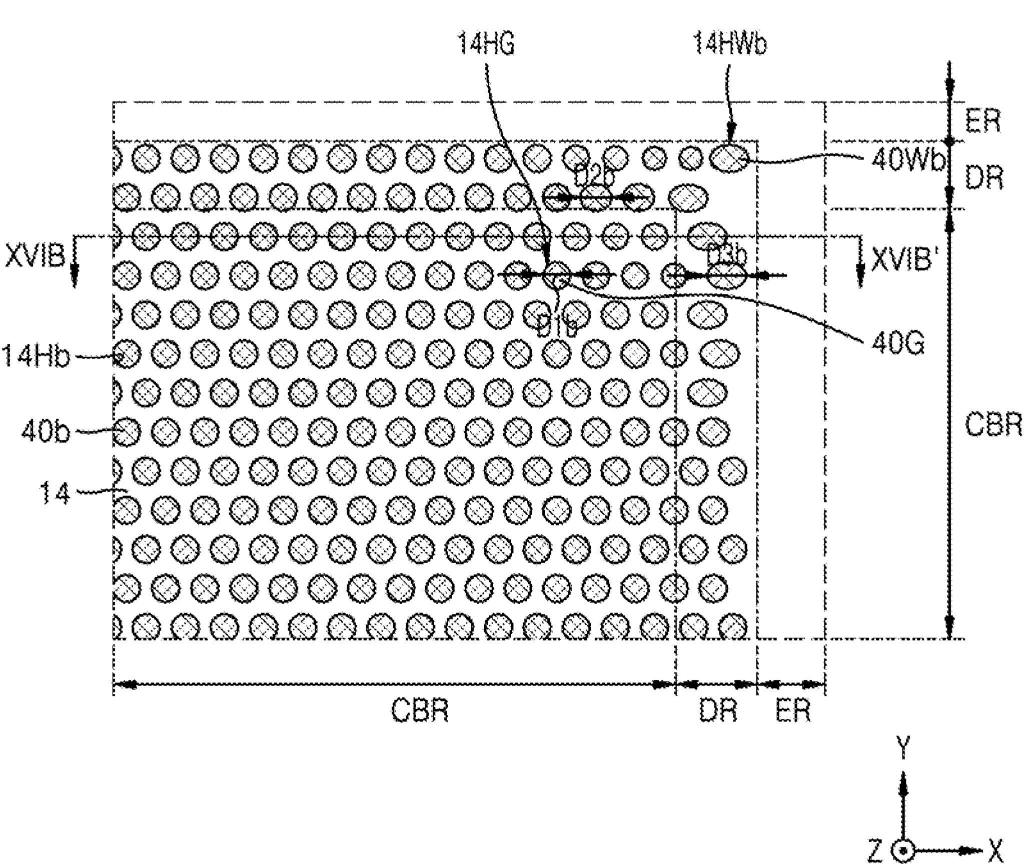
Figure 16B:
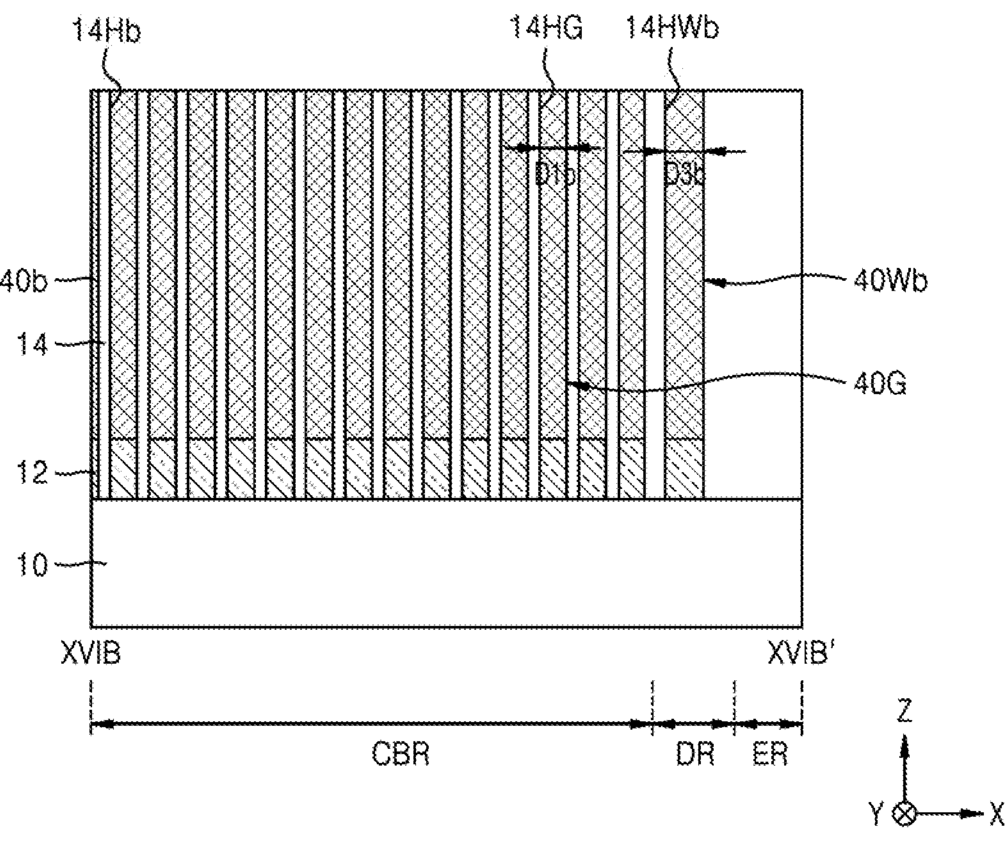

FIGS. 12 to 16B are plan views and cross-sectional views of a method of manufacturing an EUV mask and a method of forming a pattern by using the EUV mask, according to example embodiments. FIGS. 12 to 16B are plan views and cross-sectional views of a method of forming a plurality of target patterns by using a modified layout obtained by modifying the preliminary layout by reflecting the evaluation results of the plurality of target patterns 40 described through FIGS. 1A to 8B, and components having the same member names or reference numerals as those in FIGS. 1A to 8B are the same or similar elements, and thus, redundant descriptions may be omitted. In particular, FIG. 16B is a cross-sectional view taken along a line XVIB-XVIB' of FIG. 16A.

Figure 12:
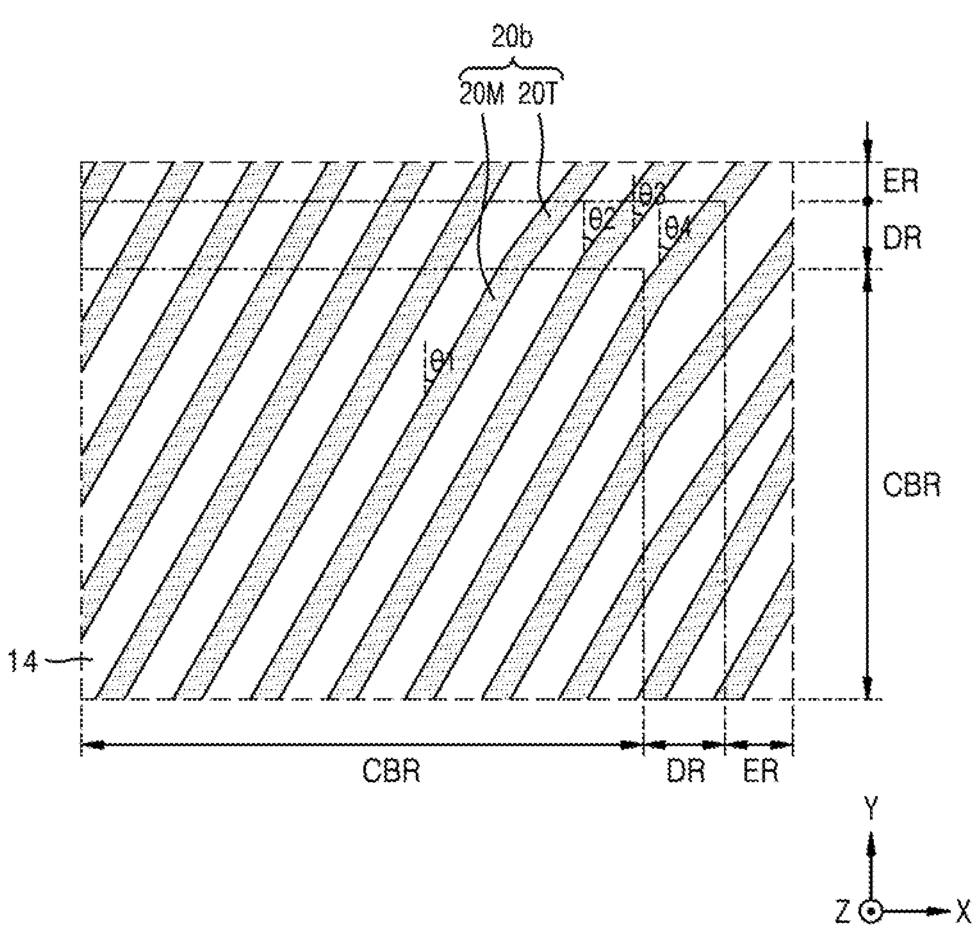
FIGS. 12 to 16B are plan views and cross-sectional views of a method of manufacturing an EUV mask and a method of forming a pattern by using the EUV mask, according to example embodiments.

Referring to FIG. 12, a plurality of base patterns 20*b* may be on the molding layer 14. The plurality of base patterns 20*b* may be formed by using a modified first layout. The modified first layout may be formed in, e.g., GDSII. The modified first layout may be, e.g., a mask layout for forming a first EUV mask. In an implementation, the plurality of base patterns 20*b* may be formed by using the first EUV mask.

The plurality of base patterns 20*b* may be spaced apart from each other and extend in a diagonal direction with respect to the first horizontal direction (X direction) and the second horizontal direction (Y direction). A portion and another portion of each of the plurality of base patterns 20*b* may extend in different directions. Each of the plurality of base patterns 20*b* may include a first main extension pattern 20M and a first inclined extension pattern 20T having a different extension direction from that of the first main extension pattern 20M. In a top view, the first main extension pattern 20M and the first inclined extension pattern 20T may have a mutual inclination. In an implementation, with respect to the second horizontal direction (Y direction), the first main extension pattern 20M may extend in a direction at which a first angle θ1 is inclined, and the first inclined extension pattern 20T may extend in a direction at which an angle greater than the first angle θ1 is inclined.

A plurality of first inclined extension patterns 20T may have a greater angle of inclination with respect to a plurality of first main extension patterns 20M in a direction closer to the corner of the cell block region CBR. Some of the plurality of first inclined extension patterns 20T may extend in different directions. In an implementation, with respect to the second horizontal direction (Y direction), at least one of the plurality of first inclined extension patterns 20T may extend in a direction at which a second angle θ2 is inclined, at least another one of the plurality of first inclined extension patterns 20T may extend in a direction at which a third angle θ3 is inclined, and at least another one of the plurality of first inclined extension patterns 20T may extend in a direction at which a fourth angle θ4 is inclined. The second angle θ2 may be greater than the first angle θ1, the third angle θ3 may be greater than the second angle θ2, and the fourth angle θ4 may be greater than the third angle θ3. Each of the first angle θ1, the second angle θ2, the third angle θ3, and the fourth angle θ4 may be greater than 0 degree and less than 90 degrees. The plurality of first inclined extension patterns 20T may be inclined more with respect to the second horizontal direction (Y direction) in a direction closer to the corner or the cell block region CBR, and may be inclined less with respect to the second horizontal direction (Y direction) in a direction away from the cell block region CBR. In an implementation, among the plurality of first inclined extension patterns 20T, the first inclined extension patterns 20T extending in a direction at which the fourth angle θ4 is inclined with respect to the second horizontal direction (Y direction) may be close to the corner of the cell block region CBR, the first inclined extension patterns 201 extending in a direction at which the third angle θ3 is inclined with respect to the second horizontal direction (Y direction) may be away from the corner of the cell block region CBR, and the first inclined extension patterns 20T extending in a direction at which the second angle θ is inclined with respect to the second horizontal direction (Y direction) may be farther from the corner of the cell block region CBR.

Figure 13:
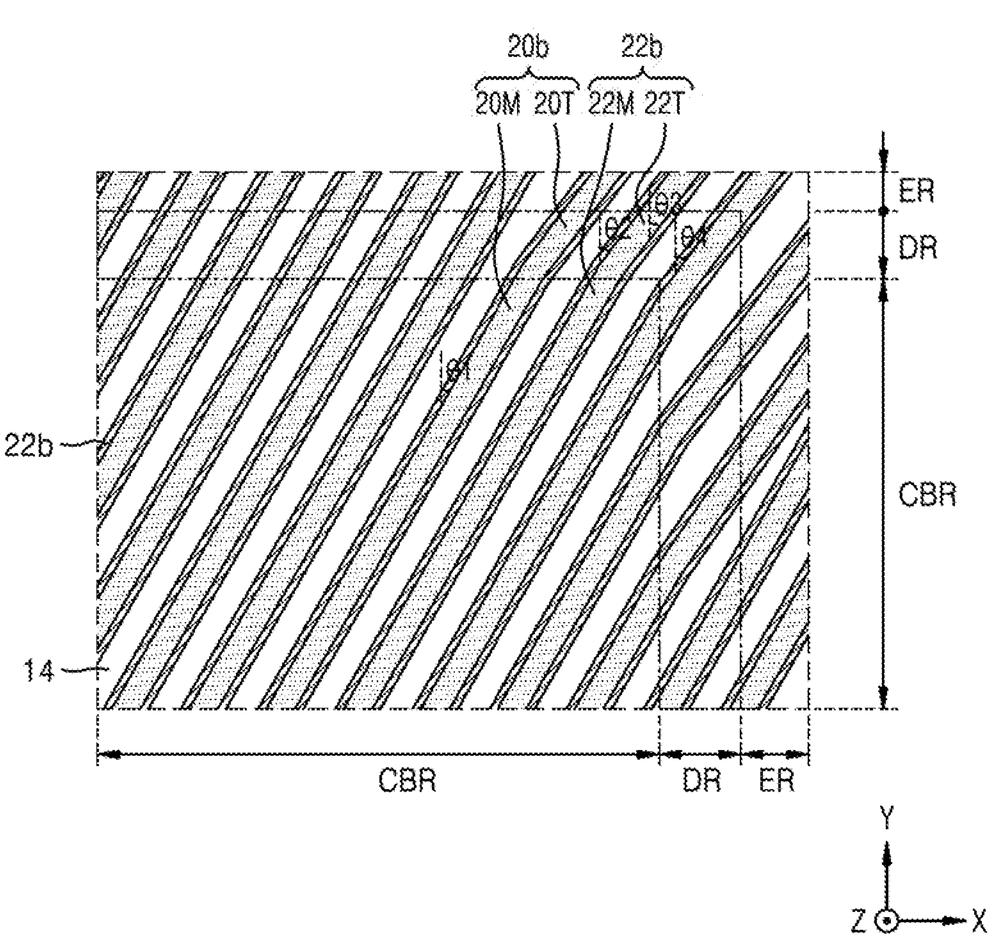

Referring to FIG. 13, a plurality of first spacer patterns 22*b* respectively covering sidewalls of the plurality of base patterns 20*b* may be formed. A portion and another portion of each of the plurality of first spacer patterns 22*b* may extend in different directions. Each of the plurality of first spacer patterns 22*b* may include a first main spacer pattern 22M and a first inclined spacer pattern 22T having a different extension direction from that of the first main spacer pattern 22M. In a top view, the first main spacer pattern 22M and the first inclined spacer pattern 22T may have a mutual inclination. Extension directions of a plurality of first main spacer patterns 22M and a plurality of first inclined spacer patterns 22T may be substantially the same as the extension directions of the plurality of first main extension patterns 20M and the plurality of first inclined extension patterns 20T corresponding to the plurality of first main spacer patterns 22M and the plurality of first inclined spacer patterns 22T. The plurality of first inclined spacer patterns 22T may be inclined more with respect to the second horizontal direction (Y direction) in a direction closer to the corner of the cell block region CBR, and may be inclined less with respect to the second horizontal direction (Y direction) in a direction away from the corner of the cell block region CBR.

Referring to FIGS. 13 and 14, the plurality of first spacer patterns 22*b* may remain, and the plurality of base patterns 20*b* may be removed. Referring to FIG. 15 together with FIGS. 4A to 6B, the plurality of second spacer patterns 32 may be on the plurality of first spacer patterns 22*b* and the first filling insulating layer 24.

Referring to FIGS. 15, 16A, and 16B, a plurality of holes 14Hb may be formed by etching the molding layer 14 by using the plurality of first spacer patterns 22*b* and the plurality of second spacer patterns 32 as an etching mask, and then a plurality of target patterns 40*b* filling the plurality of holes 14Hb may be formed. The plurality of holes 14Hb may include the plurality of normal holes 14HG and a plurality of wide holes 14HWb. The plurality of target patterns 40*b* may include the plurality of normal target patterns 40G and a plurality of wide target patterns 40Wb. Some of the wide holes 14HWb and the plurality of wide target patterns 40W, which may be relatively close to the plurality of normal holes 14HG and the plurality of normal target patterns 40G, may each have a relatively small diameter, and some other wide holes 14HWb and the plurality of wide target patterns 40W, which may be relatively far from the plurality of normal holes 14HG and the plurality of normal target patterns 40G, may each have a relatively large diameter.

Each of the plurality of normal holes 14HG and the plurality of normal target patterns 40G may have a first diameter D1*b*, and each of the plurality of wide holes 14HWb and the plurality of wide target patterns 40Wb may have a diameter greater than the first diameter D1*b*. Diameters of each of the plurality of wide holes 14HWb and the plurality of wide target patterns 40Wb may increase in a direction away from the plurality of normal holes 14HG and the plurality of normal target patterns 40G. In an implementation, some of the wide holes 14HWb and the plurality of wide target patterns 40Wb, which may be relatively close to the plurality of normal holes 14HG and the plurality of normal target patterns 40G, may each have a second diameter D2*b* greater than the first diameter D1*b*, and some other wide holes 14HWb and the plurality of wide target patterns 40Wb, which may be relatively far from the plurality of normal holes 14HG and the plurality of normal target patterns 40G, may each have a third diameter D3*b* greater than the second diameter D2*b*.

In some embodiments, the plurality of holes 14Hb and the plurality of target patterns 40*b* may be formed in the cell block region CBR and the dummy region DR, and may not be formed in the edge region ER. The plurality of wide holes 14HWb and the plurality of wide target patterns 40Wb may be in the dummy region DR around the corner of the cell block region CBR, or may be in the dummy region DR around the corner and edge of the cell block region CBR. In some embodiments, when some of the normal holes 14HG and the plurality of normal target patterns 40G may be also formed in the dummy region DR, the normal holes 14HG and the normal target patterns 40G, which may be in the dummy region DR, may be around the corner of the cell block region CBR or may be around the corner and edge of the cell block region CBR, and the plurality of wide holes 14HWb and the plurality of wide target patterns 40Wb may be in a portion of the dummy region DR, the portion being far from the cell block region CBR based on the normal holes 14HG and the normal target patterns 40G, which may be in the dummy region DR.

Referring to FIGS. 12 to 16B together, the plurality of first spacer patterns 22*b* and the plurality of second spacer patterns 32 may be formed by using a pair of EUV masks including the first EUV mask and the second EUV mask by using a pair of layouts including the first modified layout and the second modified layout, the plurality of holes 14Hb may be formed by using the plurality of first spacer patterns 22*b* and the plurality of second spacer patterns 32 as an etching mask, and then the plurality of target patterns 40*b* filling the plurality of holes 14Hb may be formed. Among the plurality of target patterns 40*b*, each of the target patterns 40*b*, which may be formed in the cell block region CBR, may be formed as a normal target pattern 40G. The pair of layouts may be layouts formed by modifying the pair of preliminary layouts described with reference to FIGS. 1A to 8B, and the pair of EUV masks may be EUV masks formed by using the pair of layouts.

Referring to FIGS. 12 to 16B, according to embodiments, in a method of manufacturing an EUV mask and a method of forming a pattern of a semiconductor device or a semiconductor memory device by using the EUV mask, the target patterns 40*b* in the cell block region CBR around the corner or the corner and edge of the cell block region CBR may be formed to have the same diameter as the target patterns 40*b* inside the cell block region CBR, and thus yields of the semiconductor devices or semiconductor memory devices may be increased, and electrical reliability may be secured.

In addition, referring to FIGS. 1A to 16B together, it is also apparent to those skilled in the art to form a plurality of target patterns by simultaneously changing the horizontal width and inclination of some of a plurality of first base patterns.

Herein, a first base pattern, a first spacer pattern, a second base pattern, a hole, and a target pattern, which may be formed by using the preliminary layout, may be referred to as a first preliminary base pattern, a first preliminary spacer pattern, a second preliminary base pattern, a preliminary hole, and a preliminary, to be distinguished from a first base pattern, a first spacer pattern, a second base pattern, a hole, and a target pattern, which may be formed by using a modified layout. Also, to differentiate from components formed by using the modified layout, components formed by using the preliminary layout may be referred to as "preliminary".

Figure 17A:
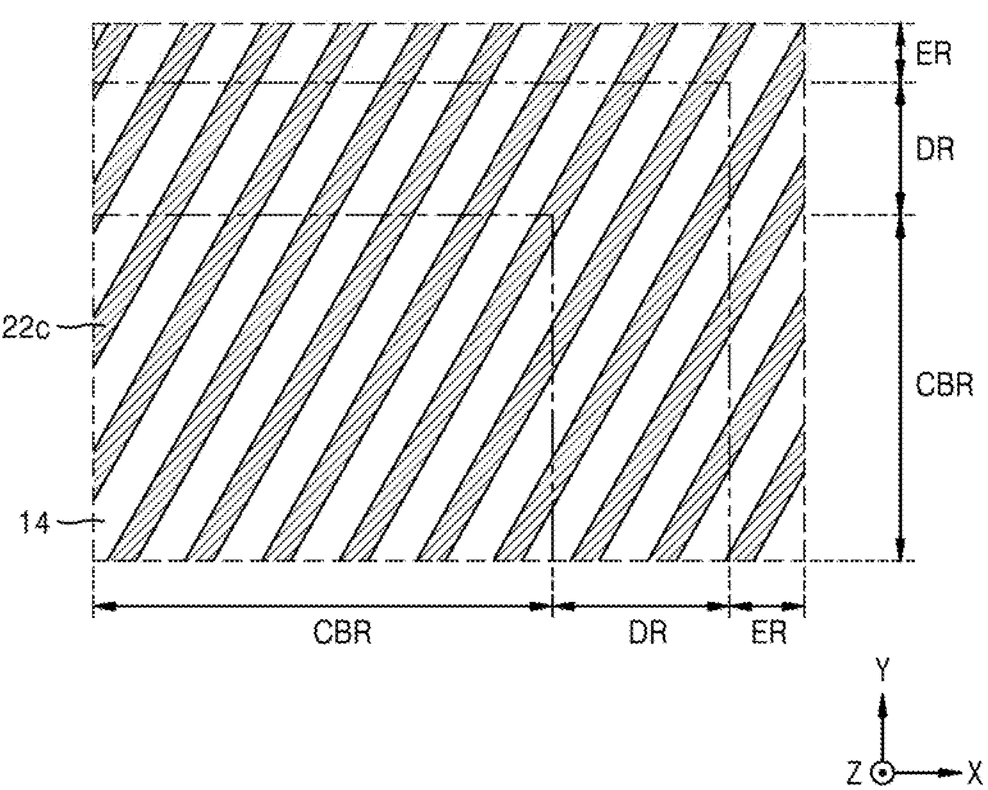
FIGS. 17A to 18B are plan views and cross-sectional views of a method of forming and evaluating a pattern by using a preliminary layout for manufacturing an EUV mask, according to example embodiments.
Figure 17B:
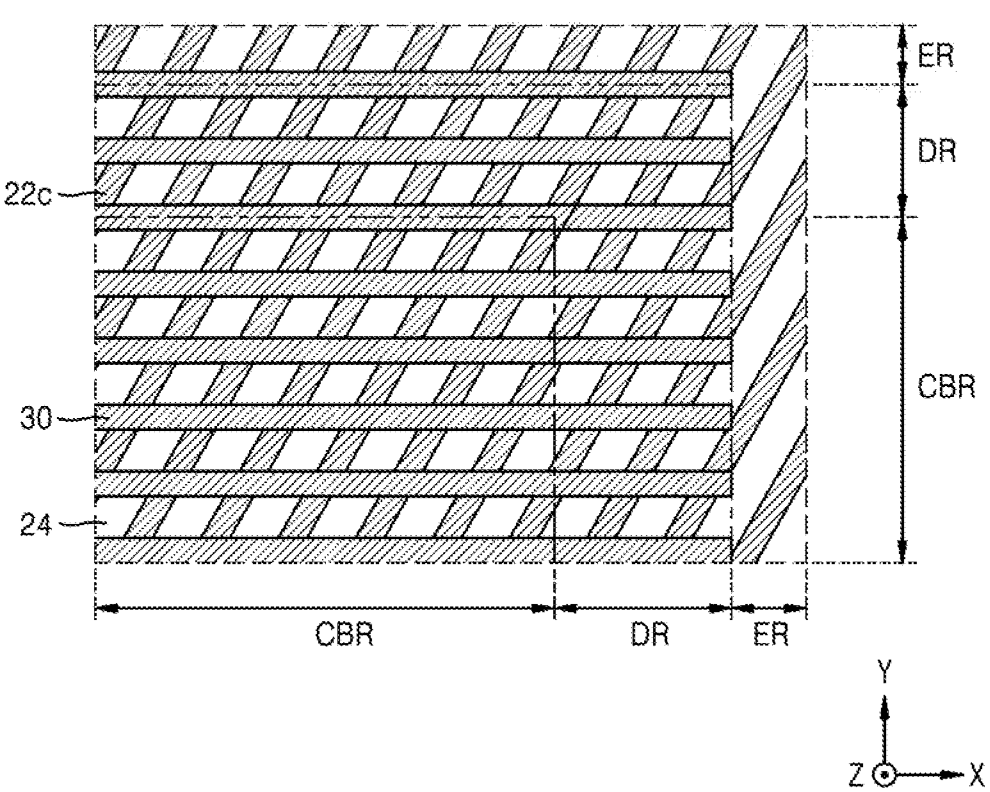
Figure 18A:
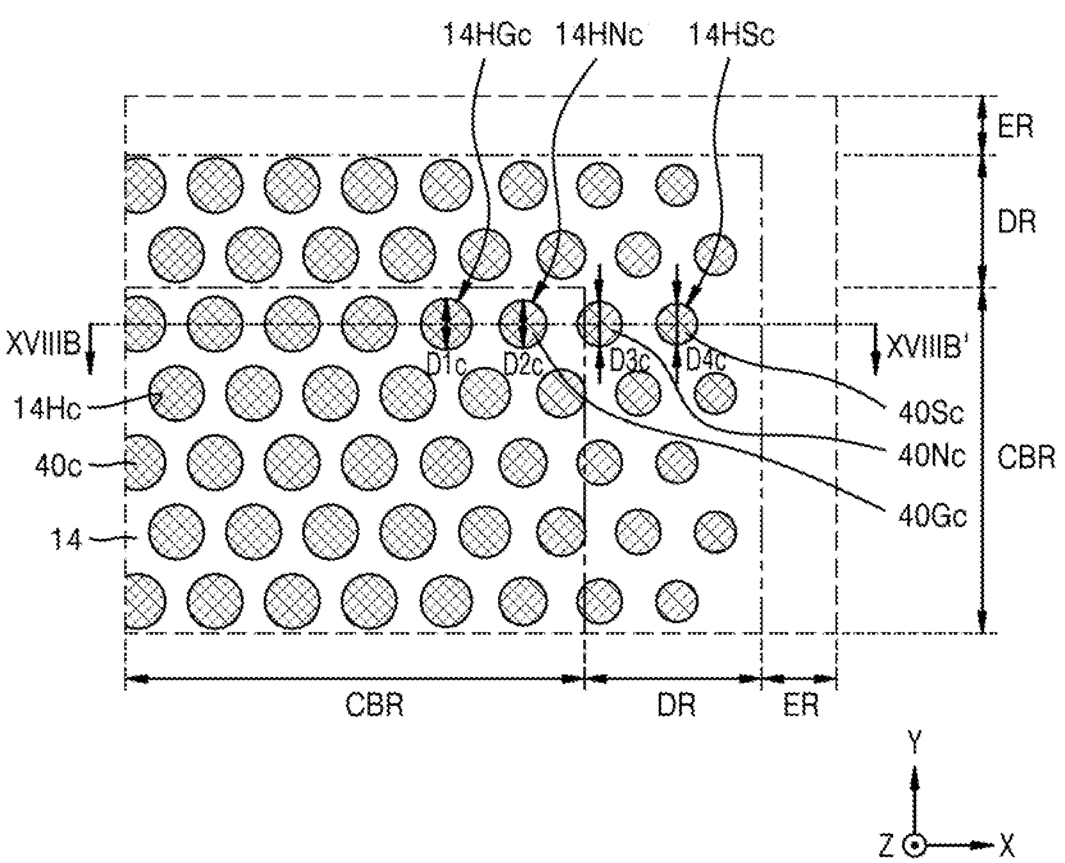
Figure 18B:
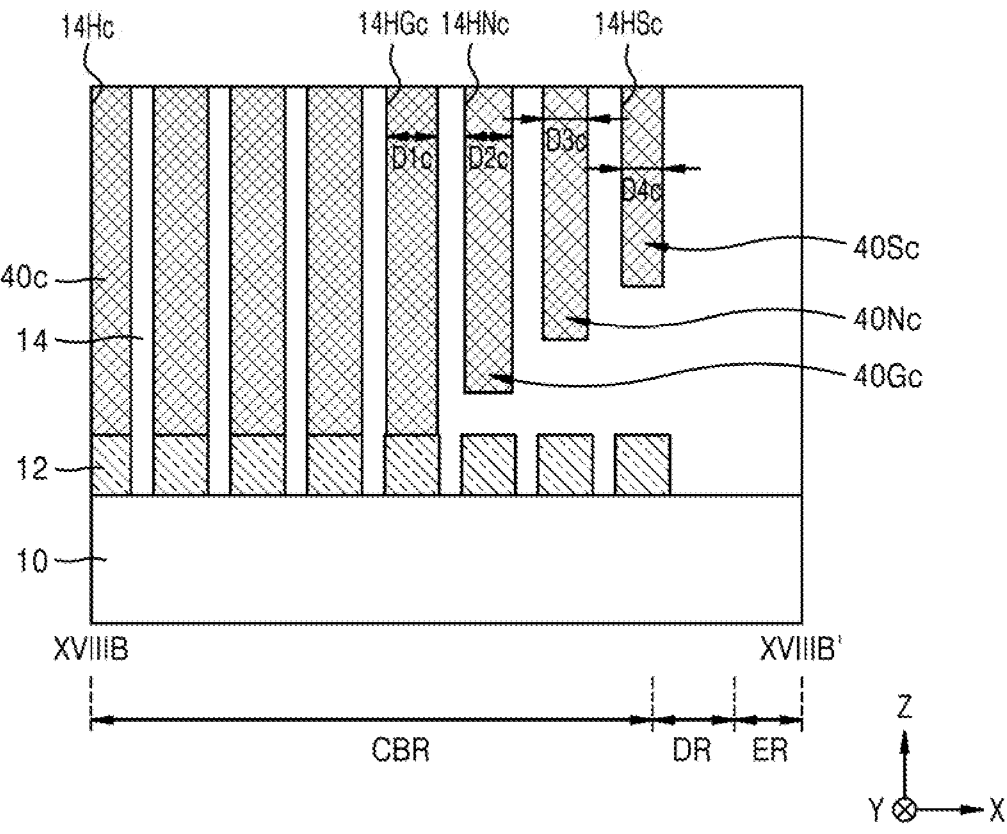

FIGS. 17A to 18B are plan views and cross-sectional views of a method of forming and evaluating a pattern by using a preliminary layout for manufacturing an EUV mask, according to example embodiments. In FIGS. 17A to 18B, components having the same member names or reference numerals as those in FIGS. 1A to 16B may be the same or similar elements, and thus, redundant descriptions may be omitted. In particular, FIG. 18B is a cross-sectional view taken along a line XVIIB-XVIIIB' of FIG. 18A.

Referring to FIG. 17A, a plurality of spacer patterns 22*c* may be on the molding layer 14. The plurality of spacer patterns 22*c* may be formed by using a first preliminary layout. The plurality of spacer patterns 22*c* may extend parallel to each other. The plurality of spacer patterns 22*c* may be at equal intervals from each other. The plurality of spacer patterns 22*c* may extend in a diagonal direction with respect to the first horizontal direction (X direction) and the second horizontal direction (Y direction).

Referring to FIG. 17B, after the first filling insulating layer 24 filling spaces between the plurality of spacer patterns 22*c* is formed, a plurality of second spacer patterns 30 may be on the plurality of spacer patterns 22*c* and the first filling insulating layer 24. The plurality of second spacer patterns 30 may be formed by using a second preliminary layout.

The plurality of second spacer patterns 30 may extend parallel to each other. The plurality of second spacer patterns 30 may be at equal intervals from each other. The plurality of second spacer patterns 30 may extend in the first horizontal direction (X direction).

Referring to FIGS. 17B, 18A, and 18B, a plurality of holes 14Hc may be formed by etching the molding layer 14 by using the plurality of spacer patterns 22*c* and the plurality of second spacer patterns 30 as an etching mask, and then a plurality of target patterns 40*c* filling the plurality of holes 14Hc may be formed.

The plurality of holes 14Hc may include a plurality of normal holes 14HGc, a plurality of narrow holes 14HNc, and/or a plurality of low holes 14HSc. The plurality of target patterns 40*c* may include a plurality of normal target patterns 40Gc, a plurality of narrow target patterns 40Nc, and/or a plurality of low target patterns 40Sc.

Each of the plurality of normal holes 14HGc and the plurality of normal target patterns 40Gc may have a first diameter D1*c*. The plurality of narrow holes 14HNc, the plurality of narrow target patterns 40Nc, the plurality of low holes 14HSc, and the plurality of low target patterns 40Sc may each have a diameter less than the first diameter D1*c*. Diameters of each of the plurality of narrow holes 14HNc, the plurality of narrow target patterns 40Nc, the plurality of low holes 141Sc, and the plurality of low target patterns 40Sc may decrease in a direction away from the plurality of normal holes 14HGc. The plurality of narrow holes 14HNc and the plurality of narrow target patterns 40Nc may be relatively closer to the plurality of normal holes 14HGc and the plurality of normal target patterns 40Gc than the plurality of low holes 14HSc and the plurality of low target patterns 40Sc. In an implementation, the plurality of narrow holes 14HNc and the plurality of narrow target patterns 40Nc may each have a second diameter D2*c* less than the first diameter D1*c*. In an implementation, some of the low holes 14HSc and the low target patterns 40Sc, which may be relatively close to the plurality of normal holes 14HGc and the plurality of normal target patterns 40Gc, may each have a third diameter D3*c* less than the second diameter D2*c*, and some other low holes 14HSc and the low target patterns 40Sc, which may be relatively far from the plurality of normal holes 14HGc and the plurality of normal target patterns 40Gc, may have a fourth diameter D4*c* less than the third diameter D3*c*.

Figure 19A:
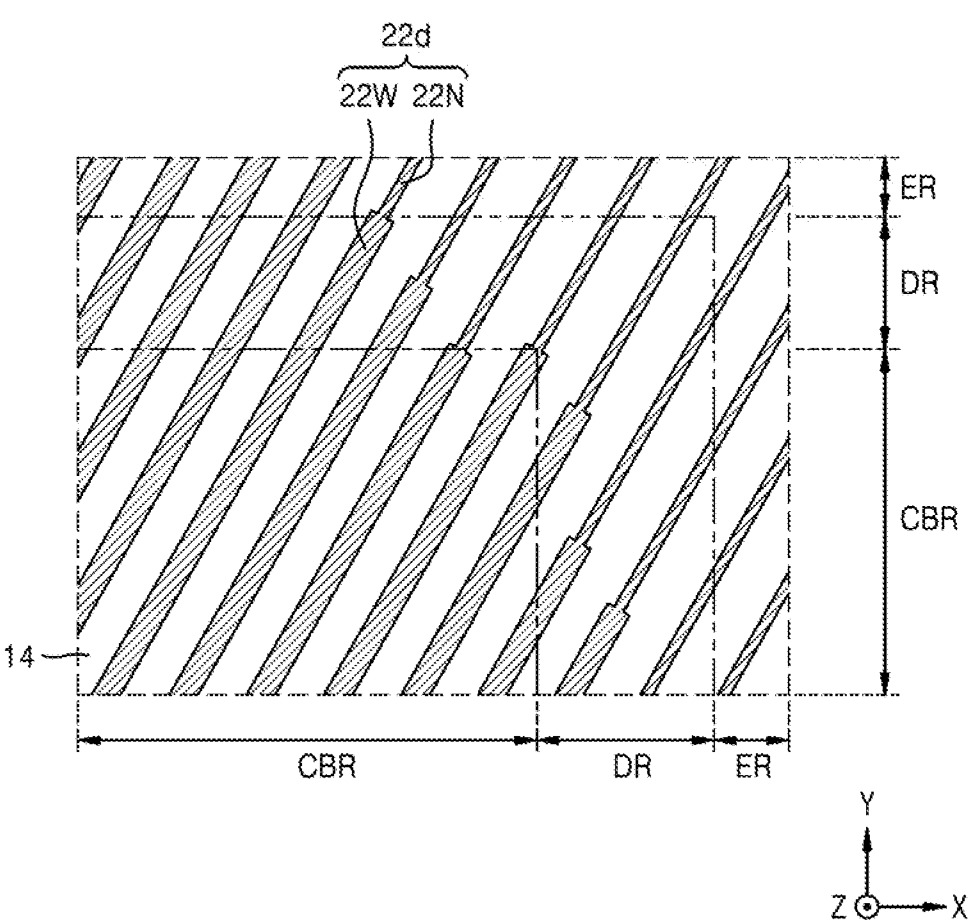
FIGS. 19A to 20B are plan views and cross-sectional views of a method of manufacturing an EUV mask and a method of forming a pattern by using the EUV mask, according to example embodiments.
Figure 19B:
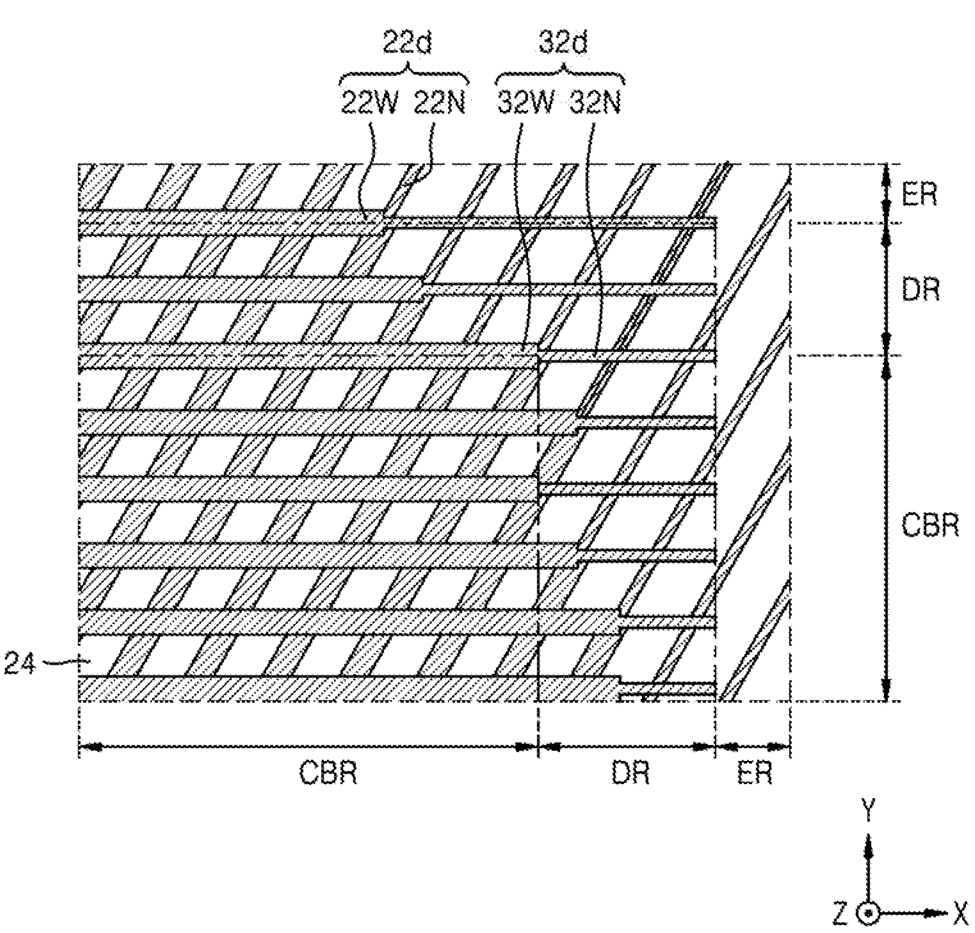
Figure 20A:
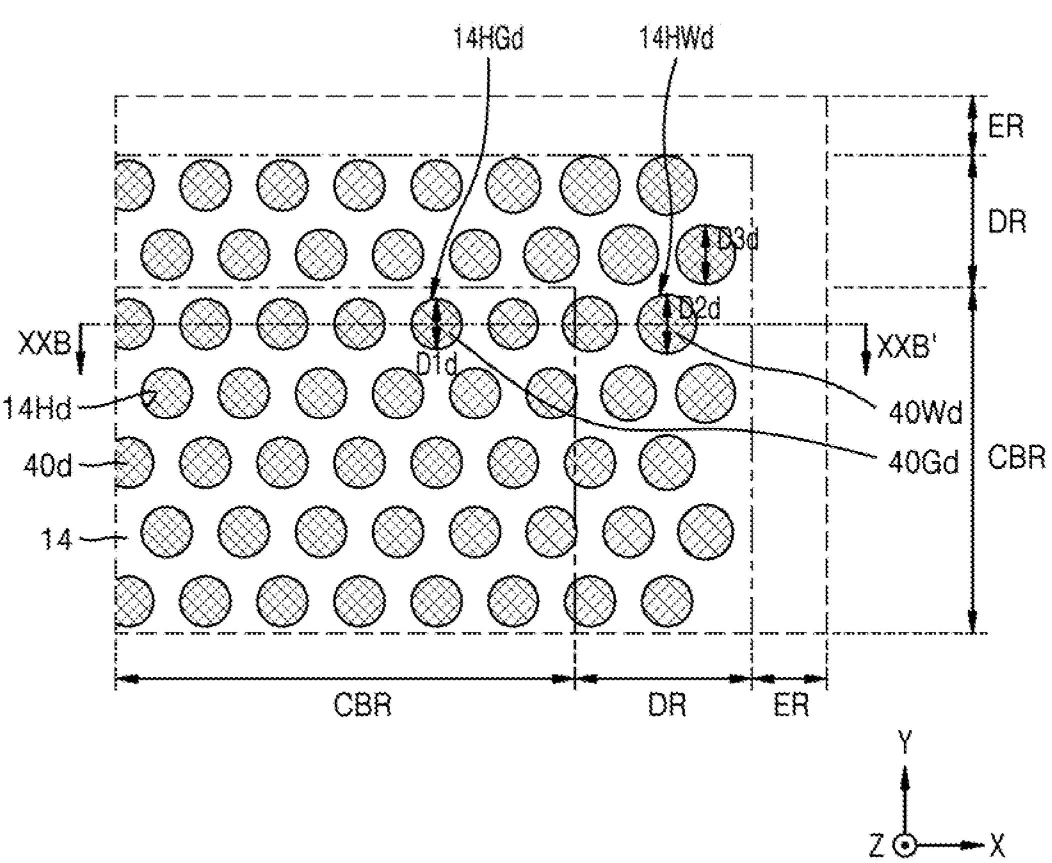
Figure 20B:
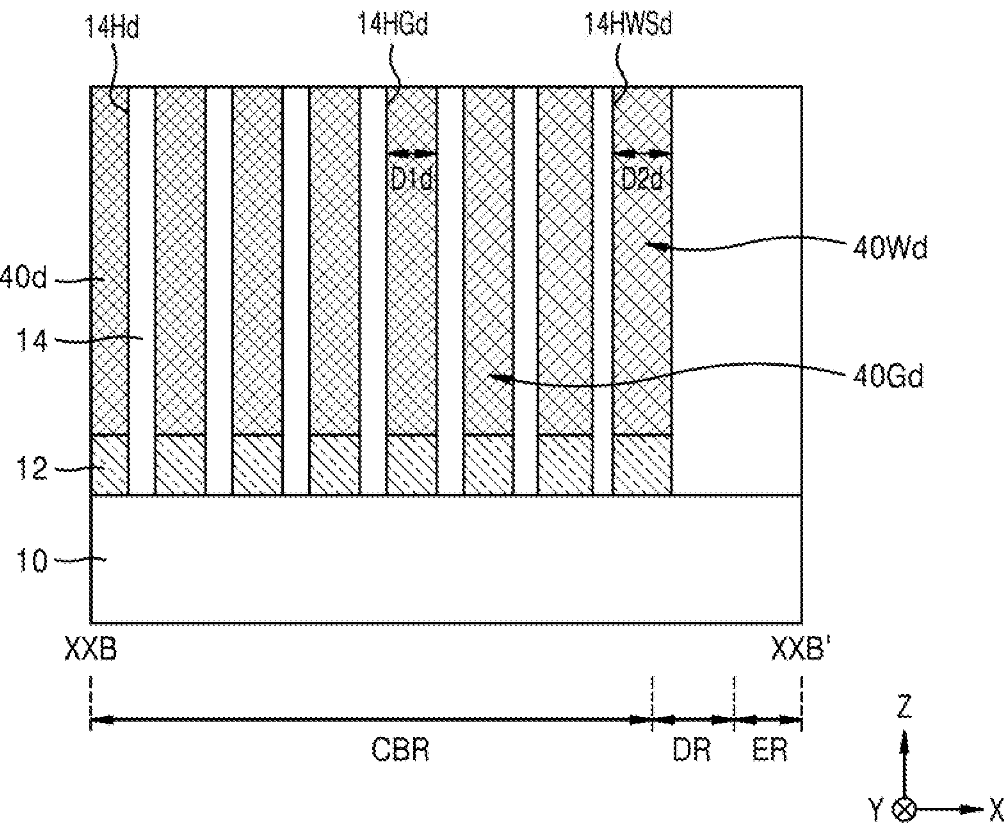

FIGS. 19A to 20B are plan views and cross-sectional views of a method of manufacturing an EUV mask and a method of forming a pattern by using the EUV mask, according to example embodiments. FIGS. 19A to 20B are plan views and cross-sectional views of a method of forming a plurality of target patterns by using a modified layout obtained by modifying the preliminary layout by reflecting the evaluation results of the plurality of target patterns 40*c* described through FIGS. 17A to 18B, and components having the same member names or reference numerals as those in FIGS. 1A to 18B may be the same or similar elements, and thus, redundant descriptions may be omitted. In particular, FIG. 20B is a cross-sectional view taken along a line XXB-XXB' of FIG. 20A.

Referring to FIG. 19A, a plurality of first spacer patterns 22*d* may be on the molding layer 14. The plurality of first spacer patterns 22*d* may be formed by using a modified first layout. The plurality of first spacer patterns 22*d* may extend parallel to each other in a diagonal direction with respect to the first horizontal direction (X direction) and the second horizontal direction (Y direction).

A portion of each of the plurality of first spacer patterns 22*d* may be a first wide spacer pattern 22W having a relatively large horizontal width, and another portion of each of the plurality of first spacer patterns 22*d* may be a first narrow spacer pattern 22N having a relatively small horizontal width. In some embodiments, each of portions of the plurality of first spacer patterns 22*d*, which may be in the cell block region CBR, may be the first wide spacer pattern 22W, and each of portions of the plurality of first spacer patterns 22*d*, which may be in the dummy region DR and the edge region ER, may be the first narrow spacer pattern 22N or the first wide spacer pattern 22W. In some other embodiments, portions of the plurality of first spacer patterns 22*d*, which may be in the dummy region DR and the edge region ER, may all be the first narrow spacer patterns 22N.

Referring to FIG. 19B, a plurality of second spacer patterns 32*d* may be on the plurality of first spacer patterns 22*d* and the first filling insulating layer 24. The plurality of second spacer patterns 32*d* may be formed by using a modified second layout. The plurality of second spacer patterns 32*d* may extend parallel to each other in the first horizontal direction (X direction).

A portion of each of the plurality of second spacer patterns 32*d* may be a second wide spacer pattern 32W having a relatively large horizontal width, and another portion of each of the plurality of second spacer patterns 32*d* may be a second narrow spacer pattern 32N having a relatively small horizontal width. In some embodiments, each of portions of the plurality of second spacer patterns 32*d*, which may be in the cell block region CBR, may be the second wide spacer pattern 32W, and each of portions of the plurality of second spacer patterns 32*d*, which may be in the dummy region DR and the edge region ER, may be the second narrow spacer pattern 32N or the second wide spacer pattern 32W. In some other embodiments, portions of the plurality of second spacer patterns 32*d*, which may be in the dummy region DR and the edge region ER, may all be the second narrow spacer patterns 32N. In some embodiments, a plurality of second wide spacer patterns 32W may extend while crossing a plurality of first wide spacer patterns 22W, and a plurality of second narrow spacer patterns 32N may extend while crossing a plurality of first narrow spacer patterns 22N.

Referring to FIGS. 19B, 20A, and 20B, a plurality of holes 141*d* may be formed by etching the molding layer 14 by using the plurality of first spacer patterns 22*d* and the plurality of second spacer patterns 32*d* as an etching mask, and then a plurality of target patterns 40*d* filling the plurality of holes 14Hd may be formed. The plurality of holes 14Hd may include a plurality of normal holes 14HGd and a plurality of wide holes 14HWd. The plurality of target patterns 40*d* may include a plurality of normal target patterns 40Gd and a plurality of wide target patterns 40Wd. Some of the wide holes 14HWd and wide target patterns 40Wd, which may be relatively close to the plurality of normal holes 14HGd and the plurality of normal target patterns 40Gd, may each have a relatively small diameter, and some other wide holes 14HWd and wide target patterns 40Wd, which may be relatively far from the plurality of normal holes 14HGd and the plurality of normal target patterns 40Gd, may each have a relative large diameter.

Each of the plurality of normal holes 14HGd and the plurality of normal target patterns 40Gd may have a first diameter D1*d*, and each of the plurality of wide holes 14HWd and the plurality of wide target patterns 40Wd may have a diameter greater than the first diameter D1*d*. Diameters of each of the plurality of wide holes 14HWd and the plurality of wide target patterns 40Wd may increase in a direction away from the plurality of normal holes 14HGd and the plurality of normal target patterns 40Gd. In an implementation, some of the wide holes 14HWd and wide holes 14HWd, which may be relatively close to the plurality of normal holes 14HGd and the plurality of normal target patterns 40Gd, may each have a second diameter D2*d* greater than the first diameter D1*d*, and some other wide holes 14HWd and wide holes 14HWd, which may be relatively far from the plurality of normal holes 14HGd and the plurality of normal target patterns 40Gd, may have a third diameter D3*d* greater than the second diameter D2*d*.

Figure 21A:
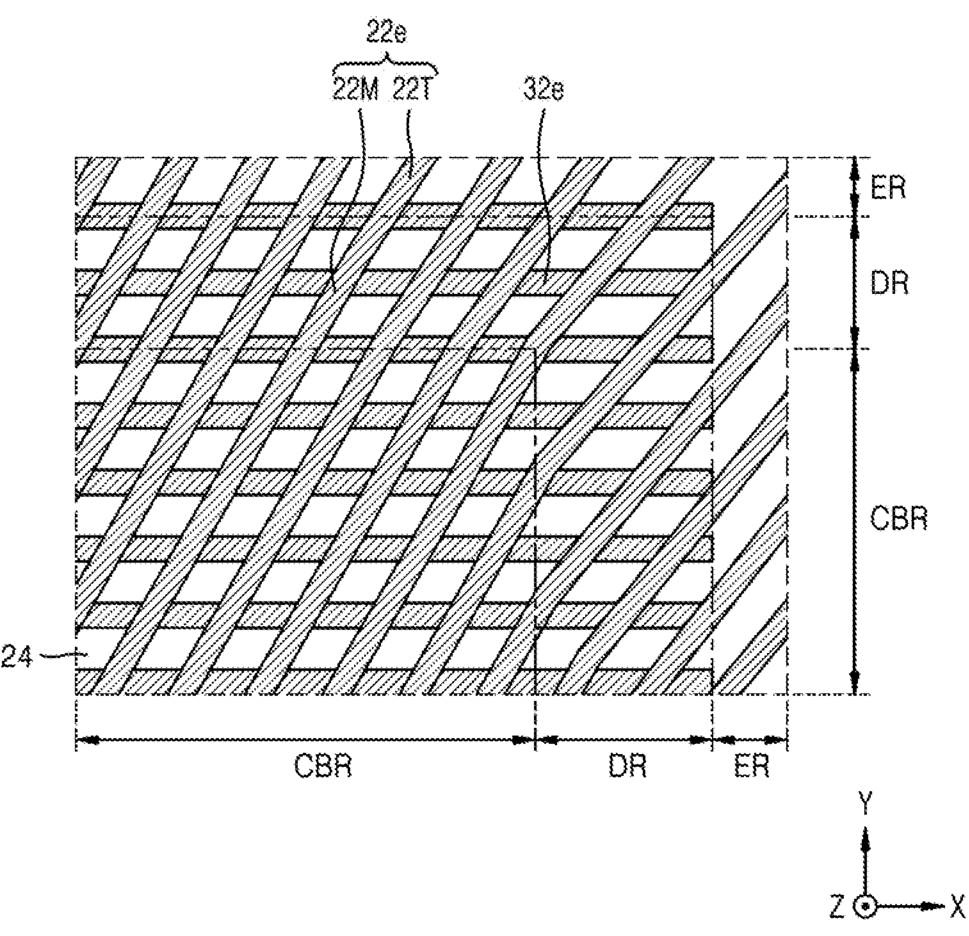
FIGS. 21A and 21B are plan views of a method of manufacturing an EUV mask and a method of forming a pattern by using the EUV mask, according to example embodiments.
Figure 21B:
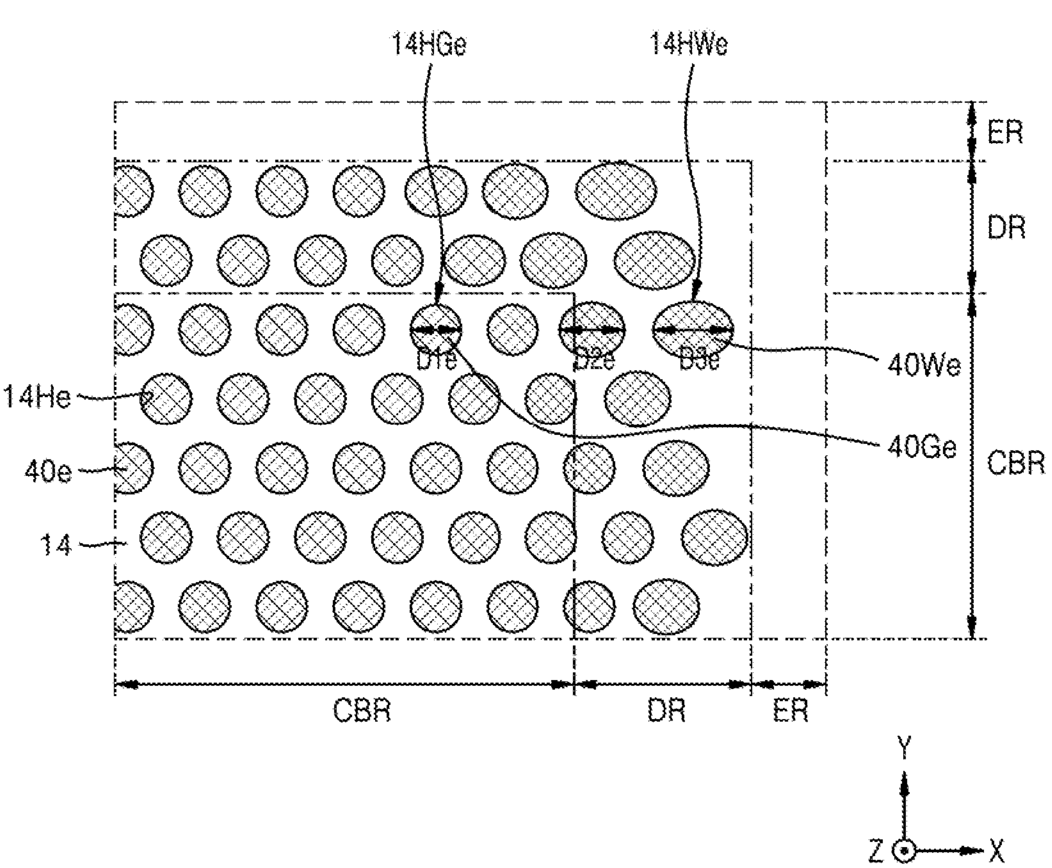

FIGS. 21A and 21B are plan views of a method of manufacturing an EUV mask and a method of forming a pattern by using the EUV mask, according to example embodiments. FIGS. 21A to 22B are plan views of a method of forming a plurality of target patterns by using a modified layout obtained by modifying the preliminary layout by reflecting the evaluation results of the plurality of target patterns 40*c* described through FIGS. 17A to 18B, and components having the same member names or reference numerals as those in FIGS. 1A to 18B may be the same or similar elements, and thus, redundant descriptions may be omitted.

Referring to FIG. 21A, a plurality of first spacer patterns 22*e* and a plurality of second spacer patterns 32*e* extending while crossing the plurality of first spacer patterns 22*e* may be formed. The plurality of first spacer patterns 22*e* may be formed by using a modified first layout. The plurality of first spacer patterns 22*e* may be spaced apart from each other and may extend in a diagonal direction with respect to the first horizontal direction (X direction) and the second horizontal direction (Y direction). The plurality of second spacer patterns 32*e* may be formed by using a modified second layout. The plurality of second spacer patterns 32*e* may extend parallel to each other in the first horizontal direction (X direction).

A portion and another portion of each of the plurality of first spacer patterns 22*e* may extend in different directions. Each of the plurality of first spacer patterns 22*e* may include the first main spacer pattern 22M and the plurality of the first inclined spacer pattern 22T having a different extension direction from that of the first main spacer pattern 22M. With respect to the second horizontal direction (Y direction), the first inclined spacer pattern 22T may extend with a greater angle of inclination than that of the first main spacer pattern 22M. The plurality of first inclined spacer patterns 22T may be inclined more with respect to the second horizontal direction (Y direction) in a direction closer to the corner of the cell block region CBR, and may be inclined less with respect to the second horizontal direction (Y direction) in a direction away from the corner of the cell block region CBR.

Referring to FIGS. 21A and 21B, a plurality of holes 14He may be formed by etching the molding layer 14 by using the plurality of first spacer patterns 22*e* and the plurality of second spacer patterns 32*e* as an etching mask, and then a plurality of target patterns 40*e* filling the plurality of holes 14He may be formed. The plurality of holes 14He may include a plurality of normal holes 14HGe and a plurality of wide holes 14HWe. The plurality of target patterns 40*e* may include a plurality of normal target patterns 40Ge and a plurality of wide target patterns 40We. Some of the wide holes 14HWe and wide target patterns 40We, which may be relatively close to the plurality of normal holes 14HGe and the plurality of normal target patterns 40Ge, may each have a relatively small diameter, and some other wide holes 14HWe and wide target patterns 40We, which may be relatively far from the plurality of normal holes 14HGe and the plurality of normal target patterns 40Ge, may each have a relatively large diameter.

Each of the plurality of normal holes 14HGe and the plurality of normal target patterns 40Ge may have a first diameter D1*e*, and each of the plurality of wide holes 14HWe and the plurality of wide target patterns 40We may have a diameter greater than the first diameter D1*e*. Diameters of each other the plurality of wide holes 14HWe and the plurality of wide target patterns 40We may increase in a direction away from the plurality of normal holes 14HGe and the plurality of normal target patterns 40Ge. In an implementation, some of the wide holes 14HWe and wide target patterns 40We, which may be relatively close to the plurality of normal holes 14HGe and the plurality of normal target patterns 40Ge, may each have a second diameter D2*e* greater than the first diameter D1*e*, and some other wide holes 14HWe and wide target patterns 40We, which may be relatively far from the plurality of normal holes 14HGe and the plurality of normal target patterns 40Ge, may each have a third diameter D3*e* greater than the second diameter D2*e*.

Figure 22:
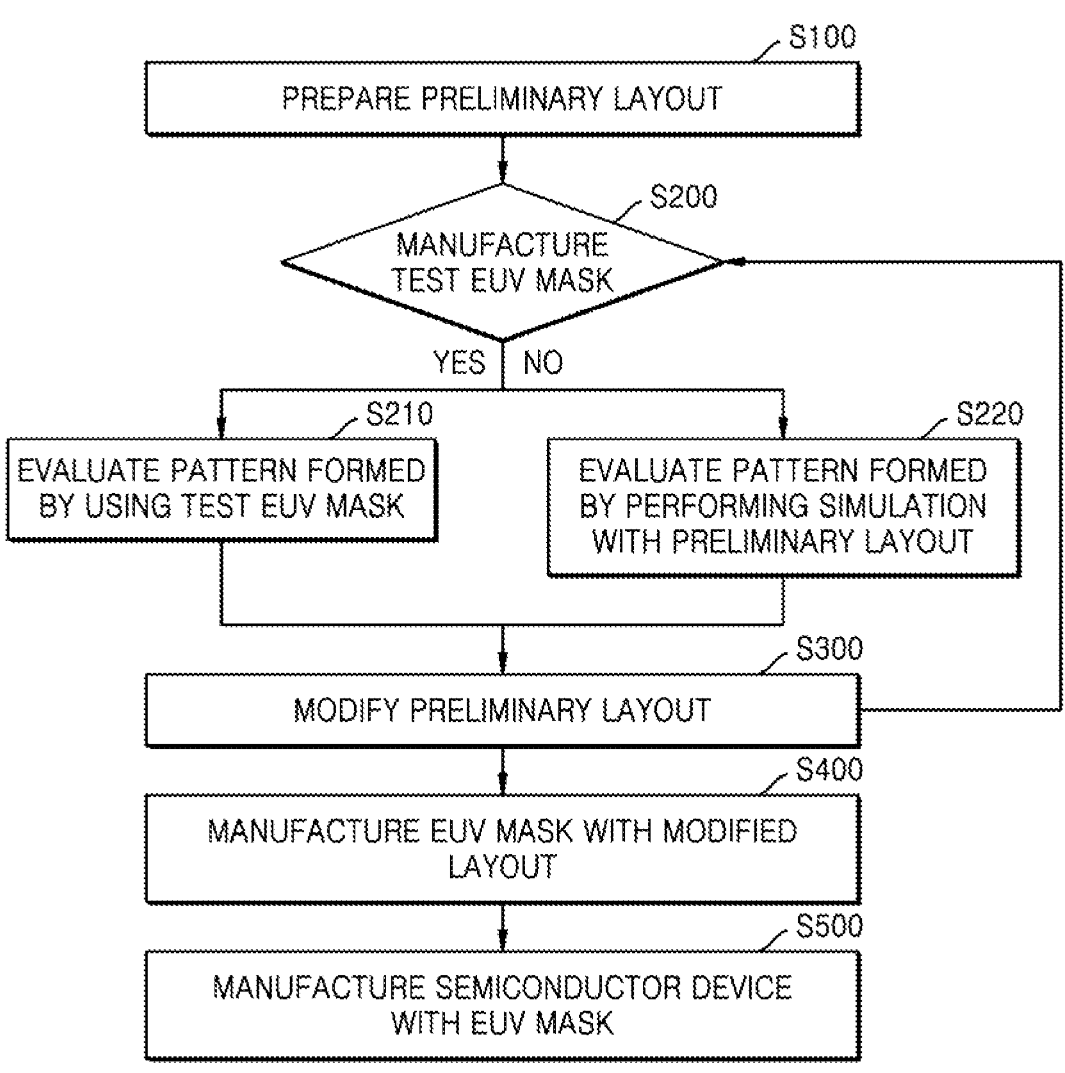
FIG. 22 is a flowchart of a method of manufacturing an EUV mask and a method of manufacturing a semiconductor memory device by using the EUV mask, according to example embodiments.

FIG. 22 is a flowchart of a method of manufacturing an EUV mask and a method of manufacturing a semiconductor memory device by using the EUV mask, according to example embodiments.

Referring to FIG. 22 together with FIGS. 1A to 21B, a preliminary layout is prepared (S100). The preliminary layout may be formed as a pair including a first preliminary layout and a second preliminary layout. The pair of preliminary layouts including the first preliminary layout and the second preliminary layout may be mask layouts for forming a pair of test EUV masks including a first test EUV mask and a second test EUV mask.

It may be determined whether to manufacture a test EUV mask by using the preliminary layout (S200). When a test EUV mask is manufactured by using the preliminary layout (YES), a pattern may be formed by using the test EUV mask, and the formed pattern may be evaluated (S210). When a test EUV mask is not manufactured by using the preliminary layout (NO), a pattern may be formed by performing simulation with the preliminary layout, and then the formed pattern may be evaluated (S220). In some embodiments, formed patterns to be evaluated may be the plurality of target patterns 40 or 40*c*.

The formed pattern may be evaluated for the presence or absence of abnormal patterns, e.g., the plurality of narrow target patterns 40N or 40Nc and the plurality of low target patterns 40S or 40Sc, and when the abnormal patterns are included, the preliminary layout may be modified to form a modified layout (S300).

An EUV mask may be formed by using the modified layout (S400). The modified layout may be formed as a pair including a first layout and a second layout. The pair of modified layouts including the first layout and the second layout may be mask layouts for forming a pair of EUV masks including a first EUV mask and a second EUV mask. In some embodiments, after an optical proximity correction (OPC) method is performed on the modified layout, an EUV mask may be formed.

A pattern may be formed with the EUV mask to manufacture a semiconductor device or a semiconductor memory device including the formed pattern (S500). Patterns formed with the EUV mask, which may be included in a semiconductor device or a semiconductor memory device, may be a plurality of target patterns 40*a*, 40*b*, 40*d*, or 40*e*.

According to embodiments, in a method of manufacturing an EUV mask and a method of forming a pattern of a semiconductor device or a semiconductor memory device by using the EUV mask, the target patterns 40*a*, 40*b*, 40*d*, and 40*e* in the cell block region CBR around the corner or the corner and edge of the cell block region CBR may be formed to have the same diameters as the target patterns 40*a*, 40*b*, 40*d*, and 40*e* inside the cell block region CBR, and thus yields of the semiconductor devices or semiconductor memory devices may be increased, and electrical reliability may be secured.

Figure 23:
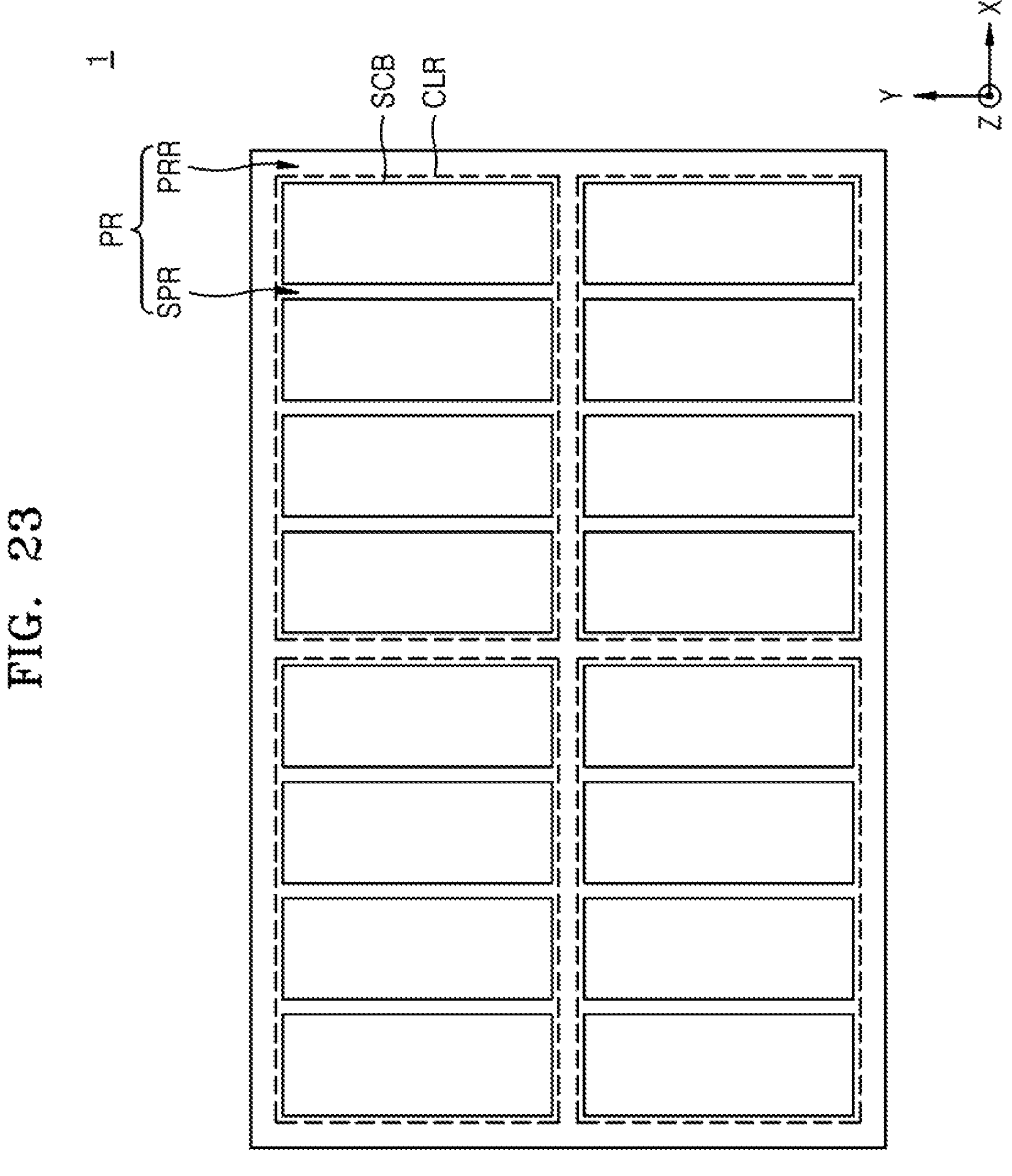
FIG. 23 is a block diagram of a semiconductor memory device according to example embodiments.

FIG. 23 is a block diagram of a semiconductor memory device according to example embodiments. Referring to FIG. 23, a semiconductor memory device 1 may include a cell region CLR in which memory cells may be arranged, and a main peripheral region PRR surrounding the cell region CLR.

According to an embodiment, sub-peripheral regions SPR that distinguish cell blocks SCB from each other may be included in the cell region CLR. A plurality of memory cells may be in the cell blocks SCB. Each of the cell blocks SCB may configure the cell block region CBR shown in FIGS. 1A to 21B. The dummy region DR and the edge region ER shown in FIGS. 1A to 21B may be between the cell blocks SCB and the sub-peripheral regions SPR.

Logic cells may be in the main peripheral region PRR and the sub-peripheral region SPR for transmitting and receiving electrical signals to and from the memory cells. In some embodiments, the main peripheral region PRR may be referred to as a peripheral circuit region, and the sub-peripheral region SPR may be referred to as a core circuit region. A peripheral region PR may include the main peripheral region PRR and the sub-peripheral regions SPR. In an implementation, the peripheral region PR may be a core and peripheral circuit region including the peripheral circuit region and the core circuit region. In some embodiments, at least a portion of the sub-peripheral region SPR may be provided only as a space for distinguishing the cell blocks SCB from each other.

Figure 24:
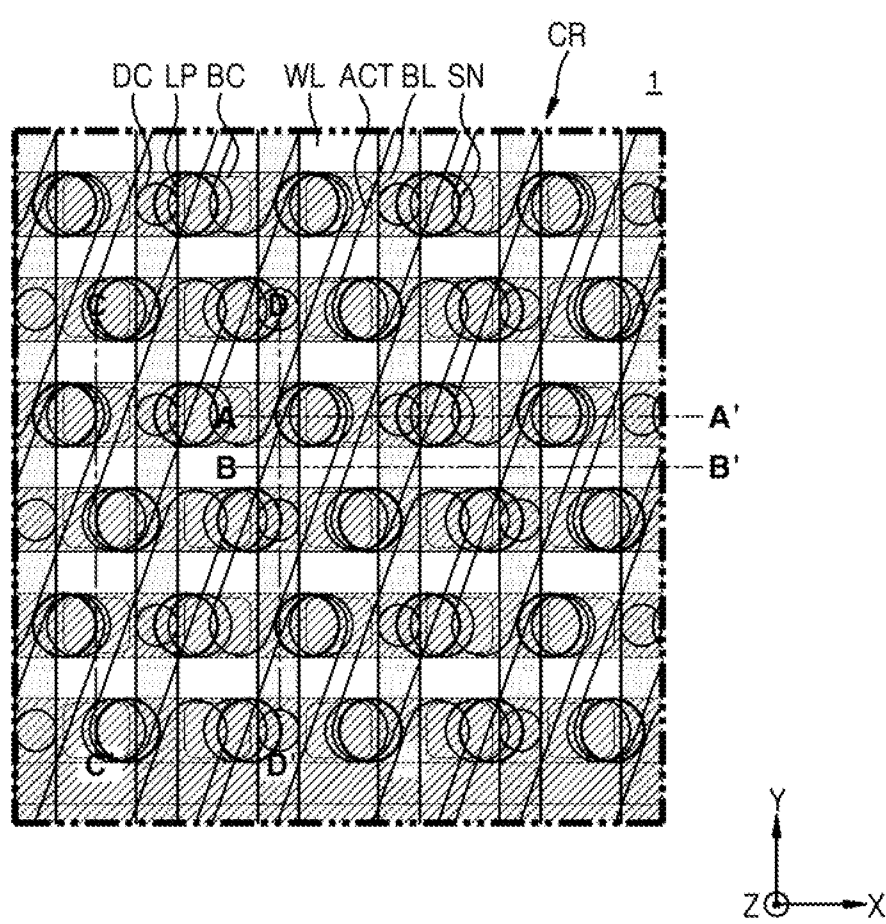
FIG. 24 is a schematic plan layout of components of a semiconductor memory device according to example embodiments.
Figure 25A:
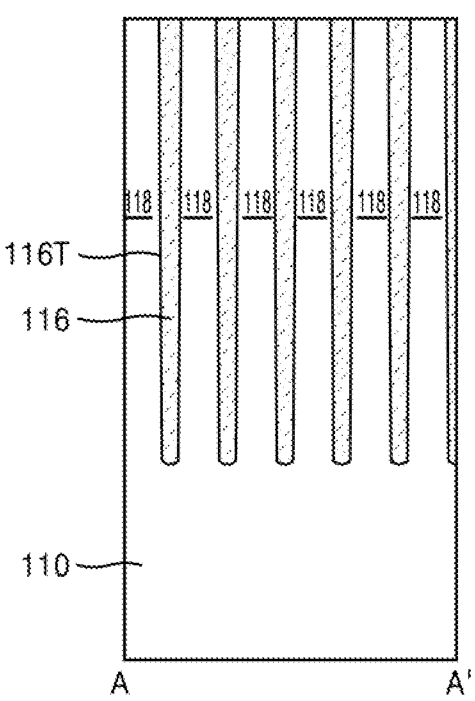
FIGS. 25A to 25D, 26A to 26D, 27A to 27D, 28A to 28D, 29A to 29D, and 30A to 30D are cross-sectional views of operations of a method of manufacturing a semiconductor memory device according to embodiments.
Figure 25A:
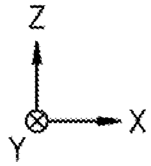
Figure 25B:
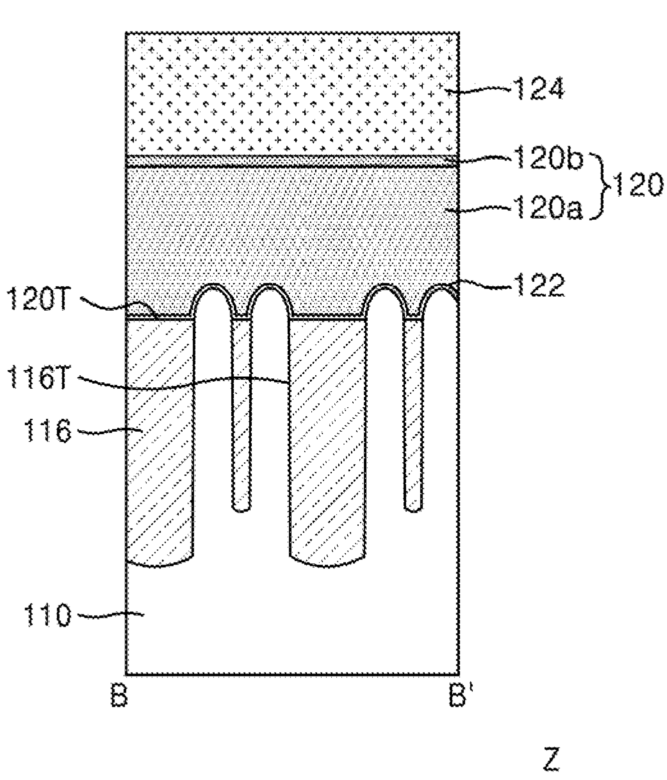
Figure 25C:
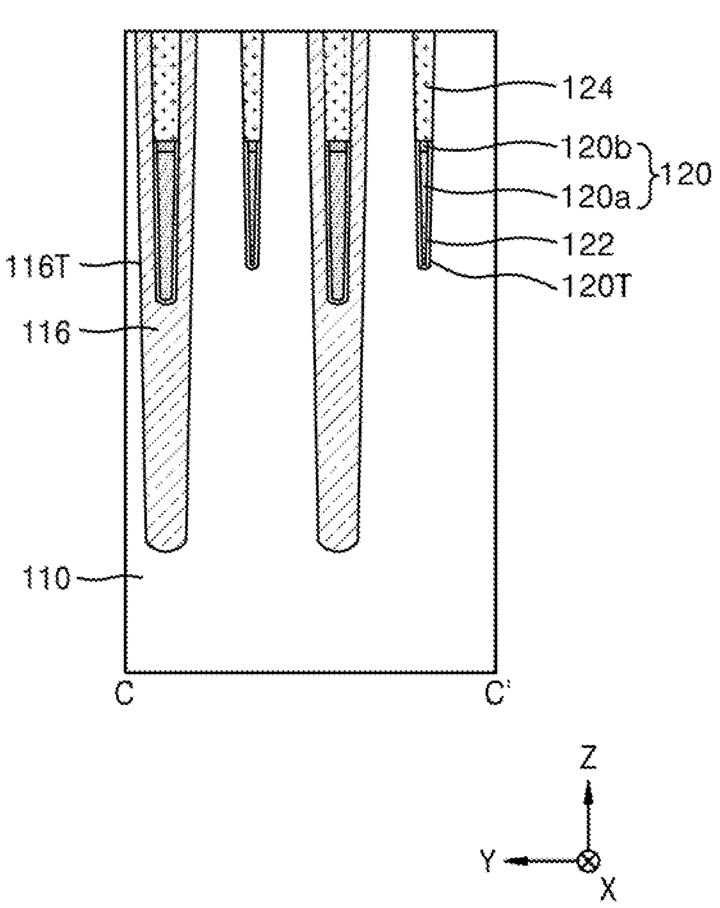
Figure 25D:
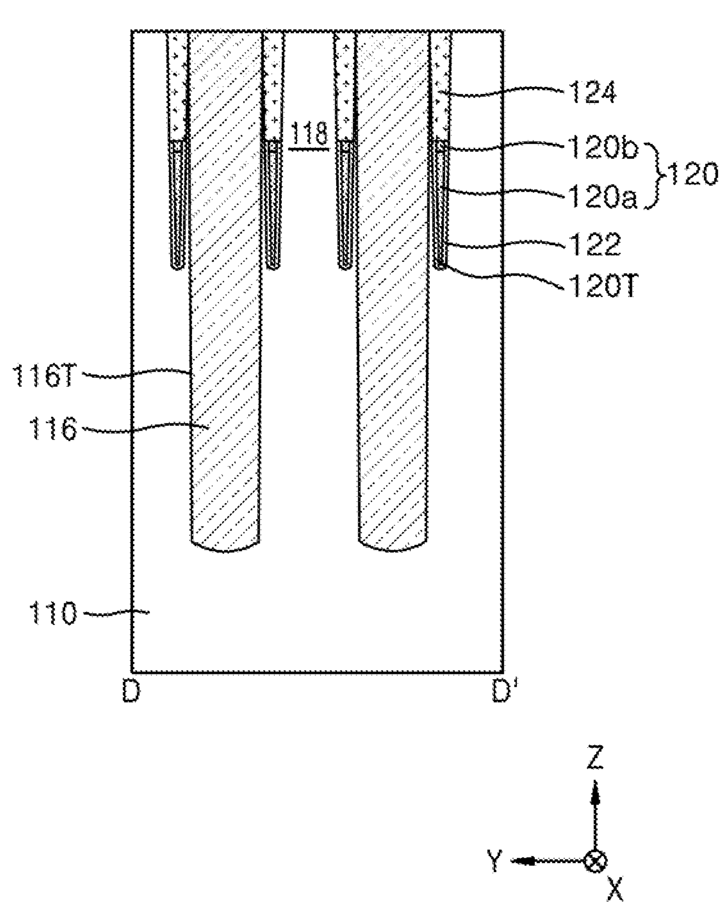
Figure 26A:
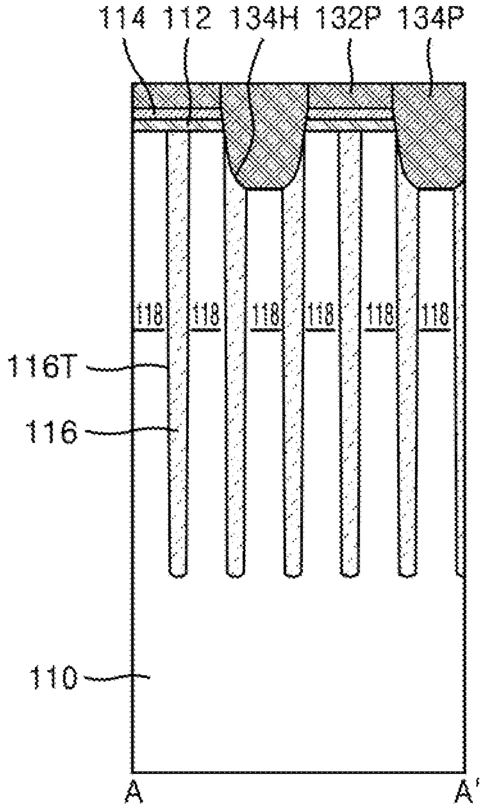
Figure 26A:
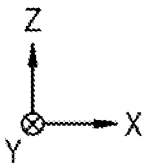
Figure 26B:
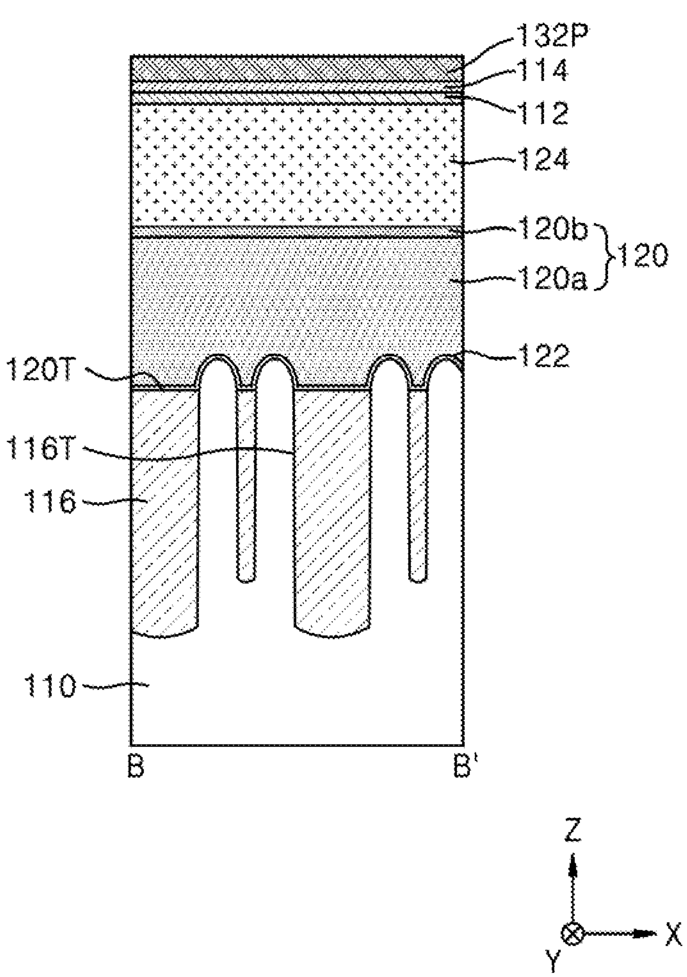
Figure 26C:
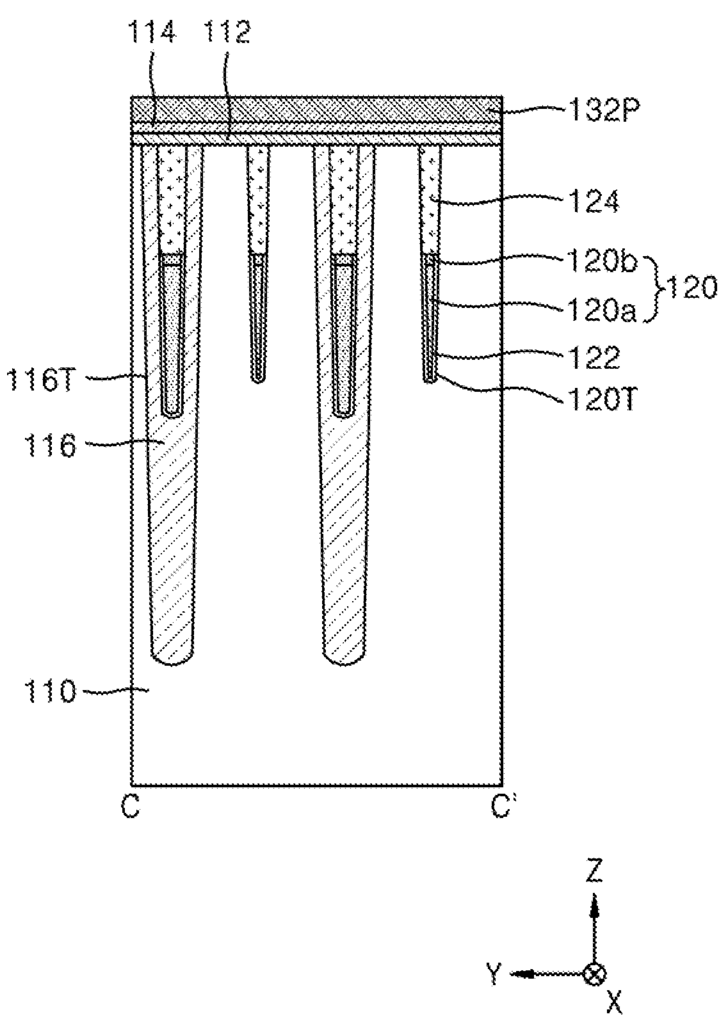
Figure 26D:
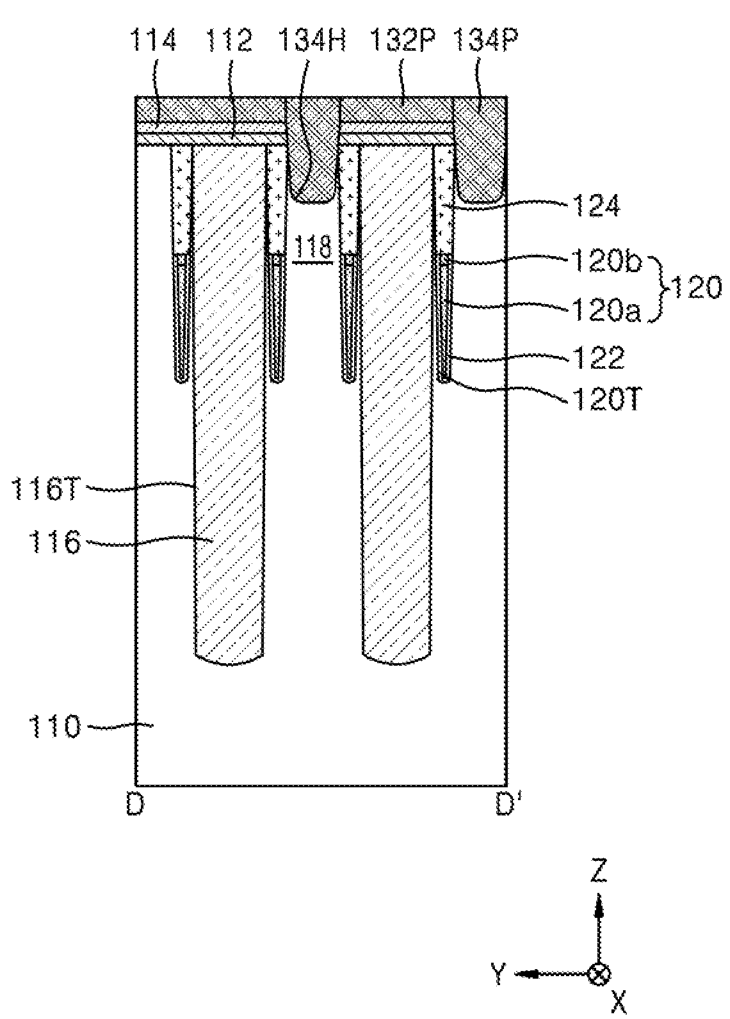
Figure 27A:
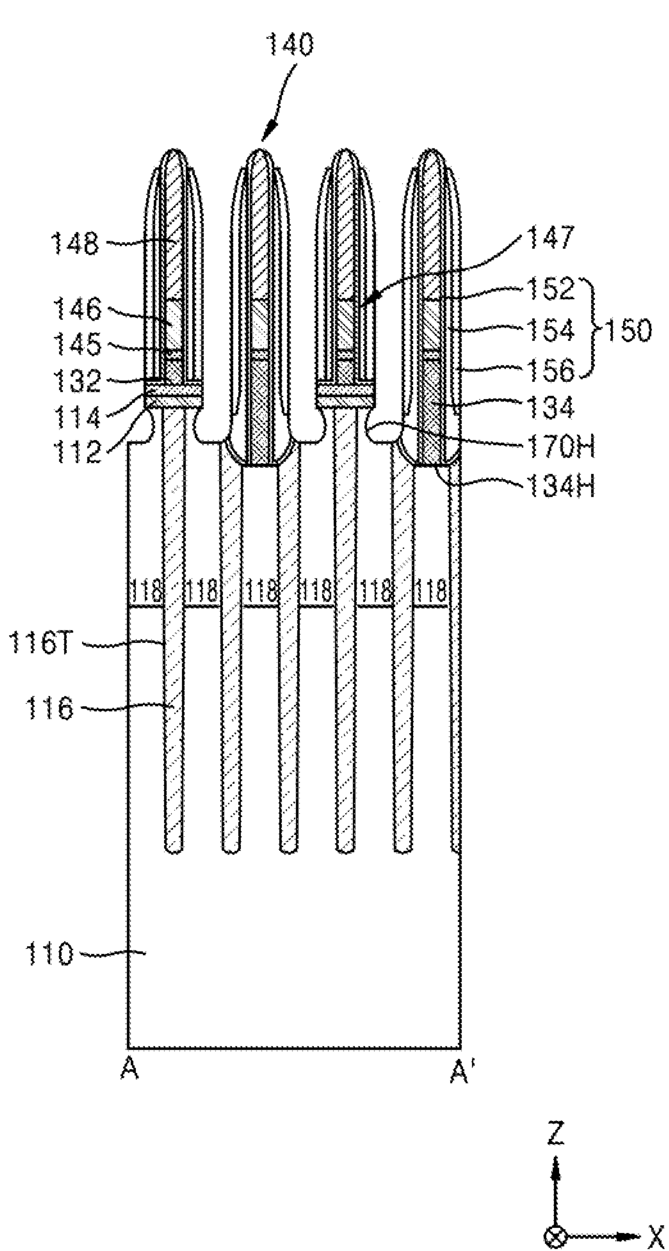
Figure 27B:
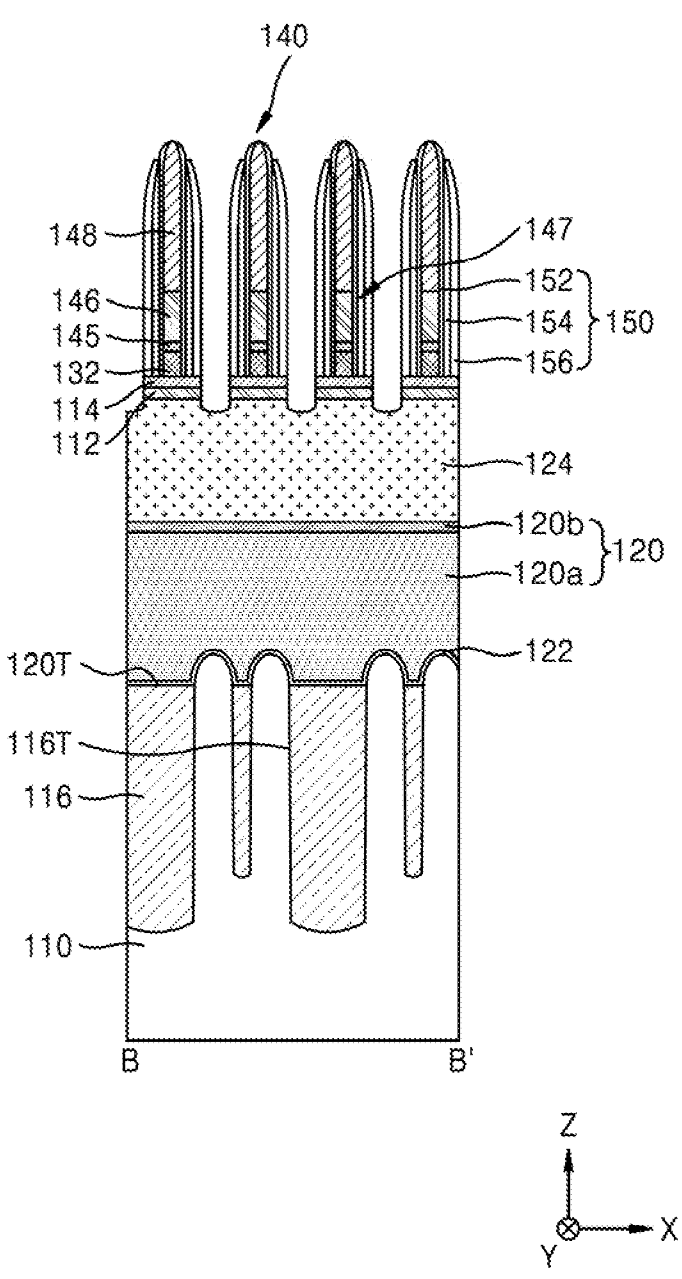
Figure 27C:
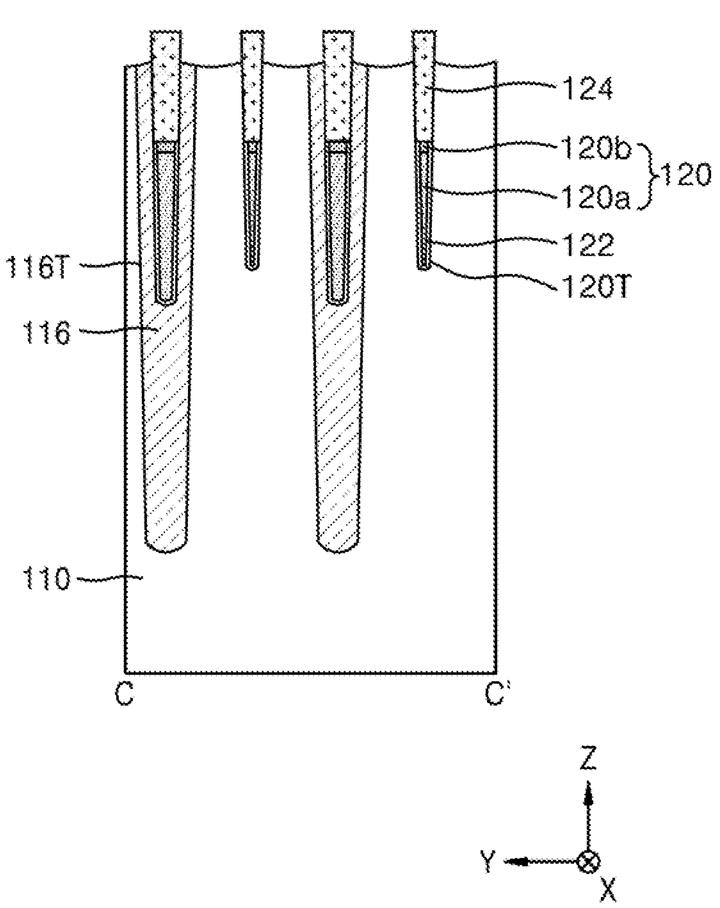
Figure 27D:
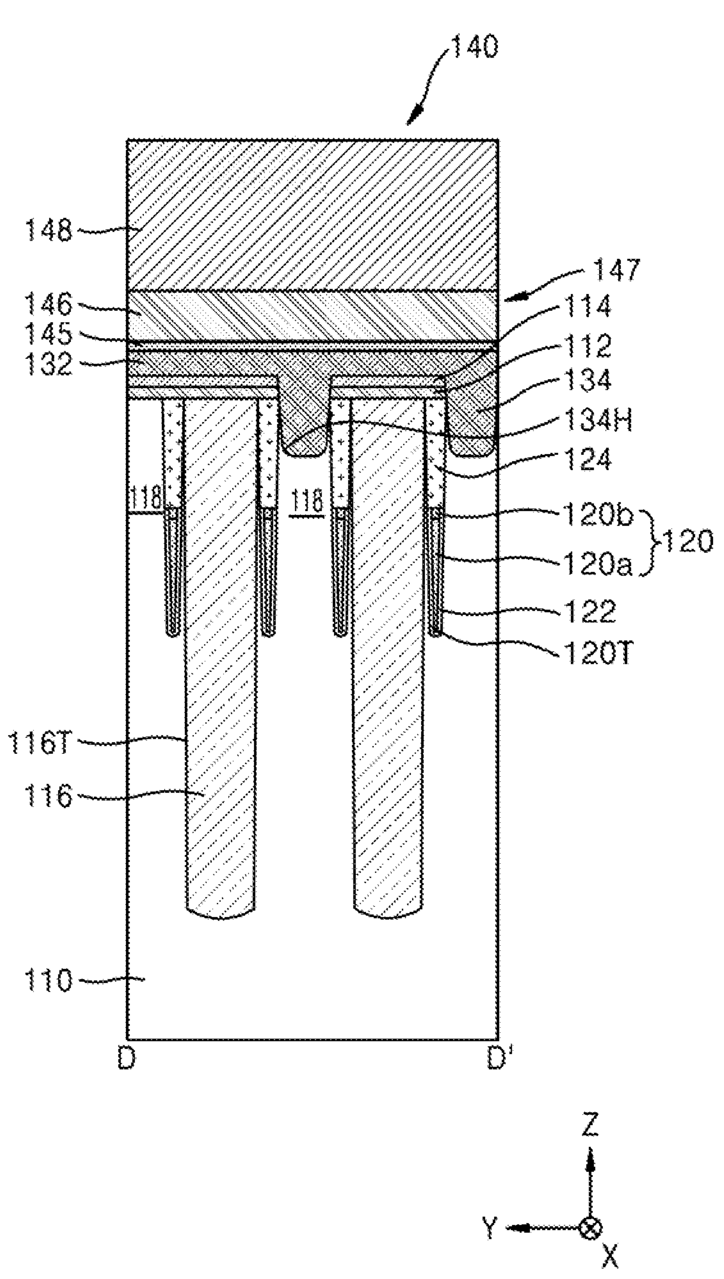
Figure 28A:
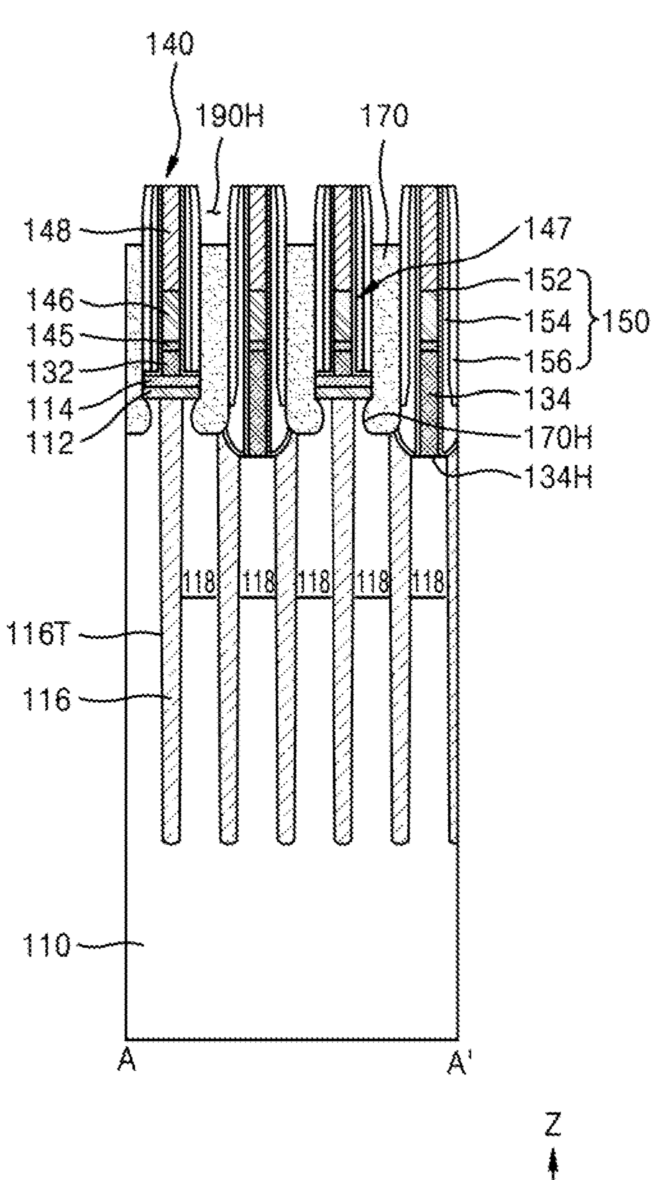
Figure 28B:
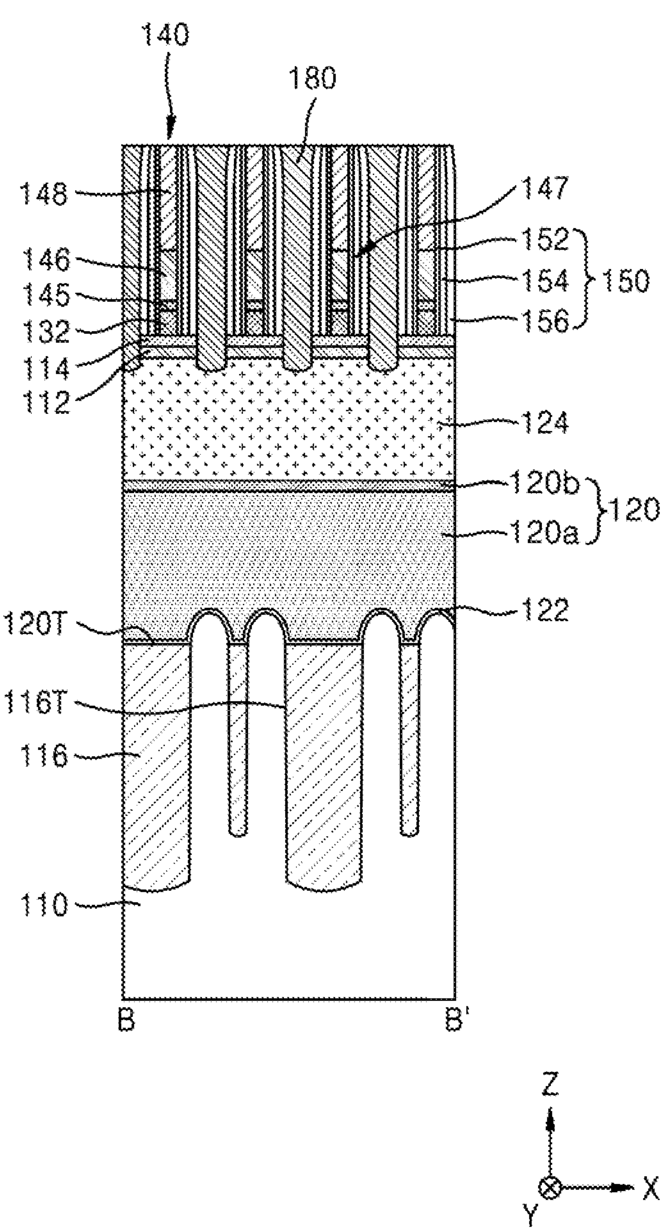
Figure 28C:
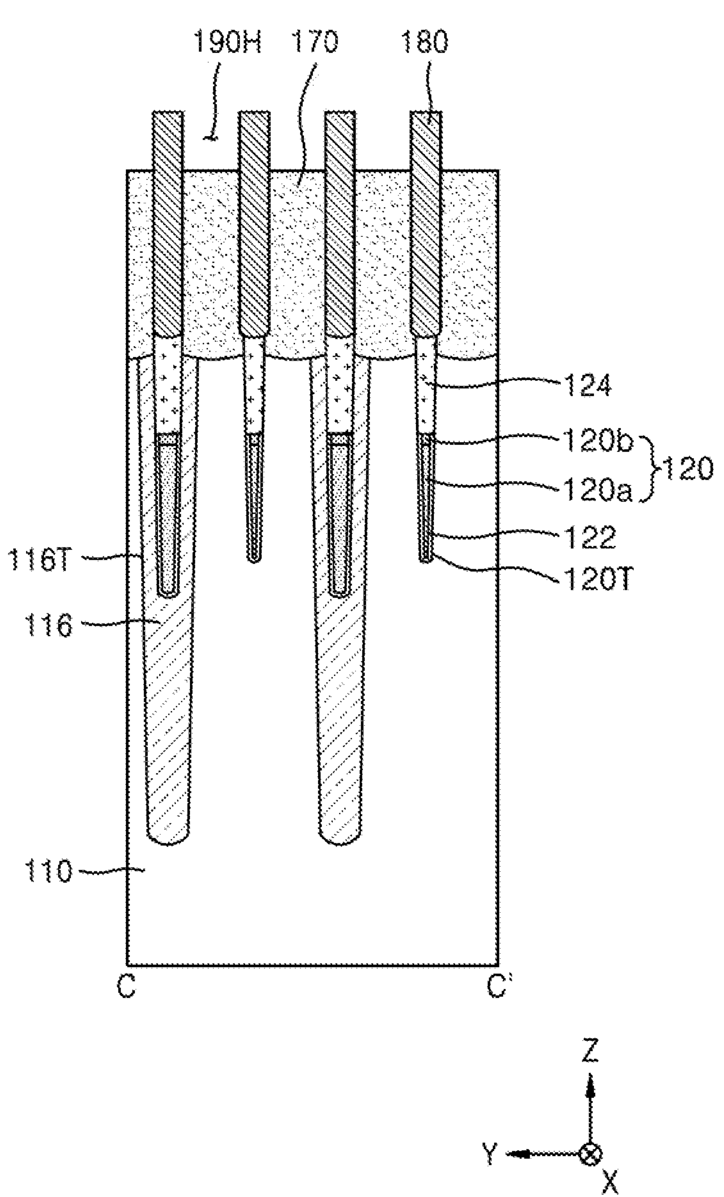
Figure 28D:
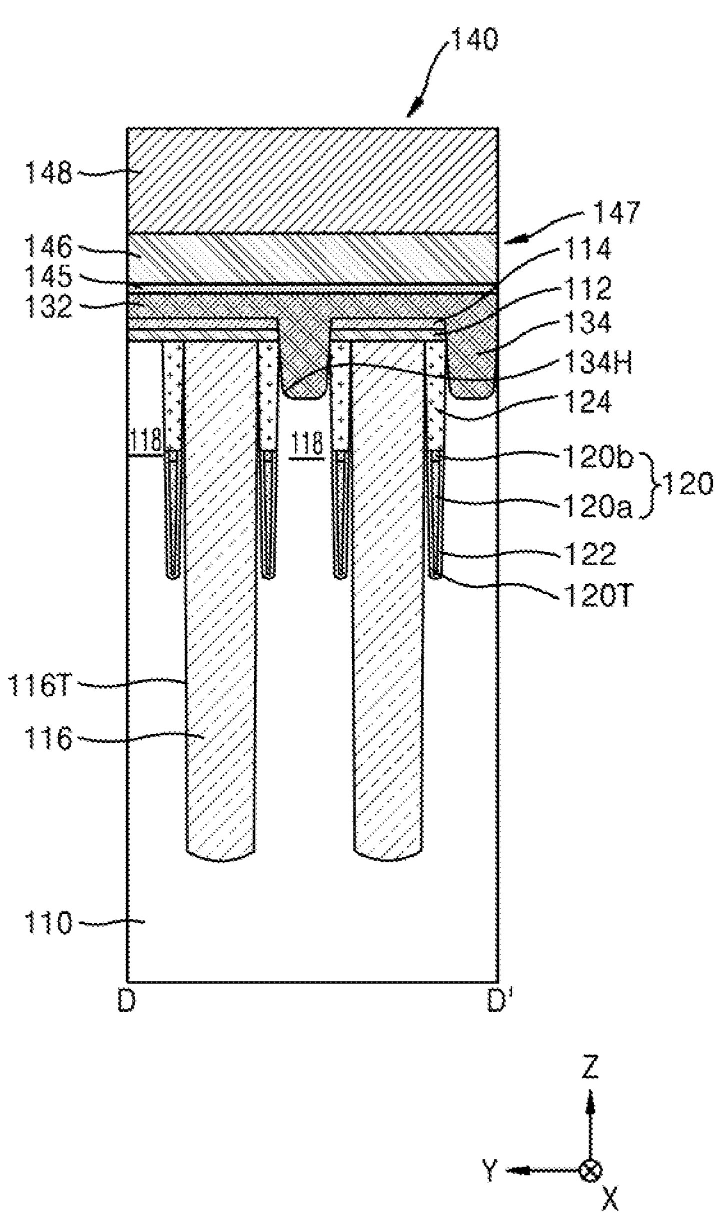
Figure 29A:
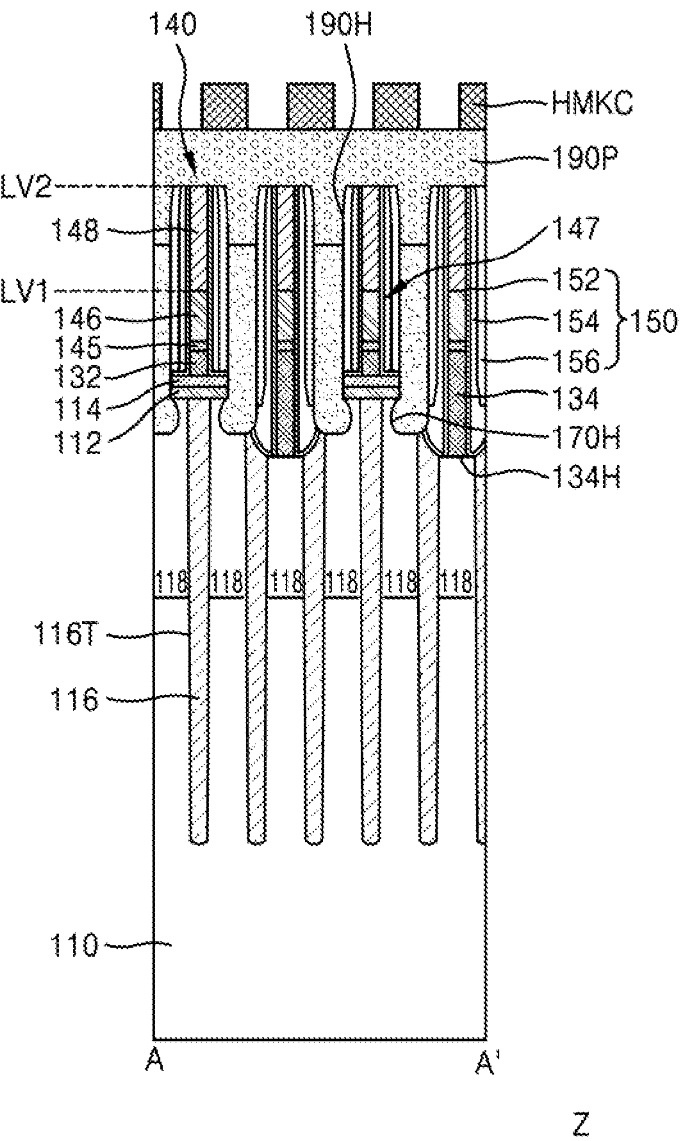
Figure 29B:
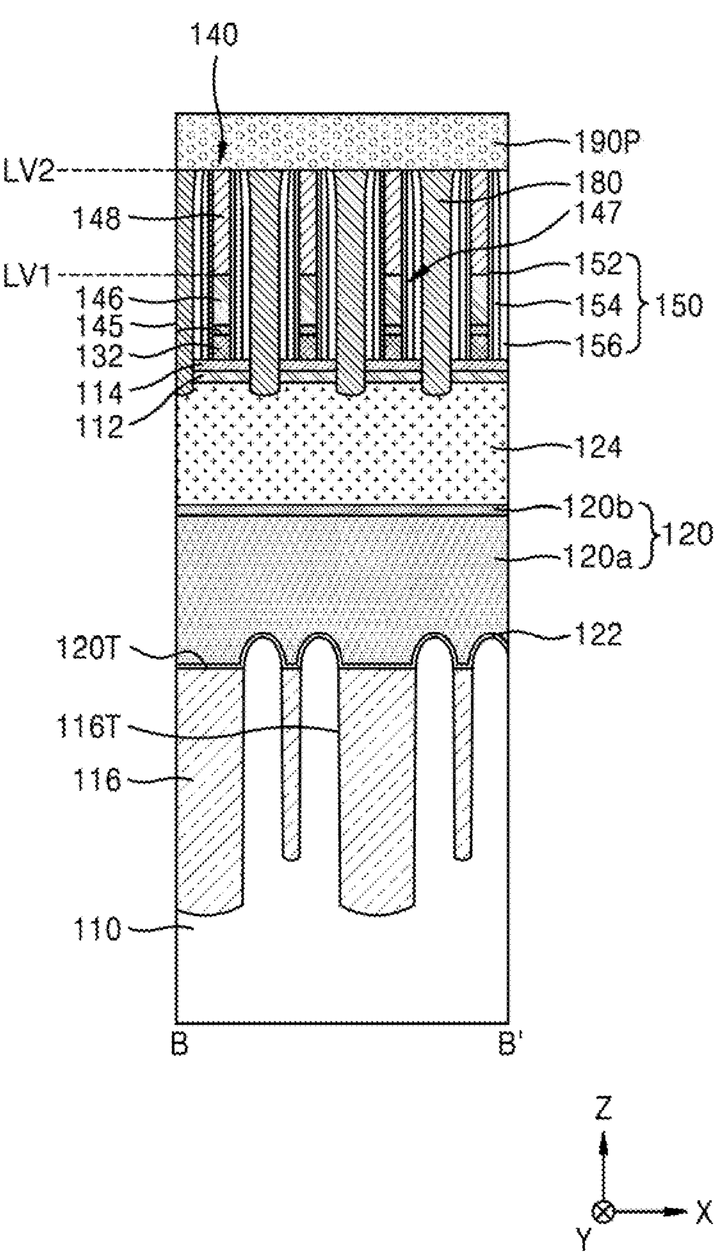
Figure 29C:
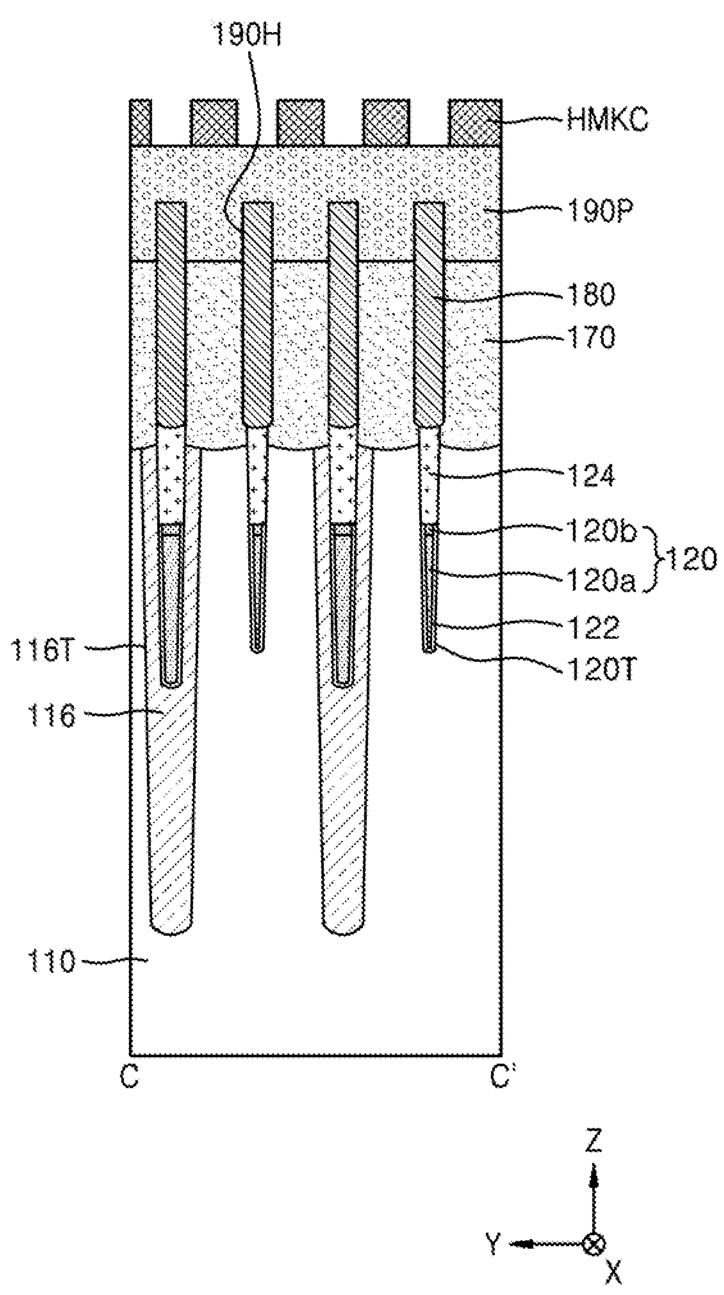
Figure 29D:
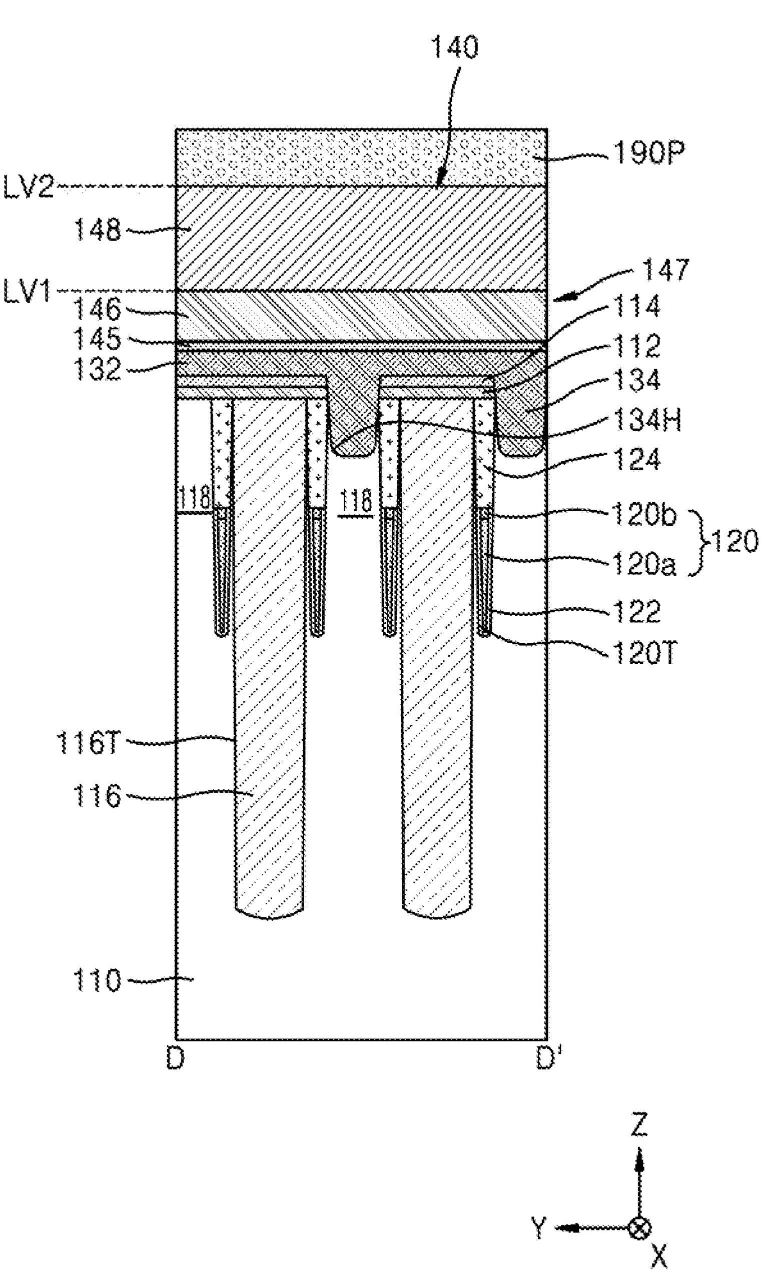
Figure 30A:
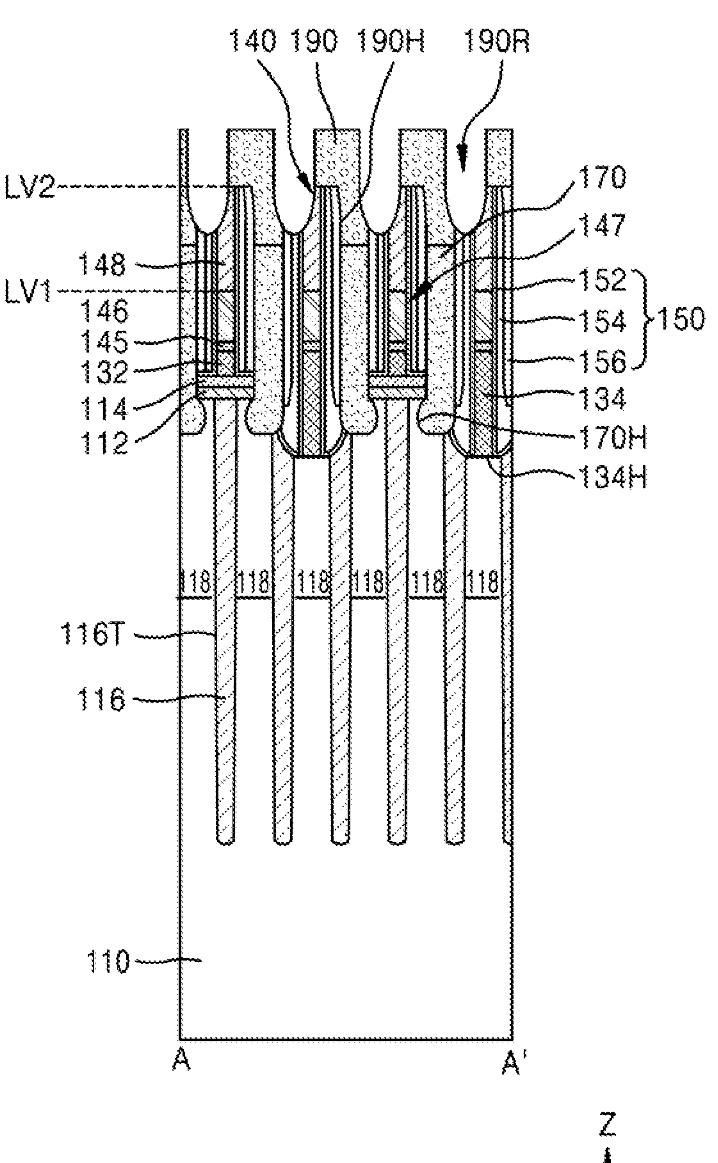
Figure 30B:
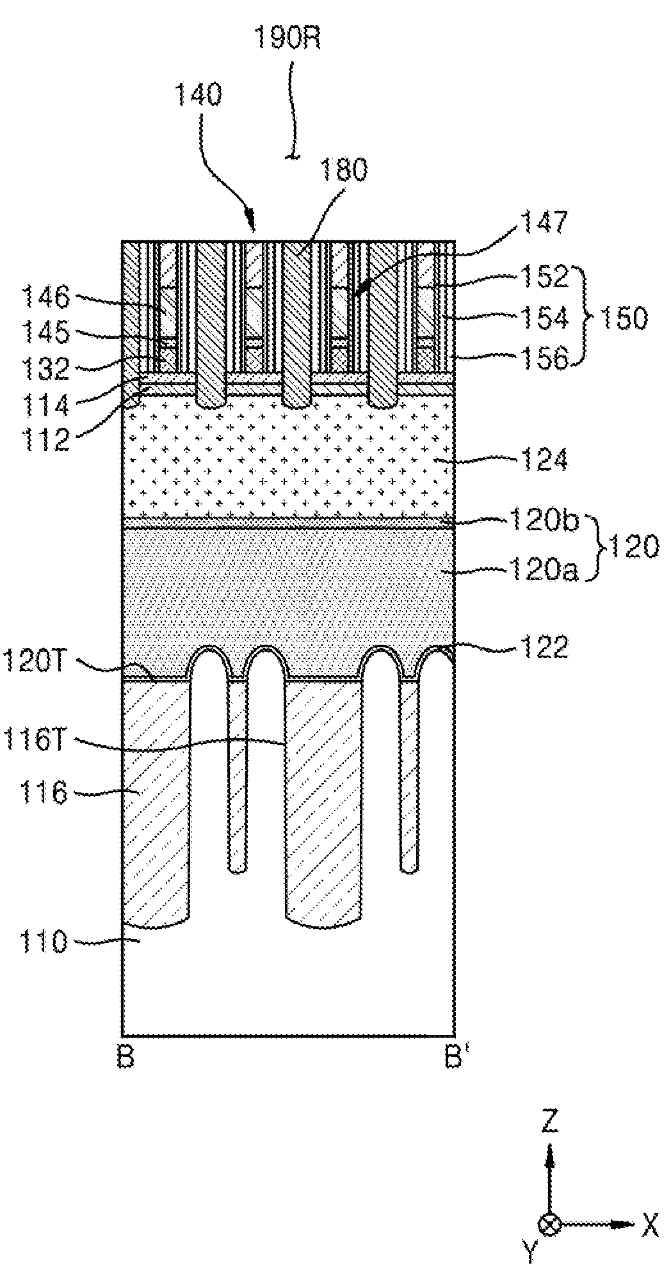
Figure 30C:
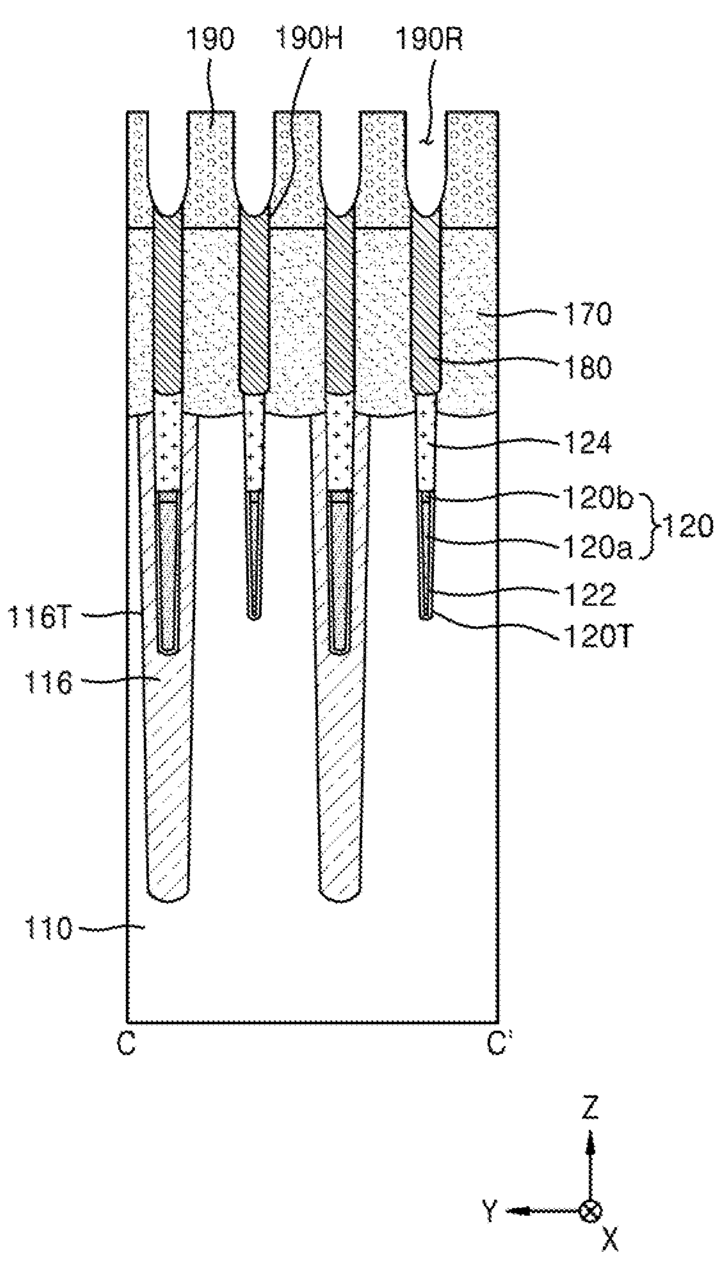
Figure 30D:
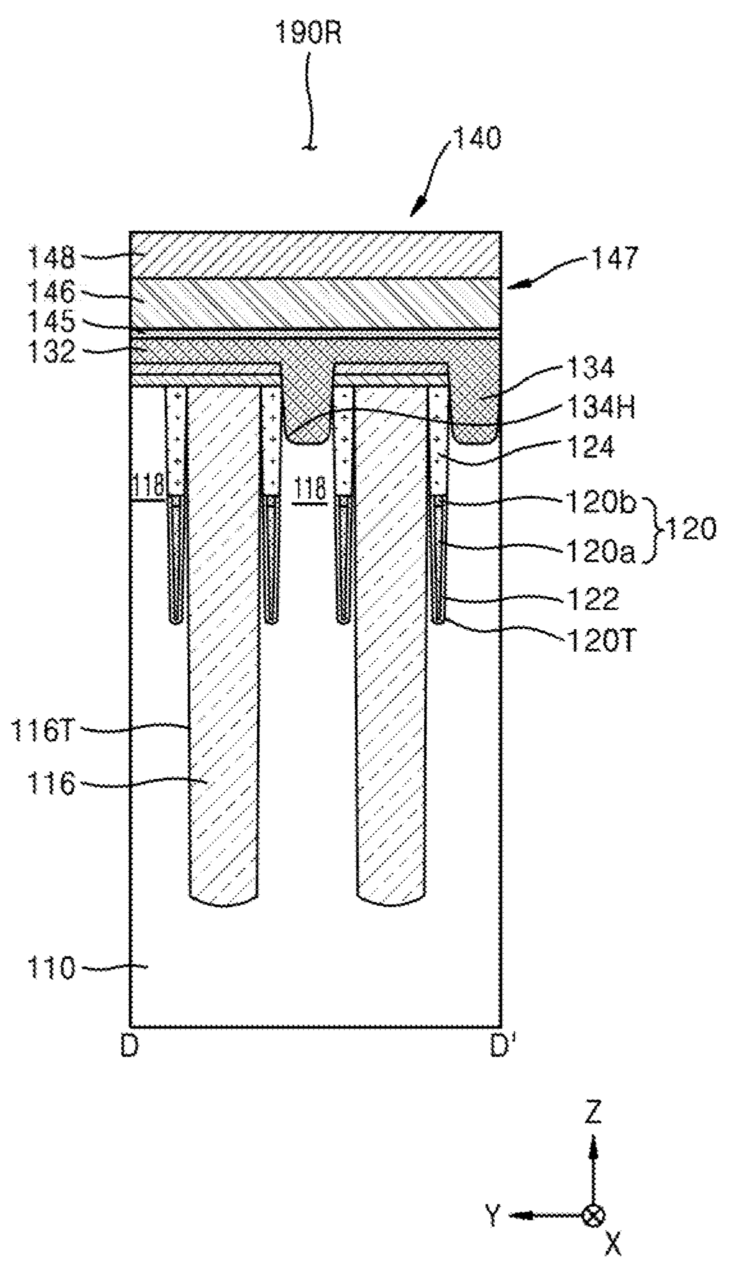

FIG. 24 is a schematic plan layout of components of a semiconductor memory device according to example embodiments. Referring to FIG. 24, the semiconductor memory device 1 includes a memory cell region CR. The semiconductor memory device 1 may include a plurality of active regions ACT in the memory cell region CR. The memory cell region CR may be a cell block SCB in which a plurality of memory cells may be as shown in FIG. 24 or the cell block region CBR shown in FIGS. 1A to 21B. The dummy region DR shown in FIGS. 1A to 21B may surround the cell block region CBR.

In some embodiments, the plurality of active regions ACT in the memory cell region CR may have a long axis in a diagonal direction with respect to the first horizontal direction (X direction) and the second horizontal direction (Y direction). A plurality of word lines WL may extend parallel to each other in the first horizontal direction (X direction) across the plurality of active regions ACT in the memory cell region CR. A plurality of bit lines BL may extend parallel to each other in the second horizontal direction (Y direction) crossing the first horizontal direction (X direction) on the plurality of word lines WL. The plurality of bit lines BL may be respectively connected to the plurality of active regions ACT through direct contacts DC.

In some embodiments, a plurality of buried contacts BC may be between two adjacent bit lines BL of the plurality of bit lines BL. In some embodiments, the plurality of buried contacts BC may be in a line in each of the first horizontal direction (X direction) and the second horizontal direction (Y direction). A plurality of landing pads LP may be on the plurality of buried contacts BC. The plurality of landing pads LP may at least partially overlap the plurality of buried contacts BC. In some embodiments, the plurality of landing pads LP may extend to an upper portion of any one of the two bit lines BL adjacent to each other.

A plurality of storage nodes SN may be on the plurality of landing pads LP. The plurality of storage nodes SN may be on the upper portion of the plurality of bit lines BL. The plurality of storage nodes SN may be a lower electrode of a plurality of capacitors, respectively. Each of the plurality of storage nodes SN may be connected to the active region ACT through the landing pad LP and the buried contact BC.

FIGS. 25A to 25D, 26A to 26D, 27A to 27D, 28A to 28D, 29A to 29D, and 30A to 30D are cross-sectional views of operations of a method of manufacturing a semiconductor memory device according to example embodiments, and FIGS. 31A to 31D are cross-sectional views of a semiconductor memory device according to example embodiments. In particular, FIGS. 25A, 26A, 27A, 28A, 29A, 30A, and 31A are cross-sectional views taken along a line A-A' of FIG. 24, FIGS. 25B, 26B, 27B, 28B, 29B, 30B, and 31B are cross-sectional views taken along a line B-B' of FIG. 24, FIGS. 25C, 26C, 27C, 28C, 29C, 30C, and 31C are cross-sectional views taken along a line C-C' of FIG. 24, and FIGS. 25D, 260, 27D, 28D, 290, 30D, and 31D are cross-sectional views taken along a line D-D' of FIG. 24.

Referring to FIGS. 25A to 25D, a device isolation trench 116T may be formed in a substrate 110, and a device isolation layer 116 filling the device isolation trench 116T may be formed. The device isolation layer 116 may include, e.g., a material including silicon oxide, silicon nitride, or silicon oxynitride.

A plurality of active regions 118 may be defined on the substrate 110 in the memory cell region CR (refer to FIG. 24) by the device isolation layer 116. Like the active region ACT illustrated in FIG. 24, each of the plurality of active regions 118 may have a relatively long island shape having a short axis and a long axis in a plan view.

A plurality of word line trenches 120T may be formed in the substrate 110. The plurality of word line trenches 120T may extend in the first horizontal direction (X direction) parallel to each other, each of the plurality of word line trenches 120T may have a line shape that crosses the active region 118 and may be at substantially equal intervals in the second horizontal direction (Y direction). In some embodiments, step differences may be on bottom surfaces of the plurality of word line trenches 120T.

After cleaning a resultant product in which the plurality of word line trenches 1201 may be formed, a plurality of gate dielectric layers 122, a plurality of word lines 120, and a plurality of buried insulating layers 124 may be formed in sequence in the plurality of word line trenches 120T. The plurality of word lines 120 may configure the plurality of word lines WL illustrated in FIG. 24. The plurality of word lines 120 may extend in the first horizontal direction (X direction) parallel to each other, each of the plurality of word lines 120 may have a line shape that crosses the active region 118 and may be at substantially equal intervals in the second horizontal direction (Y direction). An upper surface of each of the plurality of word lines 120 may be located at a lower level than an upper surface of the substrate 110. Bottom surfaces of the plurality of word lines 120 may have a concavo-convex shape, and a transistor of a saddle fin structure (i.e., a saddle FinFET) may be formed in the plurality of active regions 118.

As used herein, terms of a level or a vertical level refer to a height in a vertical direction (Z direction) with respect to a main surface or an upper surface of the substrate 110. In other words, positioning at the same level may mean that the height in the vertical direction (Z direction) with respect to the main surface or the upper surface of the substrate 110 may be the same between comparison objects, positioning at a constant level may mean that the height in the vertical direction (Z direction) with respect to the main surface or the upper surface of the substrate 110 may be at the constant position, and positioning at a low/high level may mean that the height in the vertical direction (Z direction) with respect to the main surface or the upper surface of the substrate 110 may be at a low/high position.

Each of the plurality of word lines 120 may include a stacked structure of a lower word line layer 120*a* and an upper word line layer 120*b*. In an implementation, the lower word line layer 120*a* may include a metal material, or a conductive metal nitride. In an implementation, the upper word line layer 120*b* may include doped polysilicon.

In some embodiments, before forming the plurality of word lines 120 or after forming the plurality of word lines 120, impurity ions may be injected into portions of the active regions 118 of the substrate 110 on both sides of the plurality of word lines 120, and thus source regions and drain regions may be formed in the plurality of active regions 118.

Each of the plurality of gate dielectric layers 122 may include silicon oxide, silicon nitride, silicon oxynitride, oxide/nitride/oxide (ONO), or a high-k dielectric layer having a dielectric constant higher than that of the silicon oxide. In an implementation, the gate dielectric layer 122 may have the dielectric constant of about 10 to about 25.

An upper surface of each of the plurality of buried insulating layers 124 may be located at substantially the same level as the upper surface of the substrate 110. Each of the plurality of buried insulating layers 124 may include at least one material layer including silicon oxide, silicon nitride, or silicon oxynitride.

Referring to FIGS. 26A to 26D, insulating layer patterns 112 and 114 that cover the device isolation layer 116, the plurality of active regions 118, and the plurality of buried insulating layers 124 may be formed. In an implementation, each of the insulating layer patterns 112 and 114 may include silicon oxide, silicon nitride, silicon oxynitride, or metallic dielectrics. In some embodiments, the insulating layer patterns 112 and 114 may be formed by stacking a plurality of insulating layers including a plurality of first insulating layer patterns 112 and a plurality of second insulating layer patterns 114.

Thereafter, a conductive semiconductor layer 132P may be on the insulating layer patterns 112 and 114, then a direct contact hole 134H that exposes the source region in the active region 18 through the conductive semiconductor layer 132P and the insulating layer patterns 112 and 114 may be formed, and a direct contact conductive layer 134P that fills the direct contact hole 134H may be formed. In some embodiments, the direct contact hole 134H may extend into the active region 118, that is, into the source region. The conductive semiconductor layer 132P may include, e.g., doped polysilicon. The direct contact conductive layer 134P may include, e.g., doped polysilicon. In some embodiments, the direct contact conductive layer 134P may include an epitaxial silicon layer.

Referring to FIGS. 27A to 27D, a metallic conductive layer and an insulation capping layer may be sequentially formed to form a bit line structure 140 while covering the conductive semiconductor layer 132P and the direct contact conductive layer 134P. In some embodiments, the metallic conductive layer may include a stacked structure of a first metallic conductive layer and a second metallic conductive layer. The first metallic conductive layer, the second metallic conductive layer, and the insulating capping layer may be etched to form a plurality of bit lines 147 in a line shape that include a stacked structure of a first metallic conductive pattern 145 and a second metallic conductive pattern 146 and a plurality of insulating capping lines 148.

In some embodiments, the first metallic conductive pattern 145 may include titanium nitride (TiN) or TSN (Ti—Si—N), and the second metallic conductive pattern 146 may include tungsten (W) or tungsten silicide (WSix). In some embodiments, the first metallic conductive pattern 145 may perform the function of a diffusion barrier. In some embodiments, each of the plurality of insulating capping lines 148 may include silicon nitride.

One bit line 147 and one insulating capping line 148 covering the one bit line 147 may configure one bit line structure 140. A plurality of bit line structures 140, each including the bit line 147 and the insulating capping line 148, may extend parallel to each other in the second horizontal direction (Y direction) parallel to the main surface of the substrate 110. The plurality of bit lines 147 may configure a plurality of bit lines BL illustrated in FIG. 24. In some embodiments, the bit line structure 140 may further include a conductive semiconductor pattern 132, which may be a portion of the conductive semiconductor layer 132P (refer to FIGS. 26A and 26D) between the insulating layer patterns 112 and 114 and the first metallic conductive pattern 145.

In an etching process of forming the plurality of bit lines 147, by removing a portion of the conductive semiconductor layer 132P (refer to FIGS. 26A to 26D) and a portion of the direct contact conductive layer 134P (refer to FIGS. 26A and 261)), which do not vertically overlap the bit line 147, the plurality of conductive semiconductor patterns 132 and the plurality of direct contact conductive patterns 134 may be formed. At this time, the insulating layer patterns 112 and 114 may perform the function of an etch stop layer in the etching process of forming the plurality of bit lines 147, the plurality of conductive semiconductor patterns 132, and the plurality of direct contact conductive patterns 134. The plurality of direct contact conductive patterns 134 may configure the plurality of direct contacts DC illustrated in FIG. 24. The plurality of bit lines 147 may be respectively and electrically connected to the plurality of active regions 118 through the plurality of direct contact conductive patterns 134.

Both sidewalls of each of the plurality of bit line structures 140 may be covered with an insulating spacer structure 150. A plurality of insulating spacer structures 150 may each include a first insulating spacer 152, a second insulating spacer 154, and a third insulating spacer 156. The second insulating spacer 154 may include a material with a lower dielectric constant than the dielectric constant of the first insulating spacer 152 and the third insulating spacer 156. In some embodiments, each of the first insulating spacer 152 and the third insulating spacer 156 may include a nitride, and the second insulating spacer 154 may include an oxide. In some embodiments, each of the first insulating spacer 152 and the third insulating spacer 156 may include a nitride, and the second insulating spacer 154 may include a material having etch selectivity with respect to each of the first insulating spacer 152 and the third insulating spacer 156. In an implementation, when each of the first insulating spacer 152 and the third insulating spacer 156 includes a nitride, the second insulating spacer 154 includes an oxide, and may be removed in a subsequent process to become an air spacer.

Buried contact holes 170H may be between the plurality of bit lines 147. An internal space of each the plurality of buried contact holes 170H may be defined by the insulating spacer structure 150 and the active region 118, in which the insulating spacer structure 150 covers the sidewall of each of neighboring two bit lines 147 between neighboring two bit lines 147 among the plurality of bit lines 147.

The plurality of buried contact holes 170H may be formed by removing portions of the insulating layer patterns 112 and 114 and the active region 118 by using the plurality of insulating capping lines 148, the plurality of insulating spacer structures 150 covering both sidewalls of each of the plurality of bit line structures 140 as an etching mask. In some embodiments, the plurality of buried contact holes 170H may be formed by firstly performing an anisotropic etching process of removing portions of the insulating layer patterns 112 and 114 and the active region 118 by using the plurality of insulating capping lines 148 and the insulating spacer structure 150 covering both sidewalls of each of the plurality of bit line structures 140 as the etch mask, and then performing an isotropic etching process of further removing another portion of the active region 118, so that the space defined by the active region 118 may be expanded.

Referring to FIGS. 28A to 28D, a plurality of buried contacts 170 and a plurality of insulating fences 180 may be formed in spaces among the plurality of insulating spacer structures 150 covering both sidewalls of each of the plurality of bit line structures 140. The plurality of buried contacts 170 and the plurality of insulating fences 180 may be alternately arranged, while extending along between pairs of insulating spacer structures 150 facing each other among the plurality of insulating spacer structures 150 that cover both sidewalls of the plurality of bit line structures 140, that is, in the second horizontal direction (Y direction). In an implementation, the plurality of buried contacts 170 may each include polysilicon. In an implementation, the plurality of insulation fences 180 may each include a nitride.

In some embodiments, the plurality of buried contacts 170 may be in a line in the first horizontal direction (X direction) and the second horizontal direction (Y direction). Each of the plurality of buried contacts 170 may extend in the vertical direction (Z direction) perpendicular to the substrate 110 from the active region 118. The plurality of buried contacts 170 may configure the plurality of buried contacts BCs illustrated in FIG. 24.

The plurality of buried contacts 170 may be in spaces defined by the plurality of insulating fences 180 and the plurality of insulating spacer structures 150 covering both sidewalls of the plurality of bit line structures 140. The plurality of buried contacts 170 may fill a portion of a lower portion of the space between the plurality of insulating spacer structures 150 covering both sidewalls of each of the plurality of bit line structures 140.

A level of an upper surface of the plurality of buried contacts 170 may be located lower than the level of an upper surface of the plurality of insulating capping lines 148. An upper surface of the plurality of insulating fences 180 may be located at the same level in the vertical direction (Z direction) as the upper surface of the plurality of insulating capping lines 148.

A plurality of landing pad holes 190H may be limited by the plurality of insulating spacer structures 150 and the plurality of insulating fences 180. The plurality of buried contacts 170 may be exposed on bottom surfaces of the plurality of landing pad holes 190H.

In a process of forming the plurality of buried contacts 170 and/or the plurality of insulating fences 180, an insulating capping line 148 included in the bit line structure 140 and an upper portion of the insulating spacer structure 150 may be removed to lower a level of the upper surface of the bit line structure 140.

Referring to FIGS. 29A to 29D, a landing pad material layer 190P filling the plurality of landing pad holes 190H and covering the plurality of bit line structures 140 may be formed. In some embodiments, a level of an interface in which the plurality of buried contacts 170 contact the landing pad material layer 190P may be higher than a first vertical level LV1 of an upper surface of the second metallic conductive pattern 146 and may be lower than a second vertical level LV2 of the upper surface of the insulating capping line 148.

In some embodiments, the landing pad material layer 190P may include a conductive barrier layer and a conductive pad material layer on the conductive barrier layer. In an implementation, the conductive barrier layer may include metal, or conductive metal nitride. In some embodiments, the conductive barrier layer may include a Ti/TiN stacked structure. In some embodiments, the conductive pad material layer may include tungsten (W).

In some embodiments, before forming the landing pad material layer 190P, a metal silicide layer may be on the plurality of buried contacts 170. The metal silicide layer may be between the plurality of buried contacts 170 and the landing pad material layer 190P. The metal silicide layer may include cobalt silicide ($CoSi_x$), nickel silicide ($NiSi_x$), or manganese silicide ($MnSi_x$).

A plurality of hard mask patterns HMKC may be on the landing pad material layer 190P. In some embodiments, the plurality of hard mask patterns HMKC may be formed by an EUV lithography process. The plurality of hard mask patterns HMKC may be formed by using the EUV mask described with reference to FIGS. 1A to 22.

Referring to FIGS. 30A to 30D, a portion of the landing pad material layer (190P of FIGS. 29A to 29D) may be removed by using the plurality of hard mask patterns HMKC as an etch mask, a plurality of landing pads 190 filling at least some of the landing pad holes 190H, extending onto the plurality of bit line structures 140, and divided by a recess portion 190R.

The plurality of landing pads 190 may be spaced apart from each other with the recess portion 190R therebetween. The plurality of landing pads 190 may be on the plurality of buried contacts 170 and extend onto the plurality of bit line structures 140. In some embodiments, the plurality of landing pads 190 may extend onto the plurality of bit lines 147. The plurality of landing pads 190 may be on the plurality of buried contacts 170, and thus the plurality of buried contacts 170 may be electrically connected to the plurality of landing pads 190. The buried contact 170 and the landing pad 190, which correspond to each other, may be referred to as a contact plug. The plurality of landing pads 190 may be connected to the active region 118 via the plurality of buried contacts 170. The plurality of landing pads 190 may configure the plurality of landing pads LP illustrated in FIG. 24.

The buried contact 170 may be between two adjacent bit line structures 140, and the landing pad 190 may extend from between the two adjacent bit line structures 140 with the buried contact 170 therebetween, to one bit line structure 140.

Referring to FIGS. 31A to 31D, the semiconductor memory device 1 may be formed by sequentially forming a plurality of lower electrodes 210, a capacitor dielectric layer 220, and an upper electrode 230 on the plurality of landing pads 190. Each of the plurality of lower electrodes 210 may be electrically connected correspondingly to each of the plurality of landing pads 190. The capacitor dielectric layer 220 may conformally cover the surfaces of the plurality of lower electrodes 210. In some embodiments, the capacitor dielectric layer 220 may be integrally formed to cover the plurality of lower electrodes 210 together in a certain region, e.g., one memory cell region (CR in FIG. 24).

Each of the plurality of lower electrodes 210 may be a column shape filled inside to have a circular horizontal cross section, that is, a pillar shape. In some embodiments, each of the plurality of lower electrodes 210 may be a cylinder shape closed in a lower portion. In some embodiments, the plurality of lower electrodes 210 may be in a honeycomb shape that may be in a zigzag pattern in the first horizontal direction (X direction) or the second horizontal direction (Y direction). In some other embodiments, the plurality of lower electrodes 210 may be in a matrix form that may be in lines in each of the first horizontal direction (X direction) and the second horizontal direction (Y direction). The plurality of lower electrodes 210 may include, e.g., silicon doped with impurities, metal such as tungsten or copper, or conductive metal compound such as titanium nitride. The semiconductor memory device 1 may further include at least one support pattern that contacts the sidewalls of the plurality of lower electrodes 210. The plurality of lower electrodes 210 may be the plurality of target patterns 40*a*, 40*b*, 40*d*, and 40*e* formed by using the EUV mask described with reference to FIGS. 1A to 22.

The capacitor dielectric layer 220 may include, e.g., TaO, TaAlO, TaON, ALO, AlSiO, HfO, HfSiO, ZrO, ZrSiO, TiO, TiAlO, BST((Ba,Sr)TiO), STO(SrTiO), BTO(BaTiO), PZT (Pb,Zr,Ti)O), (Pb,La)(Zr,Ti)O, Ba(Zr,Ti)O, or Sr(Zr,Ti)O.

The upper electrode 230 may include, e.g., W, Ru, RuO, Pt, PtO, Ir, IrO, SRO(SrRuO), BSRO((Ba,Sr)RuO), CRO (CaRuO), BaRuO, or La(Sr,Co)O. In some embodiments, the upper electrode 230 may include a metal material. In an implementation, the upper electrode 230 may include Tungsten W.

Figure 31A:
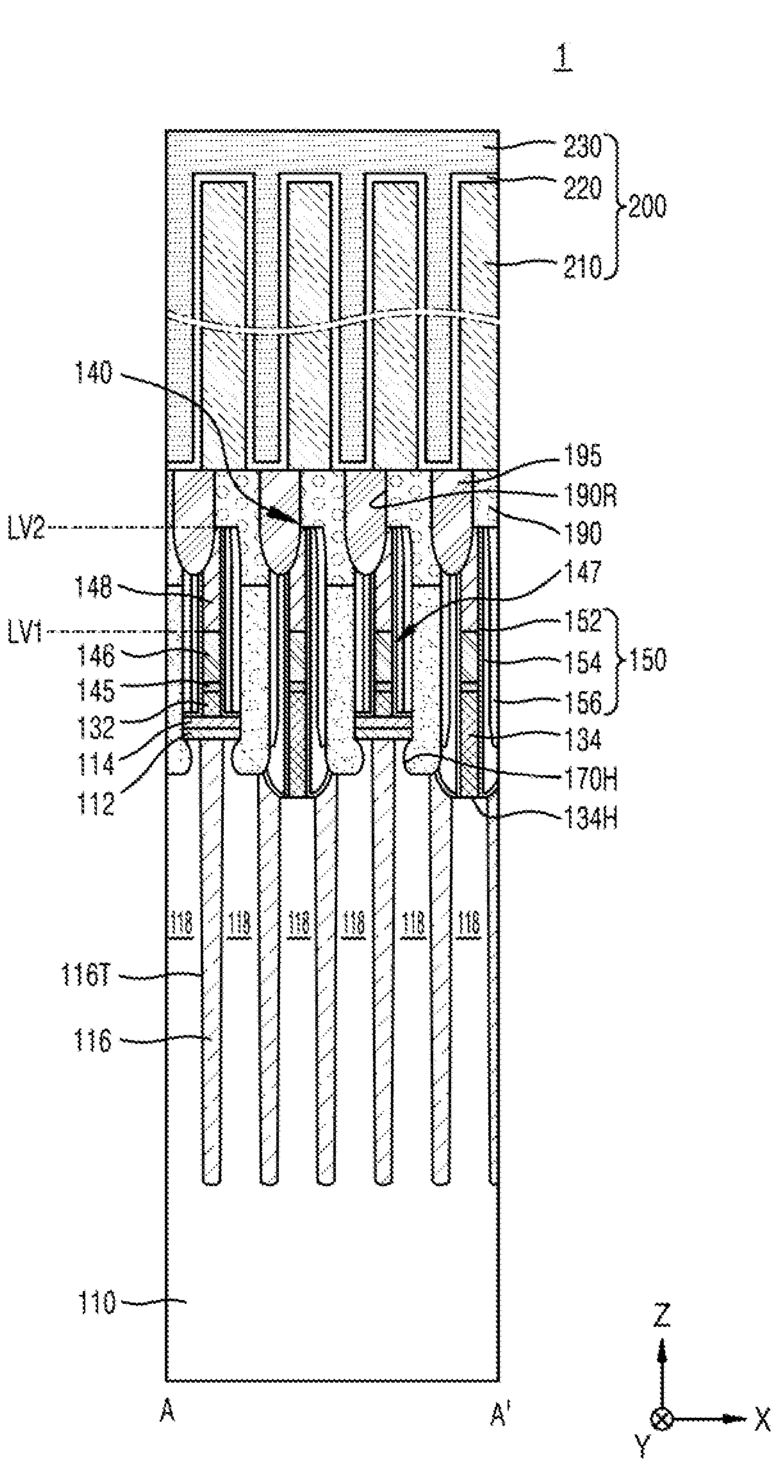
FIGS. 31A to 31D are cross-sectional views of a semiconductor memory device according to example embodiments.
Figure 31B:
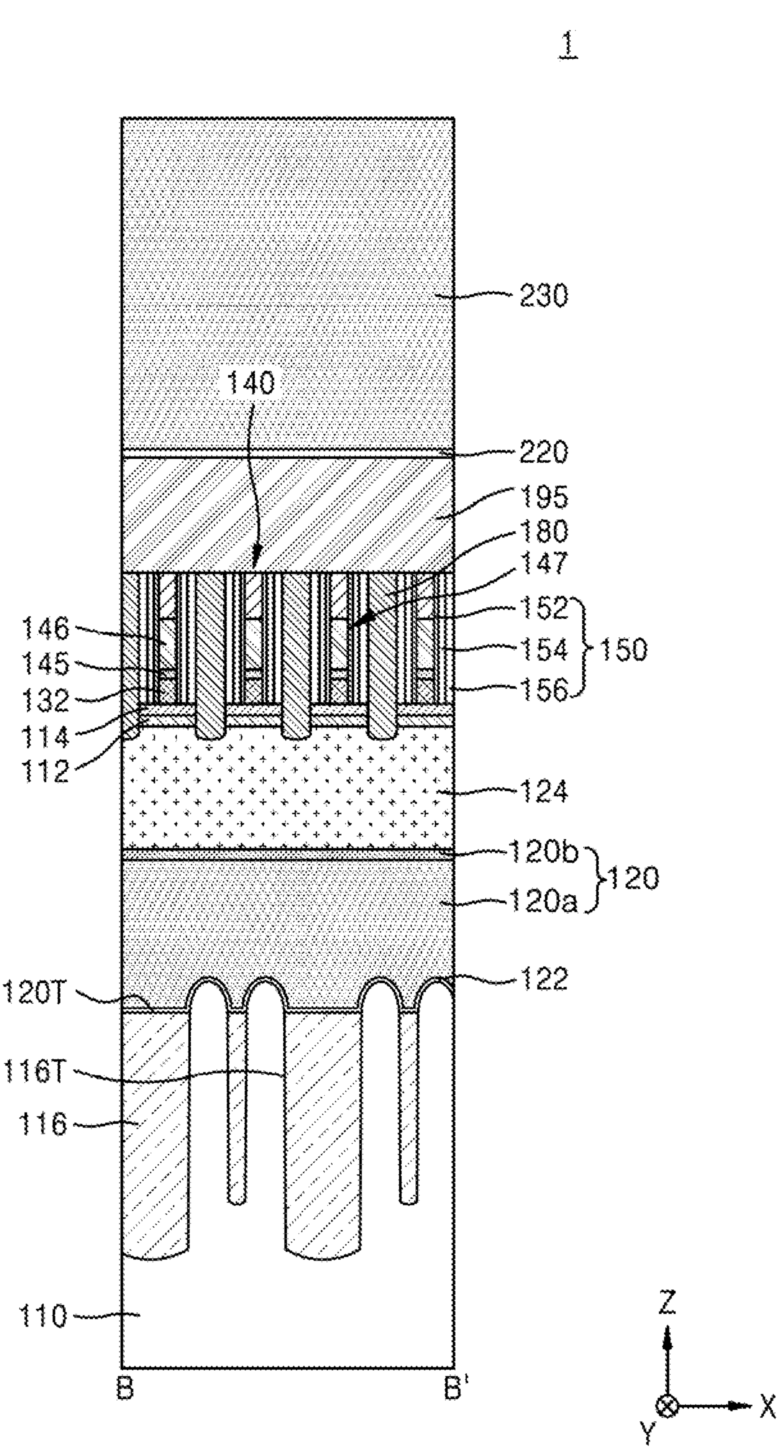
Figure 31C:
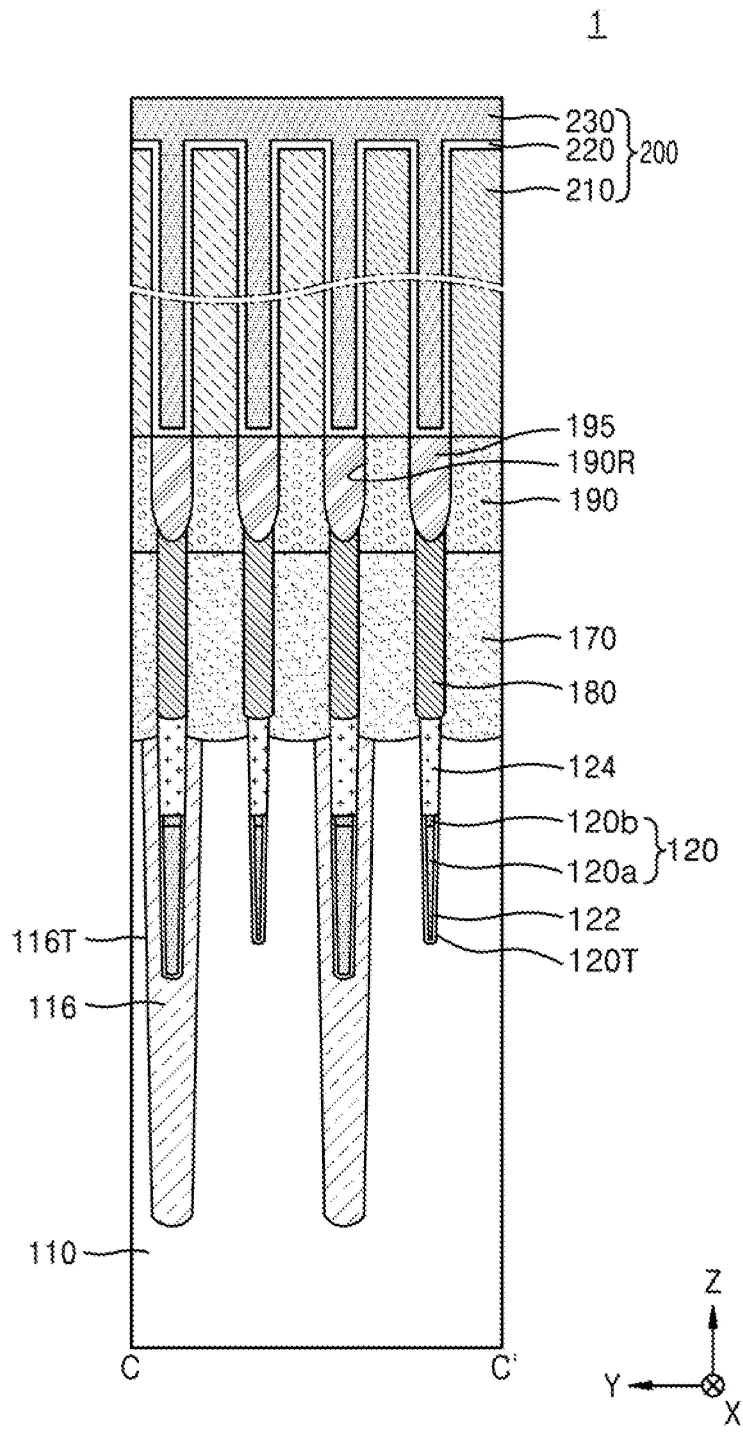
Figure 31D:
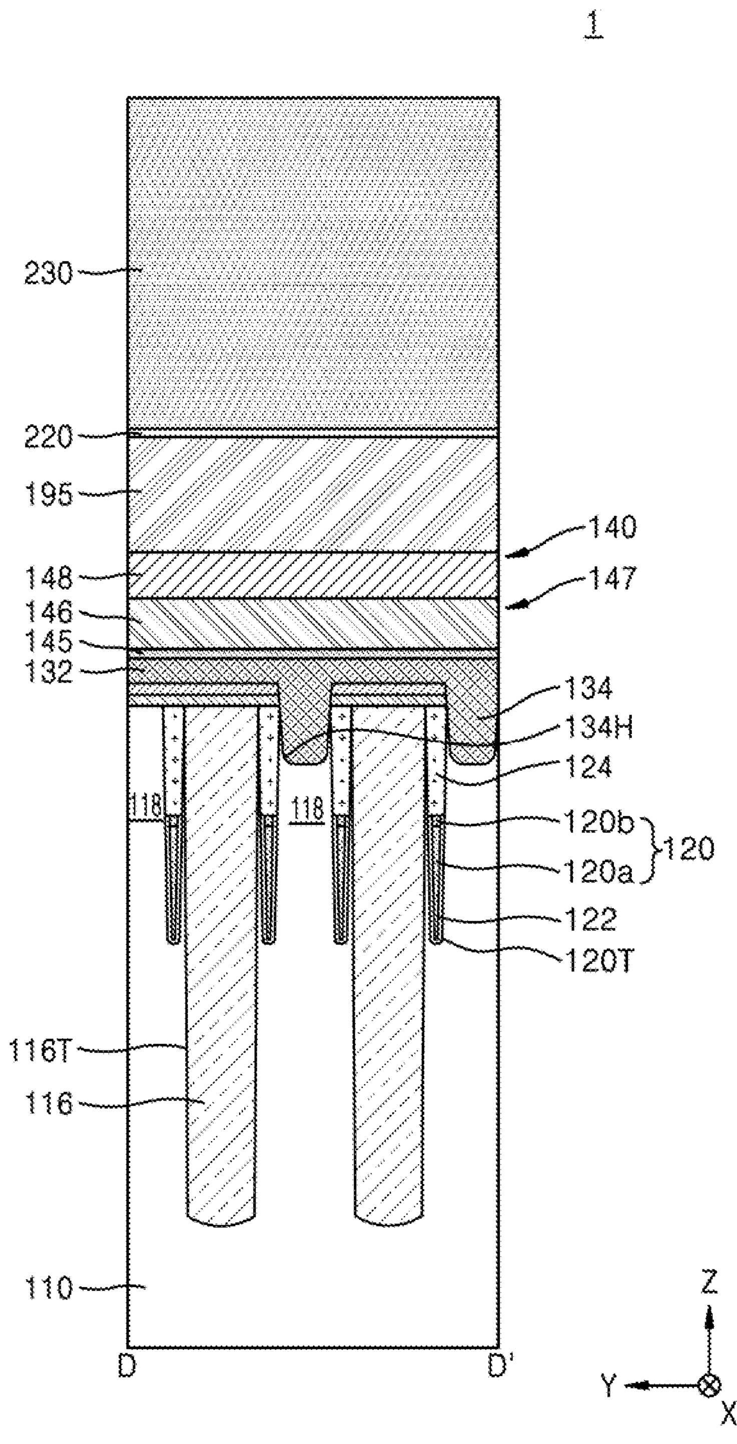

Before forming the plurality of lower electrodes 210, an insulating structure 195 filling the recess portion 190R may be formed. In some embodiments, the insulating structure 195 may include an interlayer insulating layer and an etch stop layer. In an implementation, the interlayer insulating layer may include an oxide layer, and the etch stop layer may include a nitride. In FIGS. 31A and 31C, an upper surface of the insulating structure 195 may be positioned at the same level as a lower surface of a lower electrode 210.

The semiconductor memory device 1 includes the substrate 110 having the plurality of active regions 118, the plurality of gate dielectric layers 122, the plurality of word lines 120, and the plurality of buried insulating layers 124 sequentially formed inside the plurality of word line trenches 120T across the plurality of active regions 118 in the substrate 110, the device isolation layer 116, the insulating layer patterns 112 and 114 covering the plurality of active regions 118 and the plurality of buried insulating layers 124, the plurality of bit line structures 140 on the insulating layer patterns 112 and 114, the plurality of insulating spacer structures 150 covering both sidewalls of the plurality of bit line structures 140, the plurality of insulating fences 180, the plurality of buried contacts 170 filling a lower portion of a space defined by the plurality of insulating spacer structures 150 and connected to the plurality of active regions 118, and the plurality of landing pads 190 filling the upper portion and extending to the upper portion of the plurality of bit line structures 140, and a plurality of capacitor structures 200 including the plurality of lower electrodes 210 connected to the plurality of landing pads 190, the capacitor dielectric layer 220, and the upper electrode 230.

In the semiconductor memory device 1 according to an embodiment, the landing pads 190 and/or lower electrodes 210 in the memory cell region CR around the corner or the corner and edge of the memory cell region CR (refer to FIG. 24) have the same diameter as the landing pads 190 and/or lower electrodes 210 inside the memory cell region CR, and thus yield of the semiconductor memory device 1 may be increased, and electrical reliability may be secured.

By way of summation and review, embodiments are directed to a method of manufacturing an EUV mask for improving a pattern of a semiconductor memory device. A high degree of integration is required for the semiconductor memory device used in an electronic device so that a design rule for components of the semiconductor memory device is being reduced. Accordingly, an exposure device using EUV light having a shorter wavelength than deep ultra violet (DUV) light as a light source and an EUV mask have been developed to improve resolution. A method of manufacturing an extreme ultraviolet (EUV) mask for forming a semiconductor memory device having a high degree of integration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an extreme ultraviolet mask, the method comprising:

preparing a preliminary layout;

forming a plurality of preliminary target patterns by using a plurality of preliminary spacer patterns formed by using the preliminary layout;

evaluating presence or absence of an abnormal target pattern among the plurality of preliminary target patterns;

preparing a layout configured to form a plurality of spacer patterns by modifying the preliminary layout when the plurality of preliminary target patterns include the abnormal target pattern; and manufacturing the extreme ultraviolet mask with the layout to form a plurality of target patterns by using the plurality of spacer patterns, wherein:

the plurality of preliminary spacer patterns extends in one direction, and the preliminary layout is modified as the layout where each of the plurality of spacer patterns extends in the one direction and a first portion and a second portion of each of the plurality of spacer patterns have different horizontal widths, or the first portion of each of the plurality of spacer patterns, which extends in the one direction, and the second portion of each of the plurality of spacer patterns extend with a mutual inclination.

2. The method as claimed in claim 1, wherein the forming of the plurality of preliminary target patterns by using the plurality of preliminary spacer patterns formed by using the preliminary layout includes performing simulation with the preliminary layout.

3. The method as claimed in claim 1, wherein:

the plurality of preliminary target patterns and the plurality of target patterns are on a substrate including a cell block region, an edge region surrounding the cell block region, and a dummy region between the cell block region and the edge region, and the evaluating of the presence or absence of the abnormal target pattern among the plurality of preliminary target patterns includes evaluating whether the abnormal target pattern among the plurality of preliminary target patterns is in the cell block region.

4. The method as claimed in claim 3, wherein:

the plurality of target patterns includes a plurality of normal target patterns and a plurality of wide target patterns each having a greater diameter than a diameter of each of the plurality of normal target patterns, and the plurality of wide target patterns are in the dummy region around a corner or an edge of the cell block region.

5. The method as claimed in claim 4, wherein a diameter of each of the plurality of wide target patterns increase in a direction away from the plurality of normal target patterns.

6. The method as claimed in claim 3, wherein a diameter of the abnormal target pattern among the plurality of preliminary target patterns is less than a diameter of each of a plurality of normal target patterns, which are other preliminary target patterns among the plurality of preliminary target patterns.

7. The method as claimed in claim 6, wherein a plurality of abnormal target patterns are included in the plurality of preliminary target patterns, and diameters of the plurality of abnormal target patterns decrease in a direction away from the plurality of normal target patterns.

8. The method as claimed in claim 1, wherein the forming of the plurality of preliminary target patterns by using the plurality of preliminary spacer patterns formed by using the preliminary layout includes:

forming a plurality of connection targets and a molding layer covering the plurality of connection targets on a substrate;

forming a plurality of preliminary base patterns on the molding layer by using the preliminary layout;

forming the plurality of preliminary spacer patterns covering both sidewalls of the plurality of preliminary base patterns, respectively;

forming a plurality of preliminary holes by etching the molding layer by using the plurality of preliminary spacer patterns as an etching mask after removing the plurality of preliminary base patterns; and forming the plurality of preliminary target patterns respectively filling the plurality of preliminary holes.

9. A method of manufacturing an extreme ultraviolet mask, the method comprising:

preparing a pair of preliminary layouts including a first preliminary layout and a second preliminary layout;

forming a plurality of preliminary target patterns by using a plurality of first preliminary spacer patterns formed by using the first preliminary layout and a plurality of second preliminary spacer patterns formed by using the second preliminary layout;

evaluating presence or absence of an abnormal target pattern among the plurality of preliminary target patterns;

preparing a pair of layouts including a first layout configured to form a plurality of first spacer patterns and a second layout configured to form a plurality of second spacer patterns by modifying the pair of preliminary layouts when the plurality of preliminary target patterns include the abnormal target pattern; and manufacturing a pair of extreme ultraviolet masks including a first extreme ultraviolet mask and a second extreme ultraviolet mask with the pair of layouts to form a plurality of target patterns by using the plurality of first spacer patterns and the plurality of second spacer patterns, wherein the plurality of first preliminary spacer patterns extend in a first direction, the plurality of second preliminary spacer patterns extend in a second direction different from the first direction in which the plurality of first preliminary spacer patterns extend while crossing the plurality of first preliminary spacer patterns, and wherein the first preliminary layout is modified as the first layout where each of the plurality of first spacer patterns extends in the first direction and a first portion and a second portion of each of the plurality of first spacer patterns have different horizontal widths, or the first portion of each of the plurality of first spacer patterns, which extend in the first direction, and the second portion of each of the plurality of first spacer patterns extend with a mutual inclination.

10. The method as claimed in claim 9, wherein a diameter of the abnormal target pattern among the plurality of preliminary target patterns is less than a diameter of each of other preliminary target patterns among the plurality of preliminary target patterns.

11. The method as claimed in claim 10, wherein:

a plurality of abnormal target patterns are included in the plurality of preliminary target patterns, and a height of each of at least some of the plurality of abnormal target patterns is less than a height of each of remaining preliminary target patterns among the plurality of preliminary target patterns.

12. The method as claimed in claim 9, wherein the forming of the plurality of preliminary target patterns includes:

forming a plurality of connection targets and a molding layer covering the plurality of connection targets on a substrate including a cell block region, an edge region surrounding the cell block region, and a dummy region between the cell block region and the edge region;

forming a plurality of first preliminary base patterns on the molding layer by using the first preliminary layout;

forming the plurality of first preliminary spacer patterns covering both sidewalls of the plurality of first preliminary base patterns, respectively;

forming a plurality of second preliminary base patterns on the molding layer and the plurality of first preliminary base patterns by using the second preliminary layout;

forming the plurality of second preliminary spacer patterns covering both sidewalls of the plurality of second preliminary base patterns, respectively;

forming a plurality of preliminary holes by etching the molding layer by using the plurality of first preliminary spacer patterns and the plurality of second preliminary spacer patterns as an etching mask; and forming the plurality of preliminary target patterns filling the plurality of preliminary holes, wherein at least some of the plurality of preliminary target patterns are respectively connected to the plurality of connection targets.

13. The method as claimed in claim 12, wherein the forming of the plurality of target patterns includes:

forming a plurality of first base patterns on the molding layer by using the first extreme ultraviolet mask;

forming the plurality of first spacer patterns covering both sidewalls of the plurality of first base patterns, respectively;

forming a plurality of second base patterns on the molding layer and the plurality of first spacer patterns by using the second extreme ultraviolet mask;

forming the plurality of second spacer patterns covering both sidewalls of the plurality of second base patterns, respectively;

forming a plurality of holes by etching the molding layer by using the plurality of first spacer patterns and the plurality of second spacer patterns as an etching mask; and forming the plurality of target patterns filling the plurality of holes and respectively connected to the plurality of connection targets.

14. The method as claimed in claim 13, wherein:

the first preliminary layout allows the plurality of first preliminary base patterns to extend in the first direction with a same horizontal width, and the second preliminary layout allows the plurality of second preliminary base patterns to extend in the second direction with a same horizontal width.

15. The method as claimed in claim 14, wherein:

the first layout is formed by modifying the first preliminary layout where each of the plurality of first base patterns extends in the first direction, and a first portion and a second portion of each of the plurality of first base patterns have different horizontal widths, and the second layout is formed by modifying the second preliminary layout where each of the plurality of second base patterns extends in the second direction, and a first portion and a second portion of each of the plurality of second base patterns have different horizontal widths.

16. The method as claimed in claim 14, wherein:

the first layout is formed by modifying the first preliminary layout where the first portion of each of the plurality of first spacer patterns, which extend in the first direction, and the second portion of each of the plurality of first base patterns have inclinations, and the second layout allows the plurality of second spacer patterns to extend in the second direction with a same horizontal width.

17. The method as claimed in claim 16, wherein the first layout is formed by modifying the first preliminary layout where some other first base patterns have a greater angle of inclination based on some of the first base patterns.

18. A method of manufacturing an extreme ultraviolet mask configured to form a semiconductor memory device including a substrate having a memory cell region, a dummy region surrounding the memory cell region, and a plurality of active regions in the memory cell region, a plurality of word lines in the substrate, a plurality of bit lines on the substrate and respectively connected to the plurality of active regions through a plurality of direct contacts, and a plurality of capacitor structures including a plurality of lower electrodes respectively and electrically connected to the plurality of active regions through a plurality of contact plugs, a capacitor dielectric layer, and an upper electrode, the method comprising:

preparing a pair of preliminary layouts including a first preliminary layout and a second preliminary layout;

forming, on the substrate, a plurality of preliminary target patterns by using a plurality of first preliminary spacer patterns formed by using the first preliminary layout and a plurality of second preliminary spacer patterns formed by using the second preliminary layout;

evaluating presence or absence of an abnormal target pattern among the plurality of preliminary target patterns;

preparing a pair of layouts including a first layout configured to form a plurality of first spacer patterns and a second layout configured to form a plurality of second spacer patterns by modifying the pair of preliminary layouts when the plurality of preliminary target patterns include the abnormal target pattern; and forming a pair of extreme ultraviolet masks including a first extreme ultraviolet mask and a second extreme ultraviolet mask with the pair of layouts to form a plurality of lower electrodes by using the plurality of first spacer patterns and the plurality of second spacer patterns, wherein the plurality of first preliminary spacer patterns extend in a first direction, the plurality of second preliminary spacer patterns extend in a second direction different from the first direction in which the plurality of first preliminary spacer patterns extend while crossing the plurality of first preliminary spacer patterns, and wherein the first preliminary layout is modified as the first layout where each of the plurality of first spacer patterns extends in the first direction and a first portion and a second portion of each of the plurality of first spacer patterns have different horizontal widths, or the first portion of each of the plurality of first spacer patterns, which extends in the first direction, and the second portion of each of the plurality of first spacer patterns extend with a mutual inclination.

19. The method as claimed in claim 18, wherein the plurality of lower electrodes include:

a plurality of normal target patterns and a plurality of wide target patterns each having a greater diameter than a diameter of each of the plurality of normal target patterns, and the plurality of wide target patterns are in the dummy region around a corner or an edge of the memory cell region.

20. The method as claimed in claim 19, wherein diameters of the plurality of wide target patterns increase in a direction away from the plurality of normal target patterns.

* * * * *